(12) United States Patent
Van Ingen Schenau et al.

(10) Patent No.: US 12,386,268 B2
(45) Date of Patent: Aug. 12, 2025

(54) METHOD FOR CALIBRATING SIMULATION PROCESS BASED ON DEFECT-BASED PROCESS WINDOW

(71) Applicant: ASML NETHERLANDS B.V., Veldhoven (NL)

(72) Inventors: Koenraad Van Ingen Schenau, Veldhoven (NL); Abraham Slachter, Veldhoven (NL); Vadim Yourievich Timoshkov, Veldhoven (NL); Marleen Kooiman, Veldhoven (NL); Marie-Claire Van Lare, Veldhoven (NL); Hermanus Adrianus Dillen, Veldhoven (NL); Stefan Hunsche, Santa Clara, CA (US); Luis Alberto Colina Santamaría Colina, Veldhoven (NL); Aiqin Jiang, New York, NY (US); Fuming Wang, Santa Clara, CA (US); Sudharshanan Raghunathan, Fremont, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 474 days.

(21) Appl. No.: 17/799,019

(22) PCT Filed: Feb. 18, 2021

(86) PCT No.: PCT/EP2021/054064
§ 371 (c)(1),
(2) Date: Aug. 11, 2022

(87) PCT Pub. No.: WO2021/165419
PCT Pub. Date: Aug. 26, 2021

(65) Prior Publication Data
US 2023/0076218 A1    Mar. 9, 2023

Related U.S. Application Data

(60) Provisional application No. 62/980,068, filed on Feb. 21, 2020.

(51) Int. Cl.
*G03F 7/00*    (2006.01)

(52) U.S. Cl.
CPC .......... *G03F 7/70558* (2013.01); *G03F 7/705* (2013.01); *G03F 7/70641* (2013.01)

(58) Field of Classification Search
CPC .. G03F 7/70558; G03F 7/705; G03F 7/70641; G03F 7/70625; G03F 7/70633
See application file for complete search history.

(56) References Cited

U.S. PATENT DOCUMENTS

| 6,961,116 B2 | 11/2005 | Den Boef et al. |
| 7,003,758 B2 | 2/2006 | Ye et al. |

(Continued)

FOREIGN PATENT DOCUMENTS

| TW | 201843533 | 12/2018 |
| TW | 202001447 | 1/2020 |

(Continued)

OTHER PUBLICATIONS

Action issued in corresponding Chinese Patent Application No. 202180014721.6, dated Nov. 29, 2024.

(Continued)

*Primary Examiner* — Hung V Nguyen
(74) *Attorney, Agent, or Firm* — Pillsbury Winthrop Shaw Pittman LLP

(57) ABSTRACT

Methods related to improving a simulation processes and solutions (e.g., retargeted patterns) associated with manufacturing of a chip. A method includes obtaining a plurality of dose-focus settings, and a reference distribution based on measured values of a characteristic of a printed pattern (Continued)

associated with each setting of the plurality of dose-focus settings. The method further includes, based on an adjustment model and the plurality of dose-focus settings, determining a probability density function (PDF) of the characteristic such that an error between the PDF and the reference distribution is reduced. The PDF can be a function of the adjustment model and variance associated with dose, the adjustment model being configured to change a proportion of non-linear dose sensitivity contribution to the PDF. A process window can be adjusted based on the determined PDF of the characteristic.

20 Claims, 38 Drawing Sheets

(56) References Cited

U.S. PATENT DOCUMENTS

| | | | |
|---|---|---|---|
| 7,587,704 | B2 | 9/2009 | Ye et al. |
| 8,200,468 | B2 | 6/2012 | Ye et al. |
| 11,079,687 | B2 * | 8/2021 | Slachter .............. G03F 7/70625 |
| 11,086,229 | B2 | 8/2021 | Ypra et al. |
| 11,087,065 | B2 | 8/2021 | Mahajan |
| 11,143,971 | B2 * | 10/2021 | Tel ...................... G03F 7/70616 |
| 12,044,980 | B2 * | 7/2024 | Slachter .............. G03F 7/70616 |
| 2006/0066855 | A1 | 3/2006 | Boef et al. |
| 2007/0031745 | A1 | 2/2007 | Ye et al. |
| 2007/0050749 | A1 | 3/2007 | Ye et al. |
| 2008/0301620 | A1 | 12/2008 | Ye et al. |
| 2008/0309897 | A1 | 12/2008 | Wong et al. |
| 2009/0157360 | A1 | 6/2009 | Ye et al. |
| 2010/0162197 | A1 | 6/2010 | Ye et al. |
| 2010/0180251 | A1 | 7/2010 | Ye et al. |
| 2010/0315614 | A1 | 12/2010 | Hansen |
| 2011/0027704 | A1 | 2/2011 | Cramer et al. |
| 2011/0043791 | A1 | 2/2011 | Smilde et al. |
| 2011/0099526 | A1 | 4/2011 | Liu |
| 2012/0242970 | A1 | 9/2012 | Smilde et al. |
| 2014/0282307 | A1 | 9/2014 | Latypov |
| 2021/0216697 | A1 | 7/2021 | Van Den Brink et al. |

FOREIGN PATENT DOCUMENTS

| | | |
|---|---|---|
| WO | 2009078708 | 6/2009 |
| WO | 2009106279 | 9/2009 |
| WO | 2010059954 | 5/2010 |
| WO | 2019121486 | 6/2019 |
| WO | 2019161993 | 8/2019 |

OTHER PUBLICATIONS

Office Action issued in corresponding Taiwanese Patent Application No. 111142331, dated May 23, 2023.

Office Action issued in corresponding Korean Patent Application No. 10-2022-7028942, dated Jun. 17, 2024.

International Search Report and Written Opinion issued in corresponding PCT Patent Application No. PCT/EP2021/054064, dated May 27, 2021.

Cao, Y. et al.: "Optimized Hardware and Software For Fast, Full Chip Simulation", Proc. of SPIE, vol. 5754 (2005).

Spence, C .: "Full-Chip Lithography Simulation and Design Analysis How OPC Is Changing IC Design", Proc. of SPIE, vol. 5751, pp. 1-14 (2005).

Rosenbluth, A.E. et al.: "Optimum Mask and Source Patterns to Print A Given Shape", Journal of Microlithography, Microfabrication, Microsystems, 1(1), pp. 13-20 (2002).

Socha, R. et al.: "Simultaneous Source Mask Optimization (SMO)", Proc. of SPIE, vol. 5853 (2005).

Lucas, K. et al.: "Process, Design, and OPC Requirements for the 65 nm Device Generation", Proc. of SPIE, vol. 5040 (2003).

Maslow, M.J. et al.: "Impact of local variability on defect-aware process windows", Proc. of SPIE, vol. 10957 (Mar. 26, 2019).

Sturtevant, J. et al. "Process window-based feature and die failure rate prediction", Proc. of SPIE, vol. 10962 (Apr. 21, 2003).

* cited by examiner

METHOD FOR CALIBRATING SIMULATION PROCESS BASED ON DEFECT-BASED PROCESS WINDOW

CROSS-REFERENCE TO RELATED APPLICATIONS

This application is the U.S. national phase entry of PCT Patent Application No. PCT/EP2021/054064 which was filed on Feb. 18, 2021, which claims priority of U.S. Provisional Patent Application No. 62/980,068 which was filed on Feb. 21, 2020, and which is incorporated herein in its entirety by reference.

FIELD

The present disclosure relates to techniques of improving the performance of a device manufacturing process. The techniques may be used in connection with a lithographic apparatus or a metrology apparatus.

BACKGROUND

A lithography apparatus is a machine that applies a desired pattern onto a target portion of a substrate. Lithography apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithography apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

SUMMARY

According to an embodiment, there is provided a method of calibrating a simulation process. The method includes obtaining: (i) characteristic limits of a characteristic of a printed pattern based on a threshold failure rate of the printed pattern, and (ii) a reference process window based on the characteristic limits; and calibrating the simulation process such that a simulated process window is within an acceptable threshold of the reference process window. The calibrating of the simulation process includes executing, one or more process models, to determine the simulated pattern; and adjusting parameter values associated with the one or more process models until a characteristic of the simulated pattern satisfies the characteristic limits.

Furthermore, according to an embodiment, there is provided a method for generating a retargeted pattern associated with a patterning process. The method includes obtaining (i) characteristic limits associated with a target pattern, the characteristic limits being values of the characteristic beyond which a printed pattern corresponding to the target pattern is considered as defective, and (ii) a source mask optimization (SMO) process configured to compute dose and/or mask parameters based on a threshold failure rate associated with the characteristic of the target pattern; and generating, by simulating the source mask optimization process using the target pattern, the retargeted pattern the characteristic associated with the retargeted pattern fall further within the characteristic limits associated with the target pattern.

Furthermore, according to an embodiment, there is provided a method for adjusting a process window. The method includes obtaining: (i) a dose probability density function (dose PDF) to determine a probability of dose, the dose PDF being a function of (a) a characteristic of a feature and (b) a deviation of a mask characteristic, the mask characteristic being associated with a mask used to print the feature on a substrate, (ii) a mask probability density function (mask PDF) to determine a probability in the deviation of the mask characteristic; determining the probability density function associated with the characteristic by convoluting (i) the dose PDF and (ii) the mask PDF over a given range of mask characteristic values; and adjusting, based on the determined probability density function associated with the characteristic, a process window associated with a patterning process.

Furthermore, according to an embodiment, there is provided a method for adjusting a process window. The method includes obtaining: (i) a plurality of dose-focus settings, and (ii) a reference distribution based on measured values of the characteristic of a printed pattern associated with each setting of the plurality of dose-focus settings; determining, based on an adjustment model and the plurality of dose-focus settings, the probability density function (PDF) of the characteristic such that an error between the PDF and the reference distribution is reduced, the PDF being a function of the adjustment model and variance associated with dose, the adjustment model being configured to change a proportion of non-linear dose sensitivity contribution to the PDF; and adjusting, based on the determined PDF of the characteristic, a process window associated with a patterning process.

Furthermore, according to an embodiment, there is provided a non-transitory computer-readable medium comprising instructions that, when executed by one or more processors, cause operations including obtaining: (i) characteristic limits of a characteristic of a printed pattern based on a threshold failure rate of the printed pattern, and (ii) a reference process window based on the characteristic limits; and calibrating the simulation process such that a simulated process window is within an acceptable threshold of the reference process window. The calibrating of the simulation process includes executing, one or more process models, to determine the simulated pattern; and adjusting parameter values associated with the one or more process models until a characteristic of the simulated pattern satisfies the characteristic limits.

Furthermore, according to an embodiment, there is provided a non-transitory computer-readable medium comprising instructions that, when executed by one or more processors, cause operations including obtaining (i) characteristic limits associated with the target pattern, the characteristic limits being values of the characteristic beyond which a printed pattern corresponding to the target pattern is considered as defective, and (ii) a source mask optimization (SMO) process configured to compute dose and/or mask parameters based on a threshold failure rate associated with the characteristic of the target pattern; and generating, by simulating the source mask optimization process using the target pattern, a retargeted pattern the characteristic associated with the retargeted pattern fall further within the characteristic limits associated with the target pattern.

Furthermore, according to an embodiment, there is provided a non-transitory computer-readable medium comprising instructions that, when executed by one or more processors, cause operations including obtaining: (i) a dose probability density function (dose PDF) to determine a probability of dose, the dose PDF being a function of (a) a characteristic of a feature and (b) a deviation of a mask characteristic, the mask characteristic being associated with a mask used to print the feature on a substrate, (ii) a mask probability density function (mask PDF) to determine a probability in the deviation of the mask characteristic; determining the probability density function associated with the characteristic by convoluting (i) the dose PDF and (ii) the mask PDF over a given range of mask characteristic values; and adjusting, based on the determined probability density function associated with the characteristic, a process window associated with a patterning process.

Furthermore, according to an embodiment, there is provided a non-transitory computer-readable medium comprising instructions that, when executed by one or more processors, cause operations includes obtaining: (i) a plurality of dose-focus settings, and (ii) a reference distribution based on measured values of a characteristic of a printed pattern associated with each setting of the plurality of dose-focus settings; determining, based on an adjustment model and the plurality of dose-focus settings, the probability density function (PDF) of the characteristic such that an error between the PDF and the reference distribution is reduced, the PDF being a function of the adjustment model and variance associated with dose, the adjustment model being configured to change a proportion of non-linear dose sensitivity contribution to the PDF; and adjusting, based on the determined PDF of the characteristic, a process window associated with a patterning process.

DETAILED DESCRIPTION

Before describing embodiments in detail, it is instructive to present an example environment in which embodiments may be implemented.

Figure 1:
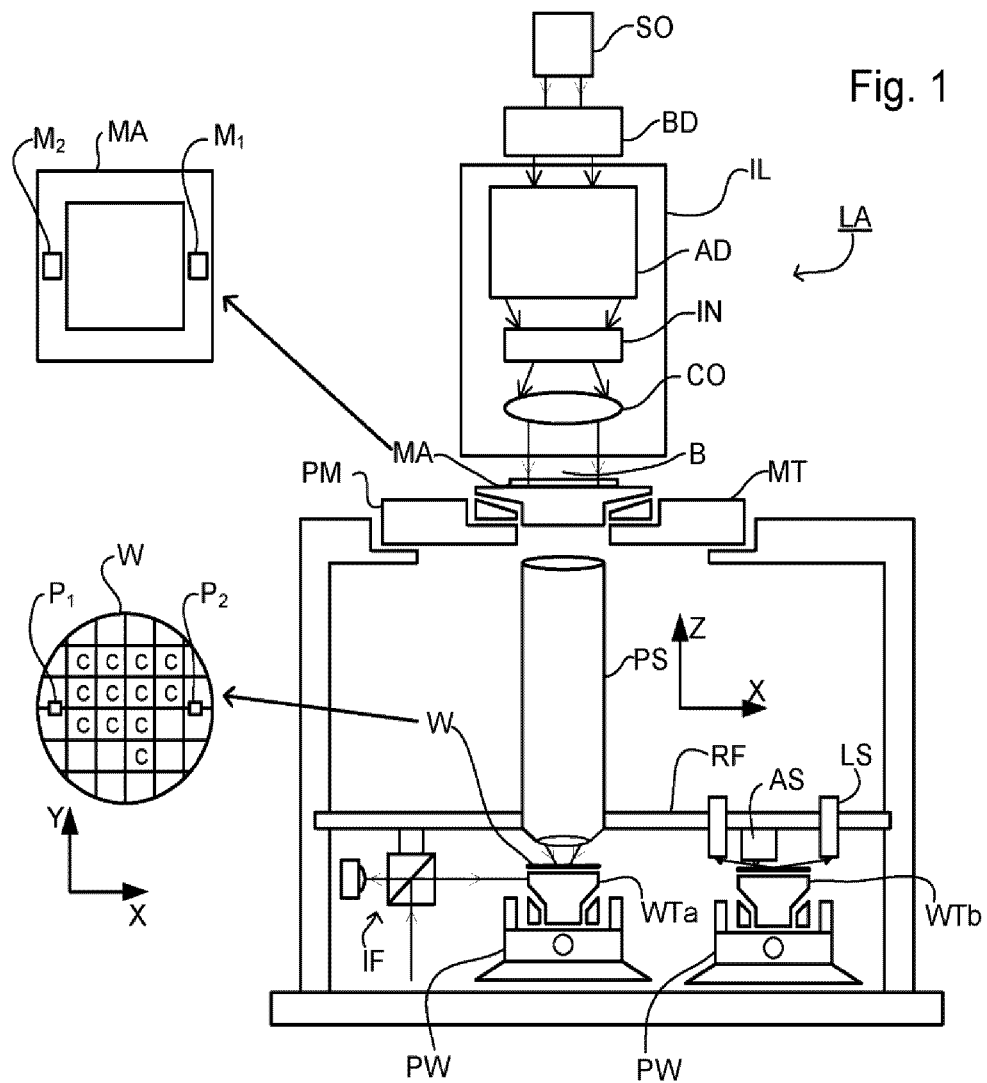
FIG. 1 schematically depicts a lithography apparatus according to an embodiment.

FIG. 1 schematically depicts an embodiment of a lithographic apparatus LA. The apparatus comprises:
- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT (e.g., WTa, WTb or both) constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies and often referred to as fields) of the substrate W, the projection system supported on a reference frame (RF).

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

So, the illuminator IL may comprise adjuster AM configured to adjust the (angular/spatial) intensity distribution of the beam. Generally, at least the outer and/or inner radial extent (commonly referred to as G-outer and G-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illumination system may include various types of optical components, such as refractive, reflective, magnetic, electromagnetic, electrostatic or other types of optical components, or any combination thereof, for directing, shaping, or controlling radiation.

Thus, the illuminator provides a conditioned beam of radiation B, having a desired uniformity and intensity distribution in its cross section.

The support structure MT supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

So, in operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

Various patterns on or provided by a patterning device may have different process windows. i.e., a space of processing variables under which a pattern will be produced within specification. Examples of pattern specifications that relate to potential systematic defects include checks for necking, line pull back, line thinning, CD, edge placement, overlapping, resist top loss, resist undercut and/or bridging. The process window of all the patterns on a patterning device or an area thereof may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein. When controlling a part of a patterning process, it is possible and economical to focus on the hot spots. When the hot spots are not defective, it is most likely that all the patterns are not defective.

Figure 2:
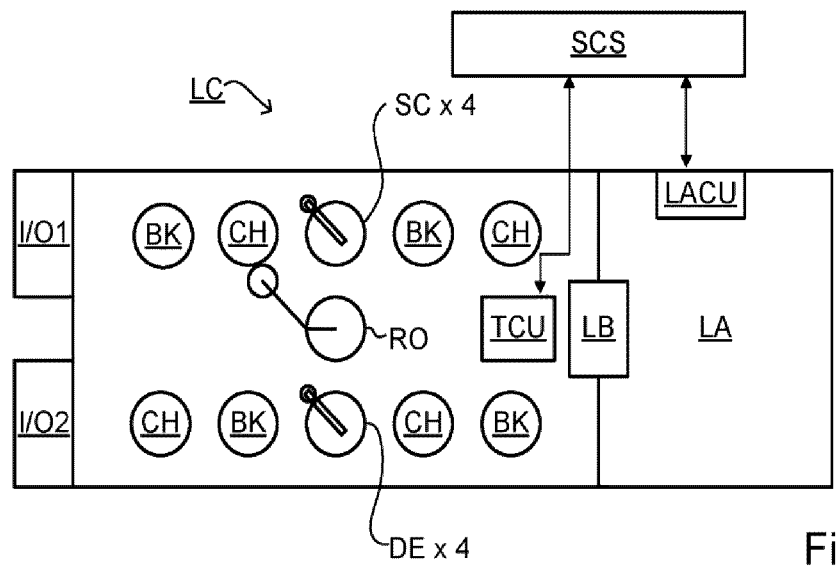
FIG. 2 schematically depicts an embodiment of a lithographic cell or cluster, according to an embodiment.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently and/or in order to monitor a part of the patterning process (e.g., a device manufacturing process) that includes at least one pattern transfer step (e.g., an optical lithography step), it is desirable to inspect a substrate or other object to measure or determine one or more properties such as alignment, overlay (which can be, for example, between structures in overlying layers or between structures in a same layer that have been provided separately to the layer by, for example, a double patterning process), line thickness, critical dimension (CD), focus offset, a material property, etc. Accordingly a manufacturing facility in which lithocell LC is located also typically includes a metrology system MET which measures some or all of the substrates W that have been processed in the lithocell or other objects in the lithocell. The metrology system MET may be part of the lithocell LC, for example it may be part of the lithographic apparatus LA (such as alignment sensor AS).

The one or more measured parameters may include, for example, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on the substrate. The measurement can be performed after-development of a resist but before etching or can be performed after-etch.

There are various techniques for making measurements of the structures formed in the patterning process, including the use of a scanning electron microscope, an image-based measurement tool and/or various specialized tools. As discussed above, a fast and non-invasive form of specialized metrology tool is one in which a beam of radiation is directed onto a target on the surface of the substrate and properties of the scattered (diffracted/reflected) beam are measured. By evaluating one or more properties of the radiation scattered by the substrate, one or more properties of the substrate can be determined. This may be termed diffraction-based metrology. One such application of this diffraction-based metrology is in the measurement of feature asymmetry within a target. This can be used as a measure of overlay, for example, but other applications are also known. For example, asymmetry can be measured by comparing opposite parts of the diffraction spectrum (for example, comparing the −1st and +1$^{st}$ orders in the diffraction spectrum of a periodic grating). This can be done as described above and as described, for example, in U.S. patent application publication US 2006-066855, which is incorporated herein in its entirety by reference. Another application of diffraction-based metrology is in the measurement of feature width (CD) within a target. Such techniques can use the apparatus and methods described hereafter.

Thus, in a device fabrication process (e.g., a patterning process or a lithography process), a substrate or other objects may be subjected to various types of measurement during or after the process. The measurement may determine whether a particular substrate is defective, may establish adjustments to the process and apparatuses used in the process (e.g., aligning two layers on the substrate or aligning the patterning device to the substrate), may measure the performance of the process and the apparatuses, or may be for other purposes. Examples of measurement include optical imaging (e.g., optical microscope), non-imaging optical measurement (e.g., measurement based on diffraction such as ASML YieldStar metrology tool, ASML SMASH metrology system), mechanical measurement (e.g., profiling using a stylus, atomic force microscopy (AFM)), and/or non-optical imaging (e.g., scanning electron microscopy (SEM)). The SMASH (SMart Alignment Sensor Hybrid) system, as described in U.S. Pat. No. 6,961,116, which is incorporated by reference herein in its entirety, employs a self-referencing interferometer that produces two overlapping and relatively rotated images of an alignment marker, detects intensities in a pupil plane where Fourier transforms of the images are caused to interfere, and extracts the positional information from the phase difference between diffraction orders of the two images which manifests as intensity variations in the interfered orders.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, a metrology apparatus is used to determine one or more properties of the substrate, and in particular, how one or more properties of different substrates vary or different layers of the same substrate vary from layer to layer. As noted above, the metrology apparatus may be integrated into the lithographic apparatus LA or the lithocell LC or may be a stand-alone device.

To enable the metrology, one or more targets can be provided on the substrate. In an embodiment, the target is specially designed and may comprise a periodic structure. In an embodiment, the target is a part of a device pattern, e.g., a periodic structure of the device pattern. In an embodiment, the device pattern is a periodic structure of a memory device (e.g., a Bipolar Transistor (BPT), a Bit Line Contact (BLC), etc. structure).

In an embodiment, the target on a substrate may comprise one or more 1-D periodic structures (e.g., gratings), which are printed such that after development, the periodic structural features are formed of solid resist lines. In an embodiment, the target may comprise one or more 2-D periodic structures (e.g., gratings), which are printed such that after development, the one or more periodic structures are formed of solid resist pillars or vias in the resist. The bars, pillars or vias may alternatively be etched into the substrate (e.g., into one or more layers on the substrate).

In an embodiment, one of the parameters of interest of a patterning process is overlay. Overlay can be measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by device product structures on a substrate. In an embodiment, multiple targets can be measured in one radiation capture.

Figure 3:
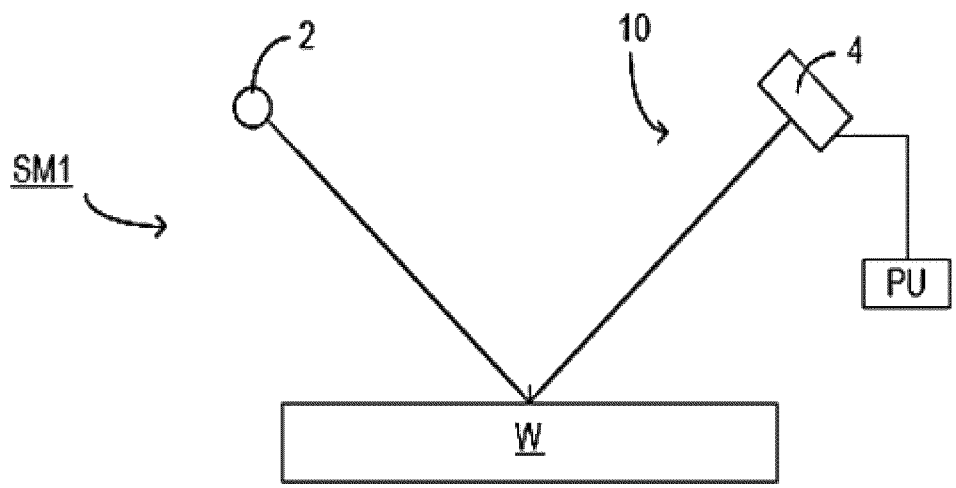
FIG. 3 schematically depicts an example inspection apparatus and metrology technique, according to an embodiment.
Figure 3:
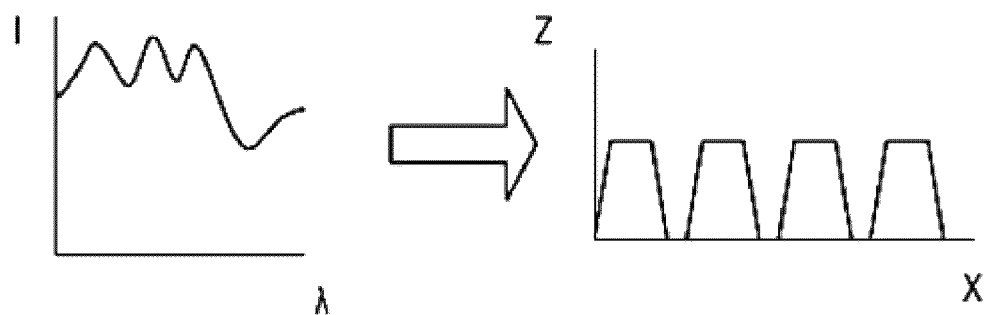

FIG. 3 depicts an example inspection apparatus (e.g., a scatterometer). It comprises a broadband (white light) radiation projector 2 which projects radiation onto a substrate W. The redirected radiation is passed to a spectrometer detector 4, which measures a spectrum 10 (intensity as a function of wavelength) of the specular reflected radiation, as shown, e.g., in the graph in the lower left. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 3. In general, for the reconstruction the general form of the structure is known and some variables are assumed from knowledge of the process by which the structure was made, leaving only a few variables of the structure to be determined from the measured data. Such an inspection apparatus may be configured as a normal-incidence inspection apparatus or an oblique-incidence inspection apparatus.

Figures 4, 5:
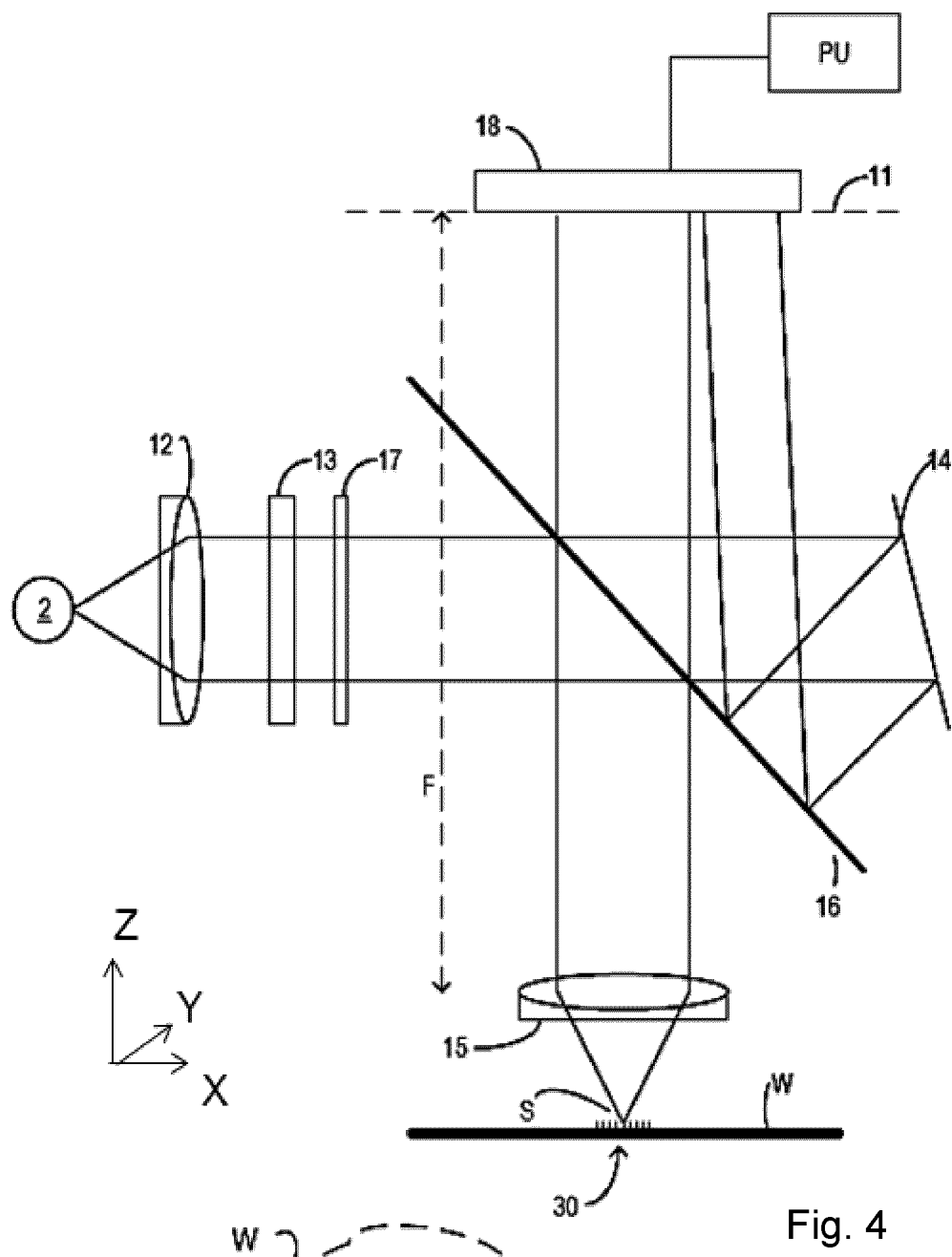
FIG. 4 schematically depicts an example inspection apparatus, according to an embodiment.
FIG. 5 illustrates the relationship between an illumination spot of an inspection apparatus and a metrology target, according to an embodiment.

Another inspection apparatus that may be used is shown in FIG. 4. In this device, the radiation emitted by radiation source 2 is collimated using lens system 12 and transmitted through interference filter 13 and polarizer 17, reflected by partially reflecting surface 16 and is focused into a spot S on substrate W via an objective lens 15, which has a high numerical aperture (NA), desirably at least 0.9 or at least 0.95. An immersion inspection apparatus (using a relatively high refractive index fluid such as water) may even have a numerical aperture over 1.

As in the lithographic apparatus LA, one or more substrate tables may be provided to hold the substrate W during measurement operations. The substrate tables may be similar or identical in form to the substrate table WT of FIG. 1. In an example where the inspection apparatus is integrated with the lithographic apparatus, they may even be the same substrate table. Coarse and fine positioners may be provided to a second positioner PW configured to accurately position the substrate in relation to a measurement optical system. Various sensors and actuators are provided for example to acquire the position of a target of interest, and to bring it into position under the objective lens 15. Typically many measurements will be made on targets at different locations across the substrate W. The substrate support can be moved in X and Y directions to acquire different targets, and in the Z direction to obtain a desired location of the target relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and only the substrate moves. Provided the relative position of the substrate and the optical system is correct, it does not matter in principle which one of those is moving in the real world, or if both are moving, or a combination of a part of the optical system is moving (e.g., in the Z and/or tilt direction) with the remainder of the optical system being stationary and the substrate is moving (e.g., in the X and Y directions, but also optionally in the Z and/or tilt direction).

The radiation redirected by the substrate W then passes through partially reflecting surface 16 into a detector 18 in order to have the spectrum detected. The detector 18 may be located at a back-projected focal plane 11 (i.e., at the focal length of the lens system 15) or the plane 11 may be re-imaged with auxiliary optics (not shown) onto the detector 18. The detector may be a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam may be used, for example, to measure the intensity of the incident radiation. To do this, when the radiation beam is incident on the partially reflecting surface 16 part of it is transmitted through the partially reflecting surface 16 as a reference beam towards a reference mirror 14. The reference beam is then projected onto a different part of the same detector 18 or alternatively on to a different detector (not shown).

One or more interference filters 13 are available to select a wavelength of interest in the range of, say, 405-790 nm or even lower, such as 200-300 nm. The interference filter may be tunable rather than comprising a set of different filters. A grating could be used instead of an interference filter. An aperture stop or spatial light modulator (not shown) may be provided in the illumination path to control the range of angle of incidence of radiation on the target.

The detector 18 may measure the intensity of redirected radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may be etched into or on the substrate (e.g., into one or more layers on the substrate). The pattern (e.g., of bars, pillars or vias) is sensitive to change in processing in the patterning process (e.g., optical aberration in the lithographic projection apparatus (particularly the projection system PS), focus change, dose change, etc.) and will manifest in a variation in the printed grating. Accordingly, the measured data of the printed grating is used to reconstruct the grating. One or more parameters of the 1-D grating, such as line width and/or shape, or one or more parameters of the 2-D grating, such as pillar or via width or length or shape, may be input to the reconstruction process, performed by processor PU, from knowledge of the printing step and/or other inspection processes.

In addition to measurement of a parameter by reconstruction, angle resolved scatterometry is useful in the measurement of asymmetry of features in product and/or resist patterns. A particular application of asymmetry measurement is for the measurement of overlay, where the target 30 comprises one set of periodic features superimposed on another. The concepts of asymmetry measurement using the instrument of FIG. 3 or FIG. 4 are described, for example, in U.S. patent application publication US2006-066855, which is incorporated herein in its entirety. Simply stated, while the positions of the diffraction orders in the diffraction spectrum of the target are determined only by the periodicity of the target, asymmetry in the diffraction spectrum is indicative of asymmetry in the individual features which make up the target. In the instrument of FIG. 4, where detector 18 may be an image sensor, such asymmetry in the diffraction orders appears directly as asymmetry in the pupil image recorded by detector 18. This asymmetry can be measured by digital image processing in unit PU, and calibrated against known values of overlay.

FIG. 5 illustrates a plan view of a typical target 30, and the extent of illumination spot S in the apparatus of FIG. 4. To obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. The illumination arrangement 2, 12, 13, 17 may be configured to provide illumination of a uniform intensity across a back focal plane of objective 15. Alternatively, by, e.g., including an aperture in the illumination path, illumination may be restricted to on axis or off axis directions.

Figure 6:
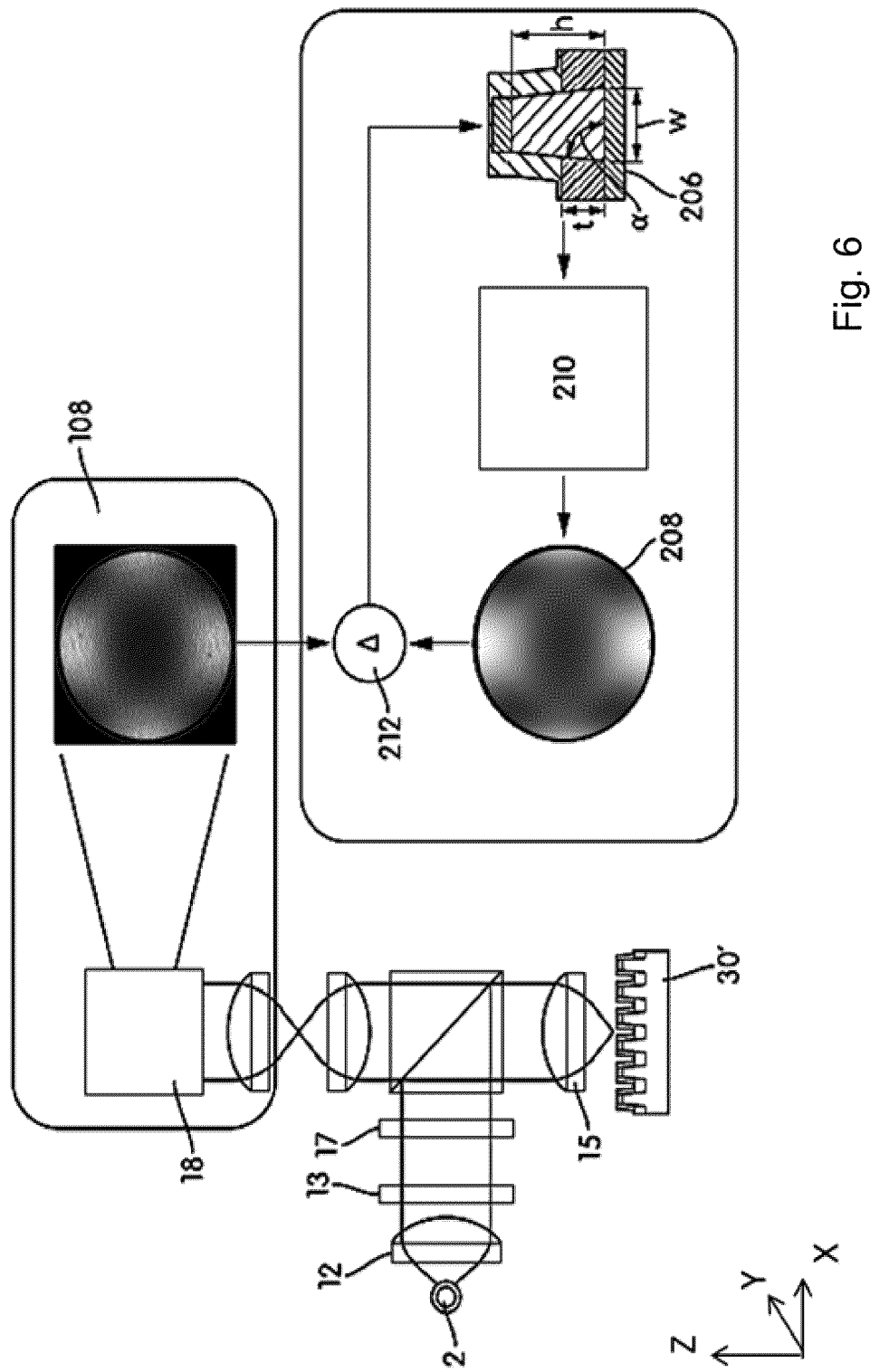
FIG. 6 schematically depicts a process of deriving a plurality of variables of interest based on measurement data, according to an embodiment.

FIG. 6 schematically depicts an example process of the determination of the value of one or more variables of interest of a target pattern 30' based on measurement data obtained using metrology. Radiation detected by the detector 18 provides a measured radiation distribution 108 for target 30'.

For a given target 30', a radiation distribution 208 can be computed/simulated from a parameterized model 206 using, for example, a numerical Maxwell solver 210. The parameterized model 206 shows example layers of various materials making up, and associated with, the target. The parameterized model 206 may include one or more of variables for the features and layers of the portion of the target under consideration, which may be varied and derived. As shown in FIG. 6, the one or more of the variables may include the thickness t of one or more layers, a width w (e.g., CD) of one or more features, a height h of one or more features, and/or a sidewall angle α of one or more features. Although not shown, the one or more of the variables may further include, but is not limited to, the refractive index (e.g., a real or complex refractive index, refractive index tensor, etc.) of one or more of the layers, the extinction coefficient of one or more layers, the absorption of one or more layers, resist loss during development, a footing of one or more features, and/or line edge roughness of one or more features. The initial values of the variables may be those expected for the target being measured. The measured radiation distribution 108 is then compared at 212 to the computed radiation distribution 208 to determine the difference between the two. If there is a difference, the values of one or more of the variables of the parameterized model 206 may be varied, a new computed radiation distribution 208 calculated and compared against the measured radiation distribution 108 until there is sufficient match between the measured radiation distribution 108 and the computed radiation distribution 208. At that point, the values of the variables of the parameterized model 206 provide a good or best match of the geometry of the actual target 30'. In an embodiment, there is sufficient match when a difference between the measured radiation distribution 108 and the computed radiation distribution 208 is within a tolerance threshold.

Figure 7:
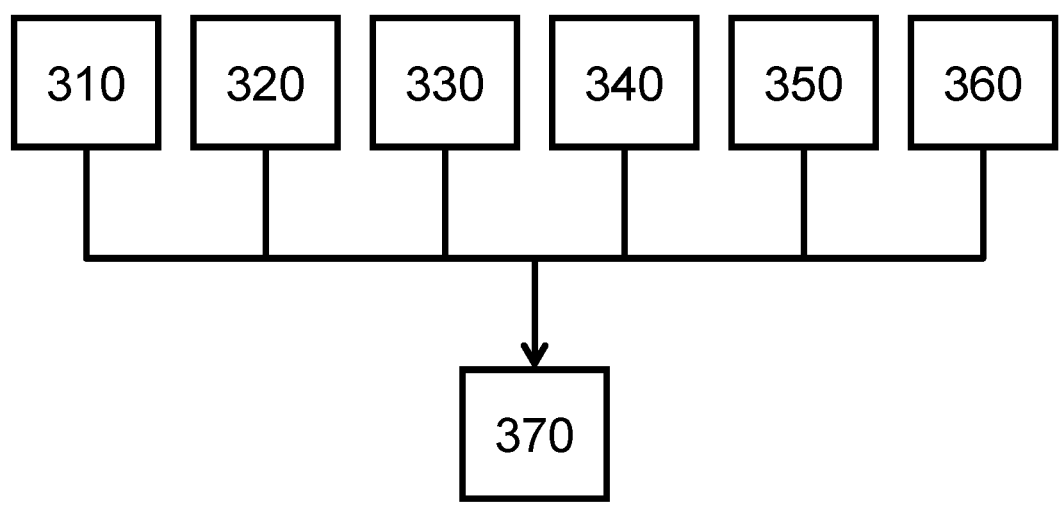
FIG. 7 shows example categories of processing variables, according to an embodiment.

Variables of a patterning process are called "processing variables." The patterning process may include processes upstream and downstream to the actual transfer of the pattern in a lithography apparatus. FIG. 7 shows example categories of the processing variables 370. The first category may be variables 310 of the lithography apparatus or any other apparatuses used in the lithography process. Examples of this category include variables of the illumination, projection system, substrate stage, etc. of a lithography apparatus. The second category may be variables 320 of one or more procedures performed in the patterning process. Examples of this category include focus control or focus measurement, dose control or dose measurement, bandwidth, exposure duration, development temperature, chemical composition used in development, etc. The third category may be variables 330 of the design layout and its implementation in, or using, a patterning device. Examples of this category may include shapes and/or locations of assist features, adjustments applied by a resolution enhancement technique (RET), CD of mask features, etc. The fourth category may be variables 340 of the substrate. Examples include characteristics of structures under a resist layer, chemical composition and/or physical dimension of the resist layer, etc. The fifth category may be characteristics 350 of temporal variation of one or more variables of the patterning process. Examples of this category include a characteristic of high frequency stage movement (e.g., frequency, amplitude, etc.), high frequency laser bandwidth change (e.g., frequency, amplitude, etc.) and/or high frequency laser wavelength change. These high frequency changes or movements are those above the response time of mechanisms to adjust the underlying variables (e.g., stage position, laser intensity). The sixth category may be characteristics 360 of processes upstream of, or downstream to, pattern transfer in a lithographic apparatus, such as spin coating, post-exposure bake (PEB), development, etching, deposition, doping and/or packaging.

As will be appreciated, many, if not all of these variables, will have an effect on a parameter of the patterning process and often a parameter of interest. Non-limiting examples of parameters of the patterning process may include critical dimension (CD), critical dimension uniformity (CDU), focus, overlay, edge position or placement, sidewall angle, pattern shift, etc. Often, these parameters express an error from a nominal value (e.g., a design value, an average value, etc.). The parameter values may be the values of a characteristic of individual patterns or a statistic (e.g., average, variance, etc.) of the characteristic of a group of patterns.

The values of some or all of the processing variables, or a parameter related thereto, may be determined by a suitable method. For example, the values may be determined from data obtained with various metrology tools (e.g., a substrate metrology tool). The values may be obtained from various sensors or systems of an apparatus in the patterning process (e.g., a sensor, such as a leveling sensor or alignment sensor, of a lithography apparatus, a control system (e.g., a substrate or patterning device table control system) of a lithography apparatus, a sensor in a track tool, etc.). The values may be from an operator of the patterning process.

Figure 8:
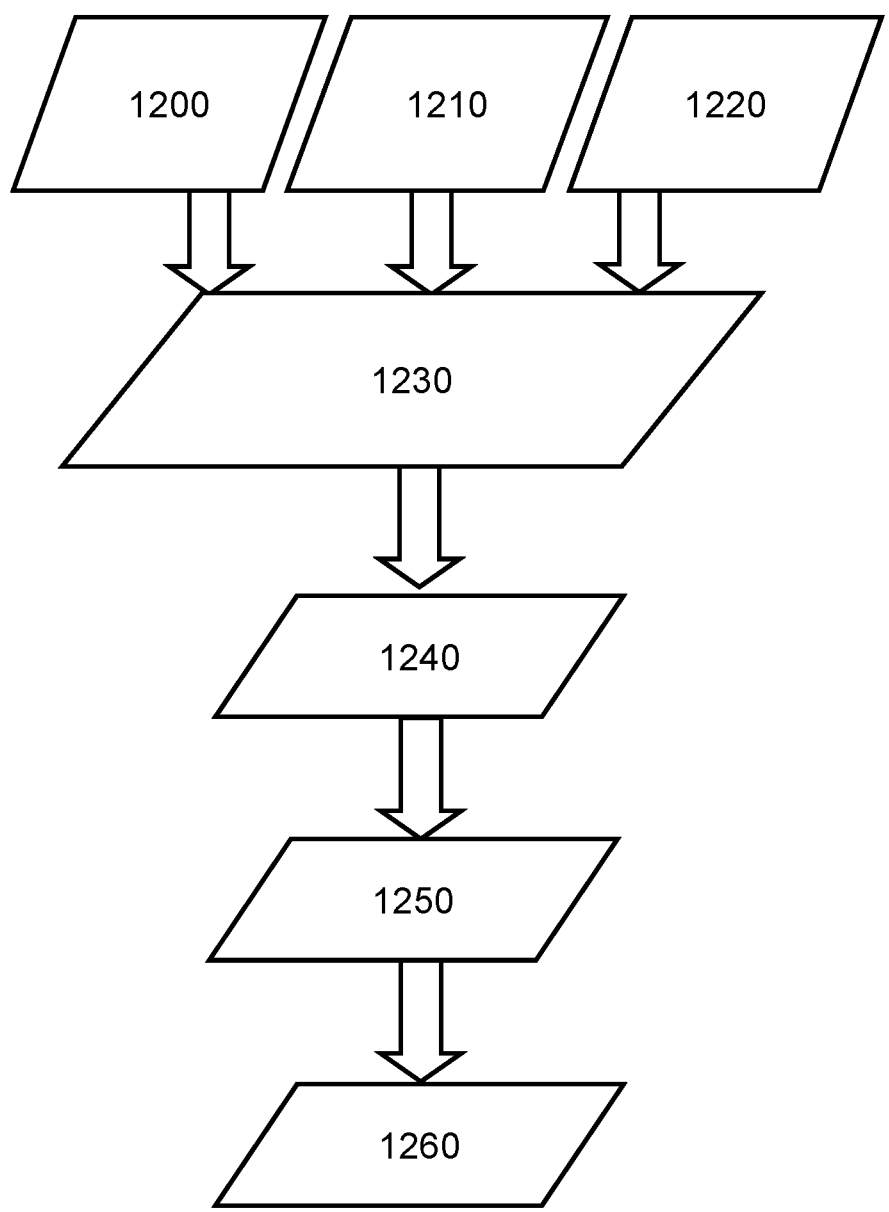
FIG. 8 schematically shows a flow for a patterning simulation method, according to an embodiment.

An exemplary flow chart for modelling and/or simulating parts of a patterning process is illustrated in FIG. 8. As will be appreciated, the models may represent a different patterning process and need not comprise all the models described below. A source model 1200 represents optical characteristics (including radiation intensity distribution, bandwidth and/or phase distribution) of the illumination of a patterning device. The source model 1200 can represent the optical characteristics of the illumination that include, but not limited to, numerical aperture settings, illumination sigma (σ) settings as well as any particular illumination shape (e.g. off-axis radiation shape such as annular, quadrupole, dipole, etc.), where σ (or sigma) is outer radial extent of the illuminator.

A projection optics model 1210 represents optical characteristics (including changes to the radiation intensity distribution and/or the phase distribution caused by the projection optics) of the projection optics. The projection optics model 1210 can represent the optical characteristics of the projection optics, including aberration, distortion, one or more refractive indexes, one or more physical sizes, one or more physical dimensions, etc.

The patterning device/design layout model module 1220 captures how the design features are laid out in the pattern of the patterning device and may include a representation of detailed physical properties of the patterning device, as described, for example, in U.S. Pat. No. 7,587,704, which is incorporated by reference in its entirety. In an embodiment, the patterning device/design layout model module 1220 represents optical characteristics (including changes to the radiation intensity distribution and/or the phase distribution caused by a given design layout) of a design layout (e.g., a device design layout corresponding to a feature of an integrated circuit, a memory, an electronic device, etc.), which is the representation of an arrangement of features on or formed by the patterning device. Since the patterning device used in the lithographic projection apparatus can be changed, it is desirable to separate the optical properties of the patterning device from the optical properties of the rest of the lithographic projection apparatus including at least the illumination and the projection optics. The objective of the simulation is often to accurately predict, for example, edge placements and CDs, which can then be compared against the device design. The device design is generally defined as the pre-OPC patterning device layout, and will be provided in a standardized digital file format such as GDSII or OASIS.

An aerial image 1230 can be simulated from the source model 1200, the projection optics model 1210 and the patterning device/design layout model 1220. An aerial image (AI) is the radiation intensity distribution at substrate level. Optical properties of the lithographic projection apparatus (e.g., properties of the illumination, the patterning device and the projection optics) dictate the aerial image.

A resist layer on a substrate is exposed by the aerial image and the aerial image is transferred to the resist layer as a latent "resist image" (RI) therein. The resist image (RI) can be defined as a spatial distribution of solubility of the resist in the resist layer. A resist image 1250 can be simulated from the aerial image 1230 using a resist model 1240. The resist model can be used to calculate the resist image from the aerial image, an example of which can be found in U.S. Patent Application Publication No. US 2009-0157360, the disclosure of which is hereby incorporated by reference in its entirety. The resist model typically describes the effects of chemical processes which occur during resist exposure, post exposure bake (PEB) and development, in order to predict, for example, contours of resist features formed on the substrate and so it typically related only to such properties of the resist layer (e.g., effects of chemical processes which occur during exposure, post-exposure bake and development). In an embodiment, the optical properties of the resist layer, e.g., refractive index, film thickness, propagation and polarization effects—may be captured as part of the projection optics model 1210.

So, in general, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of incident energy, which is further modified by diffusion processes and various loading effects. Efficient simulation methods that are fast enough for full-chip applications approximate the realistic 3-dimensional intensity distribution in the resist stack by a 2-dimensional aerial (and resist) image.

In an embodiment, the resist image can be used an input to a post-pattern transfer process model module 1260. The post-pattern transfer process model 1260 defines performance of one or more post-resist development processes (e.g., etch, development, etc.).

Simulation of the patterning process can, for example, predict contours, CDs, edge placement (e.g., edge placement error), etc. in the resist and/or etched image. Thus, the objective of the simulation is to accurately predict, for example, edge placement, and/or aerial image intensity slope, and/or CD, etc. of the printed pattern. These values can be compared against an intended design to, e.g., correct the patterning process, identify where a defect is predicted to occur, etc. The intended design is generally defined as a pre-OPC design layout which can be provided in a standardized digital file format such as GDSII or OASIS or other file format.

Thus, the model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process.

Figure 9:
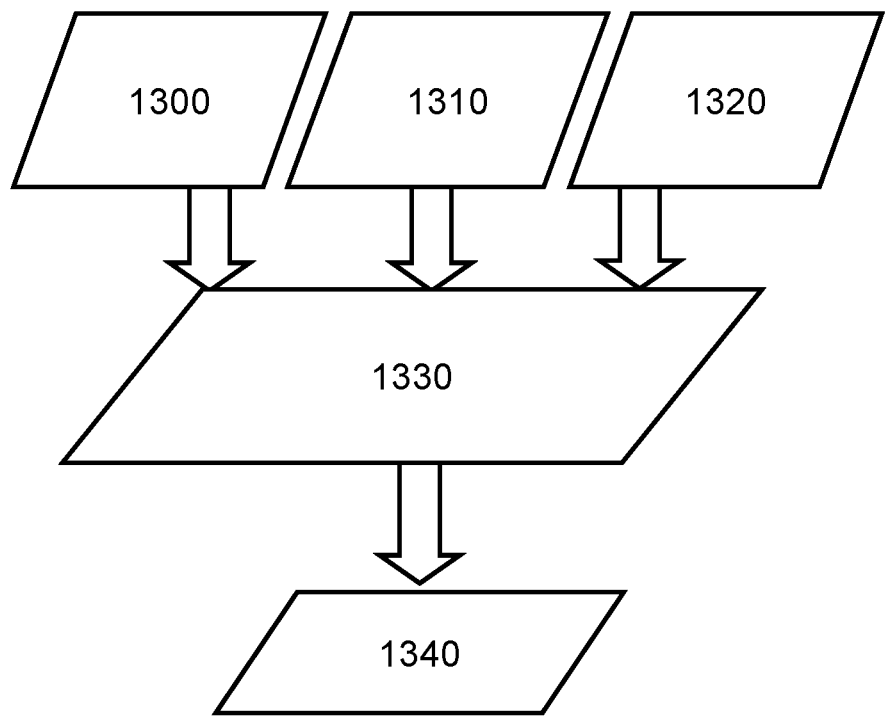
FIG. 9 schematically shows a flow for a measurement simulation method, according to an embodiment.

An exemplary flow chart for modelling and/or simulating a metrology process is illustrated in FIG. 9. As will be appreciated, the following models may represent a different metrology process and need not comprise all the models described below (e.g., some may be combined). A source model 1300 represents optical characteristics (including radiation intensity distribution, radiation wavelength, polarization, etc.) of the illumination of a metrology target. The source model 1300 can represent the optical characteristics of the illumination that include, but not limited to, wavelength, polarization, illumination sigma ($\sigma$) settings (where $\sigma$ (or sigma) is a radial extent of illumination in the illuminator), any particular illumination shape (e.g. off-axis radiation shape such as annular, quadrupole, dipole, etc.), etc.

A metrology optics model 1310 represents optical characteristics (including changes to the radiation intensity distribution and/or the phase distribution caused by the metrology optics) of the metrology optics. The metrology optics 1310 can represent the optical characteristics of the illumination of the metrology target by metrology optics and the optical characteristics of the transfer of the redirected radiation from the metrology target toward the metrology apparatus detector. The metrology optics model can represent various characteristics involving the illumination of the target and the transfer of the redirected radiation from the metrology target toward the detector, including aberration, distortion, one or more refractive indexes, one or more physical sizes, one or more physical dimensions, etc.

A metrology target model 1320 can represent the optical characteristics of the illumination being redirected by the metrology target (including changes to the illumination radiation intensity distribution and/or phase distribution caused by the metrology target). Thus, the metrology target model 1320 can model the conversion of illumination radiation into redirected radiation by the metrology target. Thus, the metrology target model can simulate the resulting illumination distribution of redirected radiation from the metrology target. The metrology target model can represent various characteristics involving the illumination of the target and the creation of the redirected radiation from the metrology, including one or more refractive indexes, one or more physical sizes of the metrology, the physical layout of the metrology target, etc. Since the metrology target used can be changed, it is desirable to separate the optical properties of the metrology target from the optical properties of the rest of the metrology apparatus including at least the illumination and projection optics and the detector. The objective of the simulation is often to accurately predict, for example, intensity, phase, etc., which can then be used to derive a parameter of interest of the patterning process, such overlay, CD, focus, etc.

A pupil or aerial image 1330 can be simulated from the source model 1300, the metrology optics model 1310 and the metrology target model 1320. A pupil or aerial image is the radiation intensity distribution at the detector level. Optical properties of the metrology optics and metrology target (e.g., properties of the illumination, the metrology target and the metrology optics) dictate the pupil or aerial image.

A detector of the metrology apparatus is exposed to the pupil or aerial image and detects one or more optical properties (e.g., intensity, phase, etc.) of the pupil or aerial image. A detection model module 1320 represents how the radiation from the metrology optics is detected by the detector of the metrology apparatus. The detection model can describe how the detector detects the pupil or aerial image and can include signal to noise, sensitivity to incident radiation on the detector, etc. So, in general, the connection between the metrology optics model and the detector model is a simulated pupil or aerial image, which arises from the illumination of the metrology target by the optics, redirection of the radiation by the target and transfer of the redirected radiation to the detectors. The radiation distribution (pupil or aerial image) is turned into detection signal by absorption of incident energy on the detector.

Simulation of the metrology process can, for example, predict spatial intensity signals, spatial phase signals, etc. at the detector or other calculated values from the detection system, such as an overlay, CD, etc. value based on the detection by the detector of the pupil or aerial image. Thus, the objective of the simulation is to accurately predict, for example, detector signals or derived values such overlay, CD, corresponding to the metrology target. These values can be compared against an intended design value to, e.g., correct the patterning process, identify where a defect is predicted to occur, etc.

Thus, the model formulation describes most, if not all, of the known physics and chemistry of the overall metrology process, and each of the model parameters desirably corresponds to a distinct physical and/or chemical effect in the metrology process.

In an embodiment, data from the simulation process described in FIG. 8 and the metrology data from metrology tools or metrology simulation discussed above can be employed in the methods described herein. For example, the data can be used to establish relationship between characteristic associated with a substrate, process variables, and/or mask parameters. For example, a relationship between CD of a feature printed on a substrate, the dose values, and mask CD. In an embodiment, additional relationships may be implemented in one or more models of the simulation process to generate e.g., defect-aware patterning process, retargeting of a target layout, etc.

Various patterns on or provided by a patterning device may have different process windows. i.e., a space of processing variables under which a pattern will be produced within a specification. Examples of pattern specifications that relate to potential systematic defects include checks for necking, line pull back, line thinning, CD, edge placement, overlapping, resist top loss, resist undercut and/or bridging. For example, a process window is defined over two processing variables i.e., dose and focus such that the CD obtained after patterning may be within ±10% of the desired CD of a feature of the pattern. The process window of all the patterns on a patterning device or an area thereof may be obtained by merging (e.g., overlapping) process windows of individual patterns.

Typically, a pattern can include several instances of one or more features (e.g., $10^6$ instances of feature A, $10^4$ instances of feature B, etc.) arranged in a certain manner to form the pattern. During the patterning process, one or more features may fail at certain, for example, dose/focus settings, leading to a defect in the substrate thereby affecting the yield of the patterning process. Hence, selection of an appropriate range of dose/focus values or processing window is important to achieve a desired yield or a selected yield. For example, a high yield (e.g., 99.9%) may be selected or a range of yield (e.g., 98%-99.99%) may be selected by, for example, a designer or a manufacturer.

Some attempts have been made at improving process windows for specific features using rule-based modification, called "retargeting," to the pre-OPC layout. See K. Lucas et al., "Process, Design, and OPC Requirements for the 65 nm Device Generation," Proc. SPIE, Vol. 5040, pg. 408, 2003. One approach for rule-based retargeting of the pre-OPC layout includes selective biases and pattern shifts. This approach may improve the full process window performance for certain critical features, while still calculating OPC corrections only at nominal process condition, by selectively changing the target edge placements that the OPC software uses as the desired final result. Thus, instead of minimizing errors between the design dimensions and simulated edge placements, the OPC software instead minimizes errors between the retargeted dimensions and the simulated edge placements.

A user of the OPC software can retarget the design to improve the process window performance in a number of ways. In the simplest example of retargeting, rules can be applied to specific features to improve their printability and process window. For example, it is well known that isolated lines have poorer process window latitude than dense lines, but the process margin improves as the feature size increases. A simple rule could be applied to upsize small isolated lines, thereby improving the process window. Other rule-based retargeting methods have been developed where metrics other than CD are used to determine the retargeted edge placements, such as normalized image log slope (NILS) or sensitivity to mask CD errors (MEF or Mask Error Enhancement Factor (MEEF)).

Rule-based retargeting methods can improve printability of features across the process window, but they suffer from several disadvantages. These methods can become quite complex and are only based on the pre-OPC layout. Once the OPC corrections are added to a design, the printing performance as a function of process conditions can become quite different from what was anticipated from the pre-OPC design, introducing a significant error source and preventing the retargeting from achieving the desired results.

Figure 10:
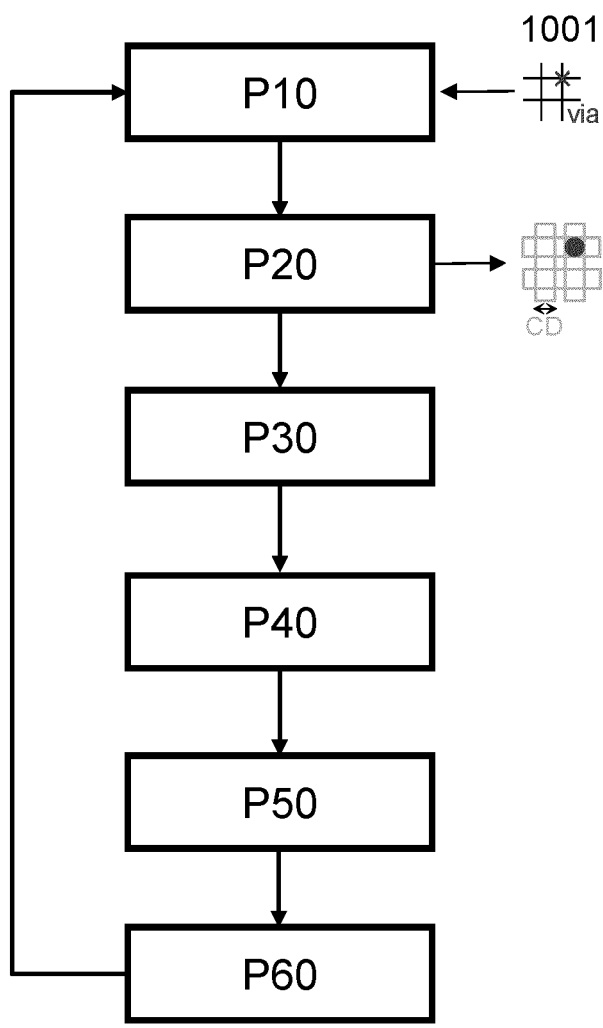
FIG. 10 is a flow chart of an example of an existing process used for retargeting related to specific features, according to an embodiment.

FIG. 10 illustrates another example of an existing process used for retargeting related to specific features. In procedure P10, a semiconductor manufacturing process starts with a development of a particular design-intent 1001 (e.g., lines connected by via having a particular critical dimension CD in an after etch image AEI) with associated (preliminary) design-rules. For example, the design rules include minimum line-pitch/CD, minimum via-pitch/CD, 2D lines or 1D lines that can be supported. In procedure P20, initial target-CD's (e.g., CD of a pattern in an after development image ADI) are set for imaging, the initial target-CD's may be based on experience/extrapolations from previous nodes (e.g., previously manufactures substrates) and an early defect-inspection experiments.

Further, in procedure P30, a Source-Mask Optimization (SMO) is performed to determine the optimal illumination-pupil, usually based on a weight-function that minimizes deviations (also referred as excursions) in various gauges (e.g., selected patterns or features used for measurement purposes) of a clip given these target-CD's caused by dose/mask/focus excursions or variations.

After the SMO process, in procedure P40, mask patterns (e.g., >1k features with many gauges per feature) are selected from results of the SMO to manufacture a mask and the mask is used to image (interchangeably referred as expose or print) a pattern on a substrate. The patterns on the imaged substrate are used to calibrate, via a patterning process simulation including OPC process, process parameters such as resist parameters, metrology parameters (e.g., 10's of parameters), or other patterning process related parameters. The OPC-calibration is verified by exposing another substrate using an OPCed mask pattern, and measuring CDs of the exposed substrate. A certain residual-error is accepted here.

Once the OPC process is calibrated, in procedure P50, design-of-experiments (DOE) are performed, e.g. using a focus-exposure-matrix (FEM) to expose a substrate. The exposed substrate is inspected for defects using Brightfield or e-beam inspection tools (e.g., scanning electron microcopy (SEM) or transmission electron microscopy (TEM)). For a more mature process, electrical-test structures and an inspection tool such as SEM/TEM is used to refine the inspection-algorithms to capture the right amount of defects with a high capture and low nuisance rate.

In procedure P60, process adjustments are performed and/or the design-rules are updated (e.g. certain assist features are added to the OPC-set, some may be discarded from the OPC-set). As a consequence of a non-ideal choices of the target-CD with respect to failure rates, target CD's are also updated i.e. "retargeted" to improve defect-rates at ADI, AEI, AEI (2 L) to acceptable failure rate so that a minimum patterning-related yield is achieved. After retargeting, the processes including SMO, OPC, inspection, etc. and further retargeting-CD may be performed once more to improve the yield further.

The existing process discussed above can take up to 1 year per test-device of a customer where the semiconductor manufacturing process is tuned until it has sufficient yield for each individual process-step and integrated layer of the substrate. In parallel, other solutions are also developed (e.g. OVL-targets, and controlling and monitoring solutions for process tools) to limit the variation in manufacturing and improve the total yield. It may take several test-device with increasing complexity to get to a final high volume manufacturing (HVM) process that produces a chip with sufficient patterning-yield. In an example, a yield due to patterning geometrical tolerances or design-rules. However, there is also parametric yield or yield-loss due to more random/unpredictable excursions, e.g. particles. For example, parametric yield related to functioning of the chip such as electrical performance, thermal performance to determine whether a device works, whether the device is too slow or consumes more power with respect to the requirements, etc.

One of the challenges of the existing process, discussed above, is that the learning from the first cycle (or iteration) needs to be taken into account in the next cycle (or iteration) because of various inter-dependencies between the process itself, parameters of the patterning process, and the process variable. It is difficult to parallelize, apart from using brute-force. Hence, the development-time is prolonged due to the lengthy cycle time.

The existing process has several disadvantages. First disadvantage is that for each process-iteration several new masks have to be manufactured. Secondly, metrology/inspection cycles can be very lengthy (usually several weeks). Thirdly, the conventional SMO process is not aware of the actual failure rate based limits at an extreme side of a target CD (e.g., too large/too small features). The conventional SMO simply optimizes for optimum variability e.g., in process variables±dose, ±focus, or ±mask biases for a given target-CD. Such optimization may be sub-optimal as it relies heavily on a user providing correct CD-targets based on (often proprietary) inspection models.

The present disclosure describe an alternative mechanism that determines the characteristic limits (e.g., associated with resist-CDs) from metrology/inspection-data using a defect-based process-windows. A defect-based process-window refers to process variable values determined based on failure rate data associated with a pattern to be printed on a substrate. In an embodiment, determining (e.g., via a computer hardware system 100) the defect-based process associated with a patterning process involves obtaining (i) characteristic limits of a characteristic (e.g., CD) associated with the patterning process based on failure rate measurements of the patterning process, and (ii) a probability density function (PDF) of the characteristic (e.g., CD) defined as a function of a process variable and/or a variance of the process variable of the patterning process. Based on the characteristic limits and the probability density function of the characteristic, an estimated failure rate of the patterning process is determined. Further, the defect-based process window is determined in terms of the process variable such that the estimated failure rate of the characteristic is less than a selected failure rate threshold (interchangeably referred as a desired failure rate or a target failure rate). For example, identifying of the process window involves determining a range of the process variable between an intersection of the estimated failure rate and the selected threshold.

In an embodiment, the characteristic limits are obtained by converting a probability density function of the process variable (e.g., dose) for a given setting to a probability density function of the characteristic (e.g., CD) for the setting based on a conversion function. The conversion function is determined based on a function of the process variable. Based on the characteristic distribution (e.g., CD distribution), the characteristic limits are determined for the given process variable setting and the measurements of the failure rate of the feature.

Examples of methods to determine the characteristic limits (also referred as parameter limits associated with a feature) and a defect-based process window are described in U.S. patent application Nos. 62/609,755 filed on Dec. 22, 2017 and 62/773,259, filed on Nov. 30, 2018, also filed as PCT application PCT/EP2018/085159, all of which are incorporated herein in its entirety by reference. The metrology data or inspection data is obtained from several features used to calibrate a failure rate model that can be used to determine characteristic limits in a simulator for any (e.g., interpolated) feature size.

Figure 11:
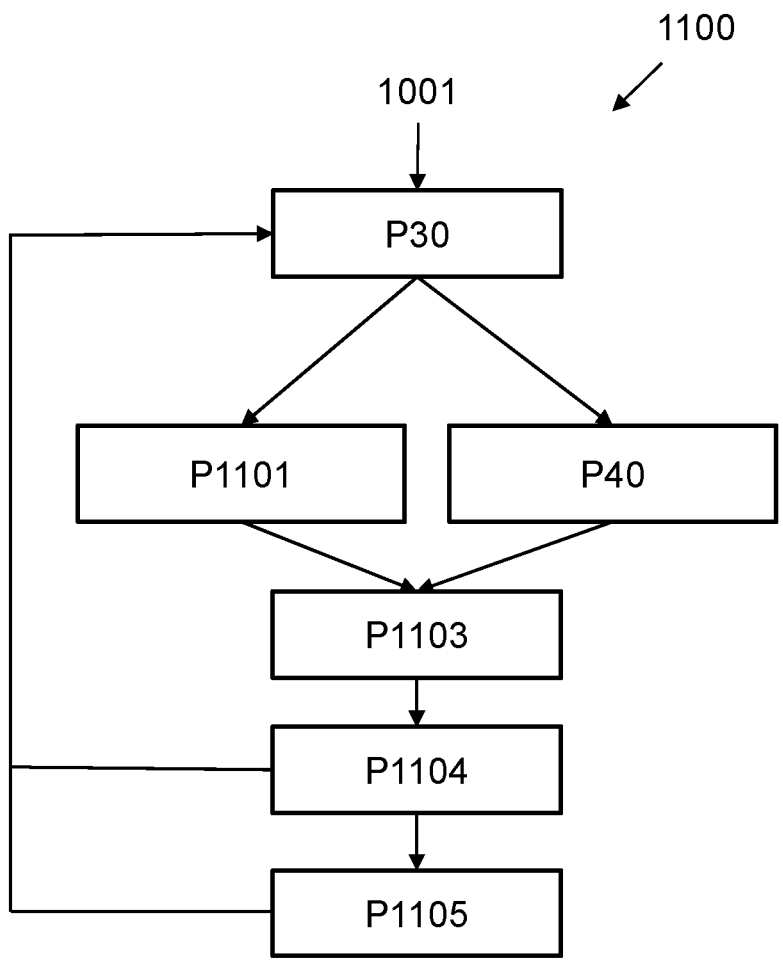
FIG. 11 is a flow chart of a simulation process that implements defect-based process window and characteristic limits to improve the conventional patterning process simulation, according to an embodiment, according to an embodiment.

According to the present disclosure, a defect-based process window is employed for improving simulation results and retargeting. FIG. 11 is a flow chart of an exemplary simulation process that implements defect-based process window and characteristic limits to improve the conventional patterning process simulation (e.g., SMO, retargeting, OPC, etc.) according to an embodiment of the present disclosure.

The method 1100 starts with the procedure P30, which simulates an SMO process on a target layout (e.g., clip of a full chip layout), as discussed in FIG. 10. The target layout can include more than a million or hundreds of thousands of features for example. The results of the SMO simulation can be FEM, optimized mask parameters (e.g., mask biases and CDs), optimized source, optimized focus, optimized illumination pupil, etc.

Procedure P1101 involves performing the defect-based process window (DB-PW) calibration on a calibration set (e.g., including 10's of gauges or selected patterns of a target layout) to determine characteristic limits (e.g., CD limits) and local CD uniformity related to a pattern to be printed on the substrate. After the DB-PW calibration, the characteristic limits can be employed to any given pattern of the target layout. Examples of methods to determine the characteristic limits (also referred as parameter limits associated with a feature) and a defect-based process window are described in PCT application number PCT/EP2018/085159, which are incorporated herein in its entirety by reference.

In parallel to P1101, the procedure P40 involving OPC-calibration (as discussed in FIG. 10) is performed using for example, 10,000 gauges. In an embodiment, an OPC calibration is performed on a much larger number of gauges or patterns compared to that used for DB-PW. In an embodiment, the DB-PW calibration and OPC-calibration are separated. The DB-PW calibration may take more time as it involves performing metrology measurements to determine actual CDs and defects on a printed substrate, while the OPC-calibration does not involve any metrology measurement or defect-based computation.

In an embodiment, the OPC calibration involves calibrating e.g., resist parameters to ensure that the simulated pattern on a substrate is close to a desired resist-target (e.g., CD in resist). In an embodiment, an output of OPC is a mask pattern including e.g., assist features, main features, a curvilinear mask pattern, rectilinear pattern. In an embodiment, the OPC calibration uses a substantially large number of patterns or gauges (e.g., 100,000 gauges), while DB-PW uses only a sub-set of gauges (e.g., 10's of gauges).

In an embodiment, the DB-PW calibration generates or uses a failure rate model and a probability density function of a characteristic of a feature. For example, a CD distribution associated with a pattern may be modeled based on measured data of a printed substrate. In an embodiment, such failure rate model and a CD distribution model may be used to determine CD limits because the calibration is done only on tens of gauges and then predict what CDs will be printed for any gauge or pattern. For example, the CD distribution and failure rate model can be Gaussian models fitted on the metrology based data e.g., the measured CDs and the failure rates. The fitted models can be used to determine the CD limits for a desired failure rate or target failure rate. In an embodiment, the CD limits can be treated as hard limits, e.g., below the CD limits the feature is considered as a defect.

In an embodiment, the DB-PW calibration also calibrates a response of how local CD uniformity (LCDU) behaves. In an example, Bossung behavior describes dosage sensitivity of the CD, while the local LCDU describes a CD variance, which can give a measure of the underlying CD distribution.

The outputs from the procedures P1101 and P40 e.g., the CD limits and resist parameters, dose-focus matrix, mask parameters, etc. can be used to perform "dynamic retargeting," in procedure P1103. Exemplary dynamic retargeting is discussed with respect to FIG. 15.

In an embodiment, the method 1100 can be further extended to determine an optimal process window based on after development image (ADI) and/or after etch image (AEI) data, in procedure P1104. For example, an ADI process window can be determined based on the CD behavior at a development step. AEI process window can be determined based on the CD behavior at an after etch step. In an embodiment, an ADI and/or an AEI models describing CD changes with changes in ADI or AEI parameters can be employed to determine the CD behavior. In an example, the AEI model can predict a CD after etch. The after etch CD can be checked against the CD limits to determine if the after etch CD is in an acceptable range. If not in the acceptable range, a retargeted layout may be generated or etch process may be modified such that the after etch CD is within the CD limits determined by the DB-PW. In an embodiment, in procedure P1105, the optimal process window and can be also used to make predictions of the yield of a full chip.

An example method to determine a CD limit can be represented in the following equation (1) discussed in detail in PCT application number PCT/EP2018/085159, which are incorporated herein in its entirety by reference.

$$R_{fail} = \int_{CD_{lim}}^{\infty} PDF_{CD}(CD,d)dCD = 1 - CDF_{CD}(CD_{lim},d) \quad (1)$$

In the equation (1) above, (i) $R_{fail}$ is a failure rate of a feature per setting of the process variables, e.g., dose, resist related, and/or etching related; (ii) $PDF_{CD}(CD, d)$ refers to a CD PDF model based on measured data in process P1101 at a certain process condition (denoted by "d"); and (iii) $CDF_{CD}(CD_{lim}, d)$ is a cumulative distribution function of the $PDF_{CD}(CD, d)$ that provides a total probability of failure at and beyond the $CD_{lim}$. The CD limits can be determined at one or more settings of the process variables (e.g. dose, resist related, etch variable) with corresponding failure rates where the failing features do not influence each other's failure-rate (i.e. one can treat each failure as an "isolated failure"), yet a sufficient amount of them is present to limit the variance of the measured or determined failure-rate. In an embodiment, $PDF_{CD}$ can be determined according to the present disclosure as described below. For example, $PDF_{CD}$ can determined as a function dose and mask variations. In another example, $PDF_{CD}$ can be determined based on an adjustment model that adjusts the variation caused due to dose contribution.

The failure rate model may be further used to determine a process window (see PCT application number PCT/EP2018/085159 for more details) over a process variable (e.g., dose, resist, etch). For example, the process window can be a range of dose values ("d") for which the estimated failure rate may be less than $10^{-9}$. In an embodiment, a desired failure rate may be determined from a desired yield (e.g., 99.9% for $10^6$ features), for example, using the equation (2) below:

$$R_{fail}(d) = (1 - Y(d)) \quad (2)$$

In an embodiment, a yield can be computed using the estimated failure rate (e.g., in eq. 2) as follows:

$$Y(d) = (1 - R_{fail}(d))^N \quad (3)$$

In equation (3) above, Y(d) is the yield at a particular dose (d) for N individual features, and $R_{fail}(d)$ is the estimated failure rate (e.g., in eq. 2). Based on such a computed yield, the process window can be selected where the computed yield is greater than or equal to the desired yield (e.g., 99.9%).

Figure 12A:
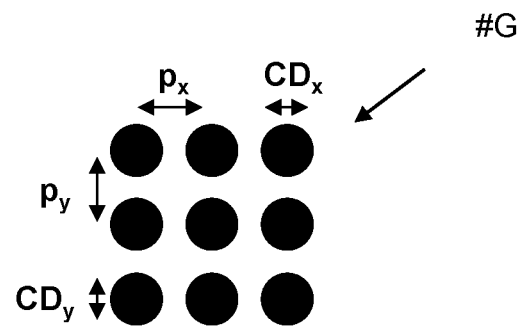
FIG. 12A illustrates an example gauge used to calibrate a simulation process (e.g., of FIG. 11), according to an embodiment.
Figure 12B:
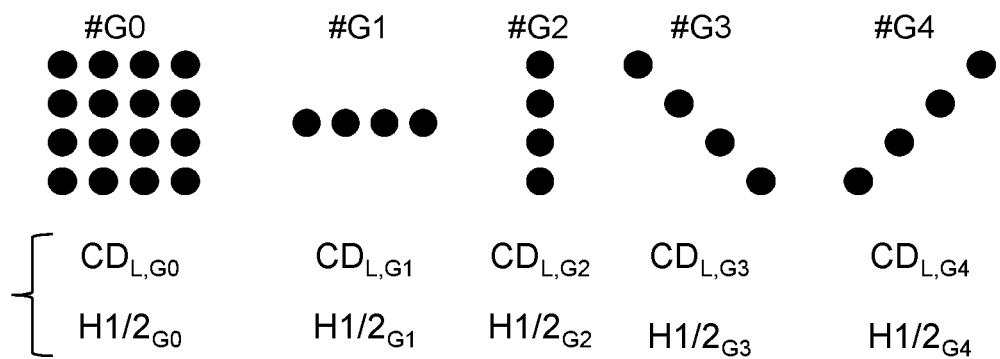
FIG. 12B illustrates example gauges and for each gauge corresponding defect-based CD limits and resist-CD limits used to calibrate a simulation process (e.g., of FIG. 11), according to an embodiment.

FIGS. 12A-12B illustrates an exemplary method of using a calibration-set of patterns to determine CD limits and failure rate data. In an embodiment, the simulated resist pattern may correspond to the measured data of DB-PW calibration (in procedure P1101) using equation (4) explained as follows.

$$CD_{lim} = a + b \cdot (H_2 - H_1) \quad (4)$$

In equation (4) above, $CD_{lim}$ is an example of characteristic limit based on a CD of a feature determined from DB-PW data, $H_2-H_1$ is a CD margin determined based on CD values of a simulated resist profile (e.g., see FIG. 12C) at two different heights, e.g., $H_1$ at a top of a resist layer, and $H_2$ at a bottom of the resist layer. In an embodiment, the SMO or a related process simulator can be modified to include equation (4) to determine margins either at the top or the bottom of a resist (see FIG. 12C).

Figure 12C:
FIG. 12C is an example resist-profile of a pattern or gauge illustrating a top CD and bottom CD locations, according to an embodiment.

In an embodiment, as shown in FIG. 12A, a gauge #G can be an array of holes with 4 parameters px, py, CDx, and CDy that can be varied, where p represent a pitch in x-direction and CDx represents CD in x-direction. In an embodiment, from the gauge #G, multiple gauges #G0, #G1, #G2, #G3, and #G4 can be generated as shown in FIG. 12B. For example, in FIG. 12B, #G1 is a single row of features, #G1 is a vertical column of features, #G3 is a diagonally arranged features. For each gauge, CD limits may be determined. For example, the CD limits can be $CD_{L,G0}$, $CD_{L,G1}$ $CD_{L,G2}$, $CD_{L,G3}$, and $CD_{L,G4}$. Similarly, for each gauge, the simulator can generate e.g., resist CDs H1/H2$_{G0}$, H1/H2$_{G1}$, H1/H2$_{G2}$, H1/H2$_{G3}$, and H1/H2$_{G4}$. In this manner, equation (4) relates the $CD_{lim}$ to the simulated CD values. An example resist profile and top and bottom positions at which CDs are measured is illustrated in FIG. 12C.

Figure 13:
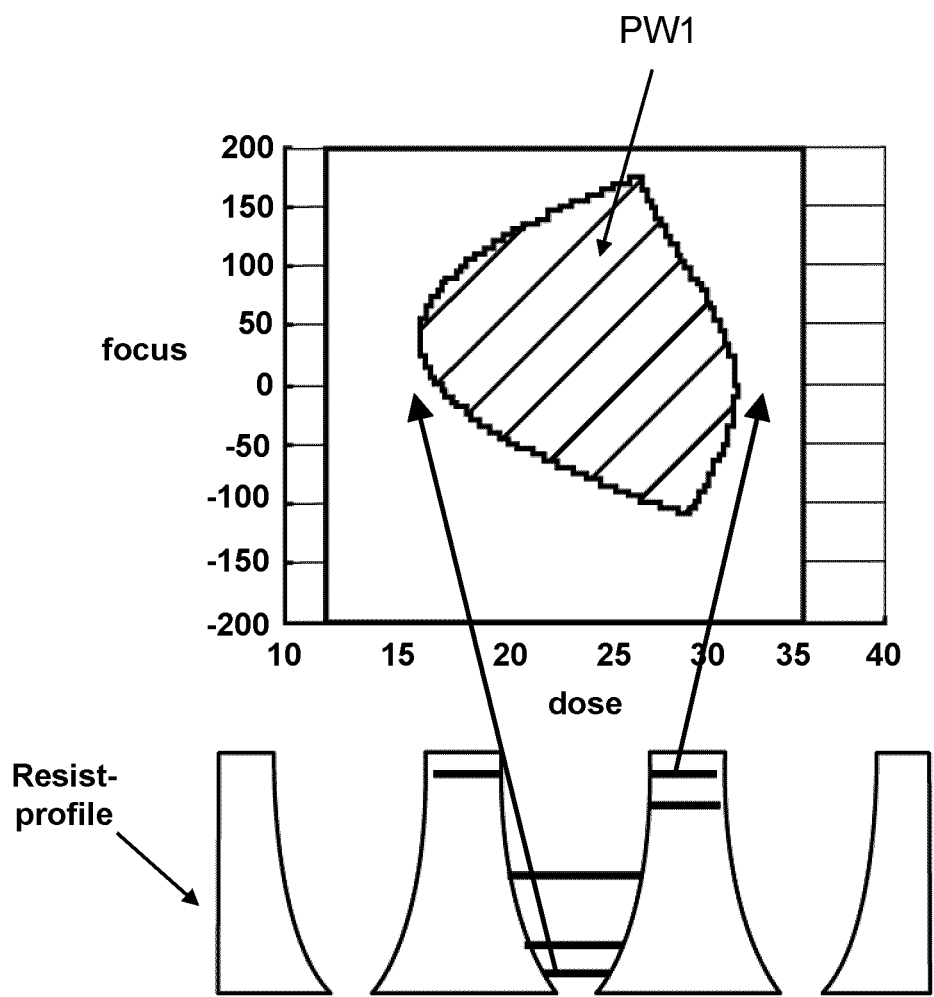
FIG. 13 illustrates an example defect-based process window associated with a top and bottom of a resist profile, according to an embodiment.

FIG. 13 shows an exemplary method of determining a defect based process window using the CDs at the top and bottom of a resist profile according to an embodiment of the present disclosure. In the present example, a process simulation is performed on a 20 nm contact hole and using an annular illumination model. In an embodiment, the process window and the $CD_{lims}$ were determined using e.g., a failure rate model based on measured data. Also, such a process window can be simulated using the modified process as discussed herein. For example, using a calibrated simulation process (e.g., discussed with respect to FIGS. 14A and 14B) including equation (4). As such, defect-based process window PW1 can be advantageously simulated early in the semiconductor manufacturing process. For example, by measuring at the bottom and the top of a resist and assuming a certain margin with respect to the $CD_{lims}$, a process window PW1 can be determined. The edge of the process window PW1 shows how the profiles or these limits behave at different depths of the resist profile. In an embodiment, the margin is an amount of CD change available to go for the bottom and the top of the resist. Then, the process window PW1 can be determined through the dose and focus matrix. So, based on the resist profile the CD limits can be compared; and based on the CD limits, the process window can be determined. In this embodiment, the defect-based process window PW1 is obtained assuming no local CD variation. In some other embodiments, LCDU is considered, and the process window may change accordingly.

Figure 14A:
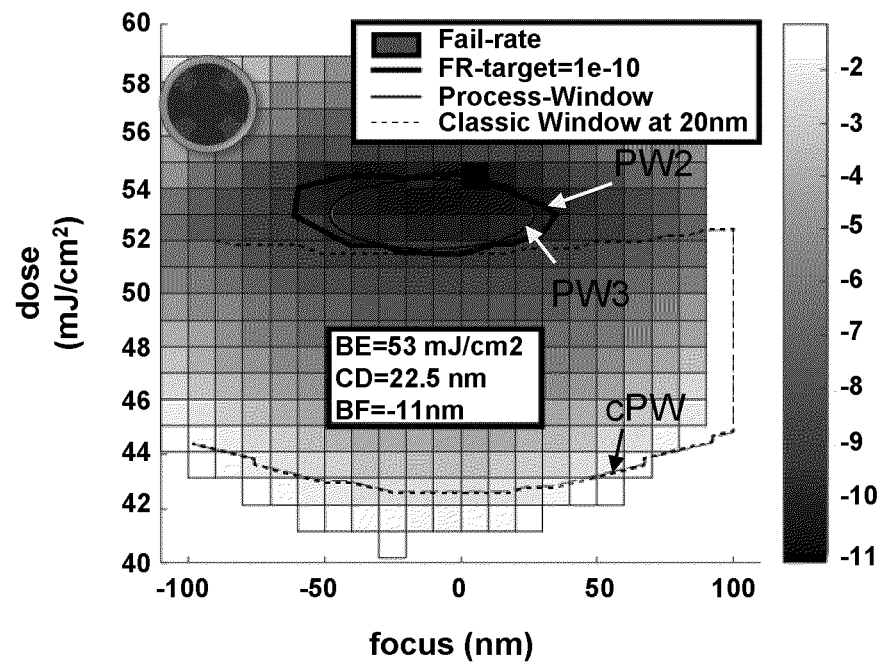
FIG. 14A illustrates an example a DB-PW process window based on experimental data used to calibrate a simulation process (e.g., of FIG. 11), according to an embodiment.
Figure 14B:
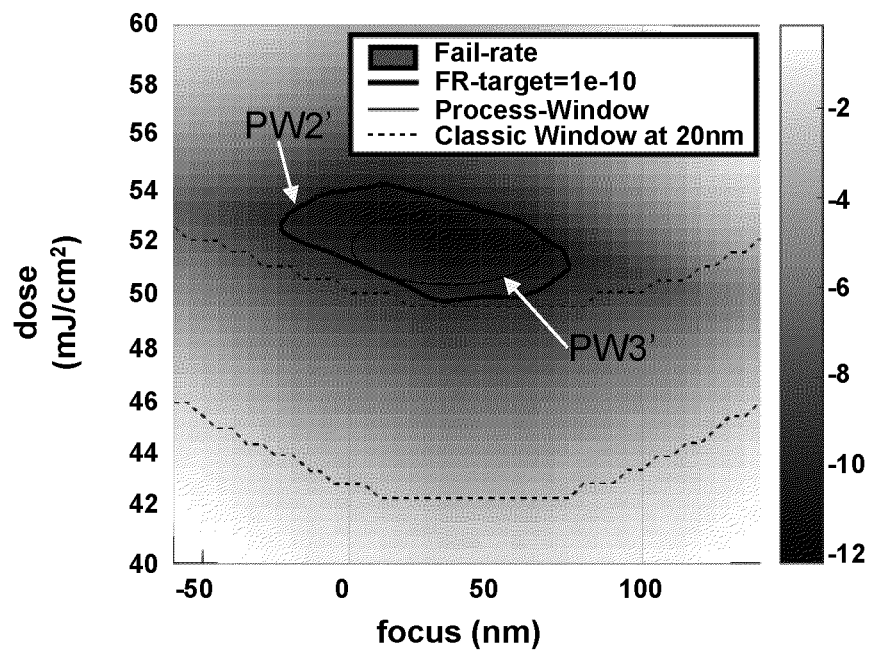
FIG. 14B illustrates an example a simulated process window obtained from a calibrate simulation process (e.g., of FIG. 11), according to an embodiment.

FIGS. 14A and 14B shows an exemplary method to determine a calibrated simulation process according to an embodiment of the present disclosure. FIG. 14A illustrates an exemplary DB-PW (see PCT application number PCT/EP2018/085159 for more details) based on experimental data obtained from a printed substrate and inspection data of the printed substrate. Referring to FIG. 14A, the failure rates can be determined by executing (e.g., on a processor of a computer hardware system 100) a failure rate model (e.g., P1101) for every process condition. Further, based on a given desired failure rate or an acceptable failure rate, an acceptable process window PW2 (dotted) can be determined. Further, an ellipse-fit (or any other kind of suitable fit) may be performed on the acceptable process window PW2 to determine an elliptical process window PW3, e.g., having maximum exposure latitude.

In FIG. 14A, a process window cPW is a process window obtained based on conventional OPC simulation for 29 contacts having 20 nanometer average contact holes, the contour of PW2 is at a fixed failure rate or acceptable failure rate, and the contour of PW3 is an elliptical fit within the window PW2, where PW3 can be considered a maximum process window from a focus and CD perspective. It can be observed that the classical process window cPW is different from the DB-PW PW2/PW3. Based on the process window PW2/PW3, it can be determined that the best dose is about 53 mJ/cm$^2$, an optimal CD is about 22.5 nm, and the best focus position is −11 nanometers at the center of the window. This advantageously provides an experimental settings and the size of the process window which can be used can operate the patterning process so that the printed patterns will be within a certain failure rate.

FIG. 14B illustrates an example simulated process windows PW2' and PW3' generated using a calibrated simulation process, where the parameters of the simulation process are calibrated based on the DB-PW data (e.g., shown in FIG. 14A) according to an embodiment of the present disclosure. In the present example, the DB-PW data e.g., $CD_{lim}$ or PW2 guides the simulator as to what margins are available at the bottom and at the top of the resist. Accordingly, the parameters of the models used in the simulation process are modified to match the experimental results. In the present example, the adjusted simulation parameters are absorption/dilLB=5 um$^{-1}$, resist thickness $T_{resist}$=44 nm, $Z_{meas}$=15% of $T_{resist}$. In an embodiment, blur of AI, flare and other parameter may also be applied or modified so that the simulated process window e.g., PW3' aligns or closely matches the DB-PW e.g., PW3. Accordingly to the present disclosure, not only parameters related to the classical CD-Bossung (e.g., $\sigma_{blur}$ of the resist, flare, SEM-offsets, etc.) can be fitted, but also parameters associated with the "CD-limits," e.g., which are characterized by CDs at different heights of the resist-profile of a pattern obtained from simulation.

According to the present disclosure, there are several advantages of a calibrated simulation process. In an embodiment, a local CD response can also be calibrated so that the CD variation that is measured can be related with simulated CD variation related to e.g., dose sensitivity. Additionally, the calibration can be extended to include CD variations of the mask causing CD variations in the resist. In another example, simulations can also be performed to determine how the process window varies when the dose is increased, the resist or the sensitivity of a resist increased. Also, simulations can be performed to study what happens if CD bias at a mask level is changed.

Additional dose may improve the process window but can change the target CD and best focus. For example, as the dose is adjusted, the local CD uniformity decreases, a CD-target bias reduces, and the CD window grows. However, an increase in dose can also increase the depth of focus (DoF), which may be undesired. From productivity perspective, it may be desired to keep the dose down as much as possible, but from a performance perspective (e.g., increased PW), a higher dose may be desired. As such, based on the changes in the several parameters (dose, CD-window, LCDU@BEBF, BF, DoF), a dose value in-between solution may be selected.

In another example, in table 2, a mask-bias may be adjusted causing a target CD-bias to increase. For instance, an optimum CD window may be obtained at a 20% mask bias. Also, at 20% mask-bias, LCDU at the best focus changes and the DoF accordingly as well.

In some embodiments, the exposure latitude is a dose range and DoF is the range the window (e.g., PW2 in FIG. 14A). In an embodiment, the exposure latitude can be translated to CD-window, e.g., CD at an upper dose minus the CD of the lower dose.

In another example, resist parameters can be adjusted to determine optimum resist thicknesses at a given absorption rate for different resist materials (e.g., CAR resist vs non-CAR resist).

In an embodiment, if behavior of the resist can be modeled, e.g., how photon absorption or how the local variation CD variation depends on the thickness of the resist, a resist thickness can be varied to determine an optimum process window. It can be understood aforementioned resist parameters are presented as example and does not limit the scope of the present disclosure. In an embodiment, additional relationships between resist parameters can be determined experimentally and calibrate the simulation process based on resist related measurements.

In an embodiment, there may be several factors that determine a DoF. For example, a classical CD-window determined using Bossung curve, local CDU degradation and the actual resist profiles and impact on CD margins. Such behaviors can also be simulated using embodiments of the present disclosure.

Figure 14C:
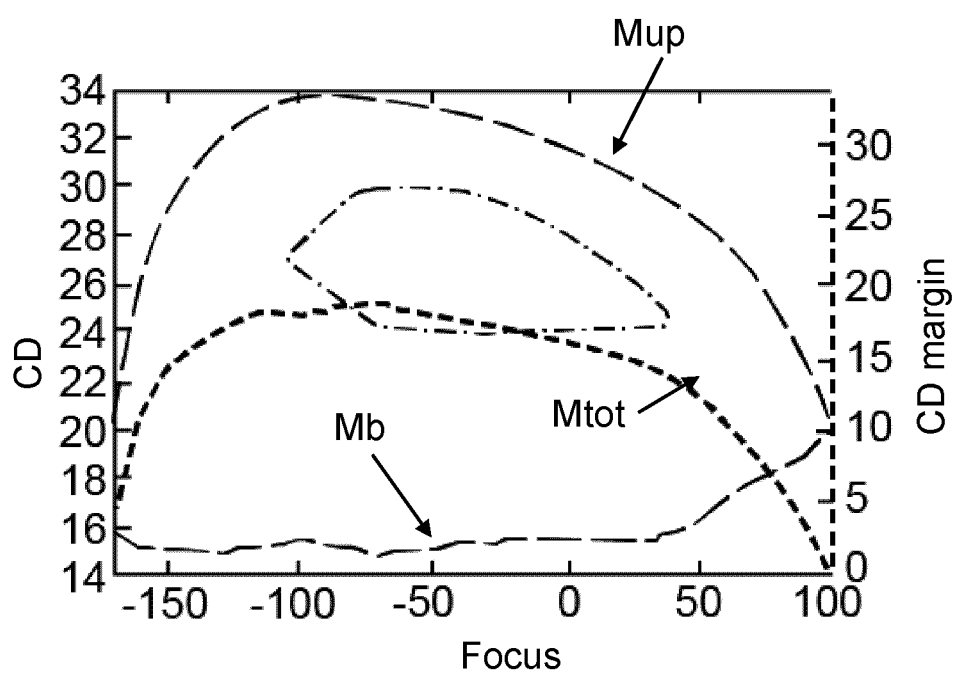
FIG. 14C shows example CD-margins available at different locations on a resist, according to an embodiment.

FIG. 14C illustrates an example simulation to show how change in DoF affect CD margins which creates a non-obvious process window. FIG. 14C illustrates margins available at different DoF, the curve Mup indicates an upper margin associated with a top resist CD, a curve Mb indicates an inner margin associated with a bottom resist CD, and a curve Mtot indicates a total margin that is expected to have as a function of focus. The curves indicate that the DoF affects the resist profiles quite dramatically indicative of less CD margin are available at the bottom or at the top of the resist profile when the DoF is too far from center (e.g., best focus or nominal focus).

Figure 15:
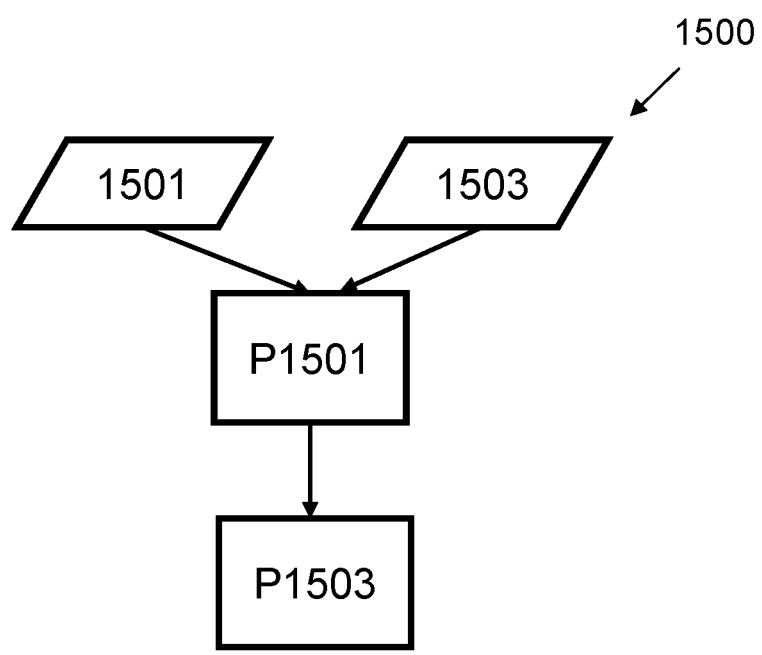
FIG. 15 is a flow chart of calibrating of a simulation process, similar to FIG. 11, according to an embodiment.

In an embodiment, the calibrating of a simulation process related to the patterning process can be implement as discussed with respect to FIG. 15. For example, the method 1500 includes procedures P1501 and P1503 discussed in detail as follows.

Procedure P1501 includes obtaining: (i) characteristic limits 1501 of a characteristic of a printed pattern based on a threshold failure rate of the printed pattern, and (ii) a reference process window 1503 based on the characteristic limits 1501.

In an embodiment, the characteristic model is determined by fitting parameters of the characteristic model based on the characteristic of the simulated pattern and the characteristic of the printed pattern.

In an embodiment, the obtaining (e.g., via a computer hardware system 100) of the characteristic limits 1501 of the characteristic of the printed pattern comprises: printing, via a lithographic apparatus, selected patterns of a target layout on a substrate; determining (e.g., via a computer hardware system 100), based on inspection data of the printed patterns, failure rates of each selected pattern; fitting, based on the failure rates and the characteristic of each selected pattern, a failure rate model configured to determine a failure rate associated with a characteristic of a pattern; and executing (e.g., on a processor of a computer hardware system 100) the failure rate model to determine the characteristic limits 1501 of the characteristic of the selected patterns such that the threshold failure rate is satisfied.

In an embodiment, in obtaining the characteristic limits 1501, not only the characteristic limits 1501 but also a behavior of the CD of the pattern and related higher order moments (e.g., variance, skew, kurtosis, etc.) may be calibrated. In an embodiment, calibrating e.g., variance and skewness helps to better match a characteristic model's prediction to the simulation data. Example of calibrating a CD distribution is discussed in detail in previously mentioned PCT application PCT/EP2018/085159. In an embodiment, the CD through dose/focus is calibrated by adjusting process variable including e.g. flare, resist-blur. The variance can be calibrated by the dose-sensitivity ("ILS") and/or MEEF simulations, e.g., as discussed herein. In an embodiment, higher-order moments can also be characterized over the window and fitted to match the prediction.

Procedure P1505 includes calibrating (e.g., via a computer hardware system 100) the simulation process such that a simulated process window is within an acceptable threshold of the reference process window 1503. In an embodiment, the simulated pattern comprises a profile of the pattern within a layer of a substrate. In an embodiment, the characteristic of the simulated pattern comprises a difference between a first characteristic at a top of the layer and a second characteristic at a bottom of the layer. In an embodiment, the simulation process comprises: a source mask optimization process and an optical proximity correction process that are configured to adjust mask parameters, source parameters, or process parameters to cause the printed pattern to be within an acceptable threshold of a target characteristic value.

In an embodiment, the obtaining of the reference process window 1503 includes determining (e.g., via a computer hardware system 100), based on inspection data associated with a printed substrate, values of dose and focus corresponding to the characteristic of each selected pattern that satisfy the characteristic limits 1501.

In an embodiment, the calibrating of the simulation process includes executing (e.g., on a processor of a computer hardware system 100), one or more process models, to determine the simulated pattern; and adjusting parameter values associated with the one or more process models until a characteristic of the simulated pattern satisfies the characteristic limits 1501. In an embodiment, the calibration includes determining (e.g., via a computer hardware system 100), based on the characteristic of the simulated pattern, the simulated process window and whether the simulated process window is within an acceptable threshold of the reference process window 1503.

In an embodiment, the one or more process models include a characteristic model, the characteristic model being fitted based on the simulated pattern and the characteristic limits 1501 associated with the printed pattern. In an embodiment, the characteristic model is determined by fitting parameters of the characteristic model based on the characteristic of the simulated pattern and the characteristic of the printed pattern.

In an embodiment, the parameters of the one or more process models may include a parameter of the characteristic model. For example, a mean, variance, skewness, etc. that explains the behavior of CD in a particular process e.g., ADI, or AEI.

In an embodiment, the parameters of the one or more process models may include an aerial image parameter associated with an aerial model associated with the patterning process.

In an embodiment, the parameters of the one or more process models may include a resist parameter associated with a resist model related to the patterning process. In an embodiment, the resist parameters include one or more of: a blur-related parameter of an aerial image, a resist thickness of the resist layer, an absorption amount related to a resist (material), a surface tension of the resist layer, stress and strain at the resist layer, or other resist related parameter included in the resist model or simulator. In an embodiment, an effect of such resist parameters on the CD may be linear or non-linear in nature.

In an embodiment, the parameters of the one or more process models may include an etch parameter associated with an etch model associated with the patterning process.

In an embodiment, the calibrating of the simulation process is an iterative process. One or more iterations includes executing (e.g., on a processor of a computer hardware system 100), the one or more process models using a selected pattern to be printed on a substrate, to determine the simulated pattern on the substrate; adjusting values of the parameters associated with the one or more process models such that the characteristic of the simulated pattern satisfy the characteristic limits 1501 associated with the selected pattern; and determining (e.g., via a computer hardware system 100), based on the characteristic of the simulated pattern, the simulated process window and whether the simulated process window is within an acceptable threshold of the reference process window 1503.

In an embodiment, the adjusting of the parameters of the one or more process models comprises adjusting values of parameters associated with the characteristic model such that a margin between the characteristic of the simulated pattern at a top and at a bottom is maximized with respect to the characteristic limits 1501.

In an embodiment, the method 1500 further includes obtaining a set of hot spot patterns, each hot spot pattern being a user-selected pattern from a target layout and/or a pattern associated with relatively high probability of failure compared to other patterns of the target layout; determining, by simulating (e.g., via a computer hardware system 100) the calibrated simulation process using the set of hot spot patterns and the failure rate model, a defect-based process window for each hot spot pattern; and determining, based on overlapping of each defect-based process window, optimal values of one or more process variables associated with the threshold failure rate.

As mentioned earlier with respect to equation 4, a total failure can be computed as $(1-FR_{final})=\Pi_i(1-FR_{feature-i})^{Ni}$, where $FR_{feature}$ depends on the process-parameters (e.g. dose/focus).

In an embodiment, the one or more process variable is selected from: a best focus, a best dose, a dose-focus window characterized by the threshold failure rate, aberrations (e.g., that are selectable/tunable on scanners), MSD, OVL (e.g., in case of an "EPE" setting affected by CDs of pattern on two separate layers.

In an embodiment, the method 1500 further includes determining (e.g., via a computer hardware system 100), based on the failure rate model, a yield associated with each hot spot pattern; and determining a total yield of a full chip layout by computing a product of each yield associated with each hot spot pattern across the full chip layout.

In an embodiment, the method 1500 further includes determining, by simulating the calibrated simulation process, whether a margin is available to adjust the characteristic of a retargeted pattern to cause a target characteristic value to be printed on a substrate; and responsive to the margin not being available, determining, via simulating the calibrated simulation process using the retargeted pattern, adjustments to a process associated with the patterning process such that the target characteristic value will be printed on the substrate.

In an embodiment, adjustments to the process comprises: adjusting (e.g., via a computer hardware system 100) values of one or more of an etch bias at an after development image, including an isotropic etch-back or a spacer process, an amount of process-loading. In an embodiment, the amount of process-loading can be a function of an etch rate and/or deposition rate that are determined by plasma-density, re-deposition rate or by adjusting partial pressures of gases used. In an example, the loading can be modeled by an etch-rate or deposition rate that depends on an open-frame within a Gaussian radius.

In an embodiment, the method 1500 further includes simulating the calibrated simulation process using a full chip layout to determine a residual error between simulated characteristic values and target characteristic values associated with the full chip layout; determining, via lithography manufacturing check, whether the simulated characteristic values associated with the full chip layout satisfy a desired yield; and responsive to the desired yield not satisfied, adjusting, via the calibrated simulation process, source parameters, mask parameters, or process parameters to reduce the residual error such that the desired yield is satisfied.

Once the simulation process is calibrated according to the DB-PW experiment data, as discussed with respect to FIGS. 11 and 15 above, the calibrated simulation process can be used to perform called defected-based source mask optimization including e.g., retargeting. In an embodiment, retargeting refers to generating an updated pattern based on biasing a target pattern. In the present embodiment, the retargeting can be by biasing of a characteristic (e.g., target CD) based on CD-limits obtained from a failure rate model and a CD distribution model. In an embodiment, the CD distribution model can be determined as discussed herein or in PCT/EP2018/085159, which is incorporated herein in its entirety. The CD distribution model determined according to the present disclosure can provide more accurate predictions of CD for particular dose and/or mask biases, as will be discussed later in the present disclosure.

Figure 18:
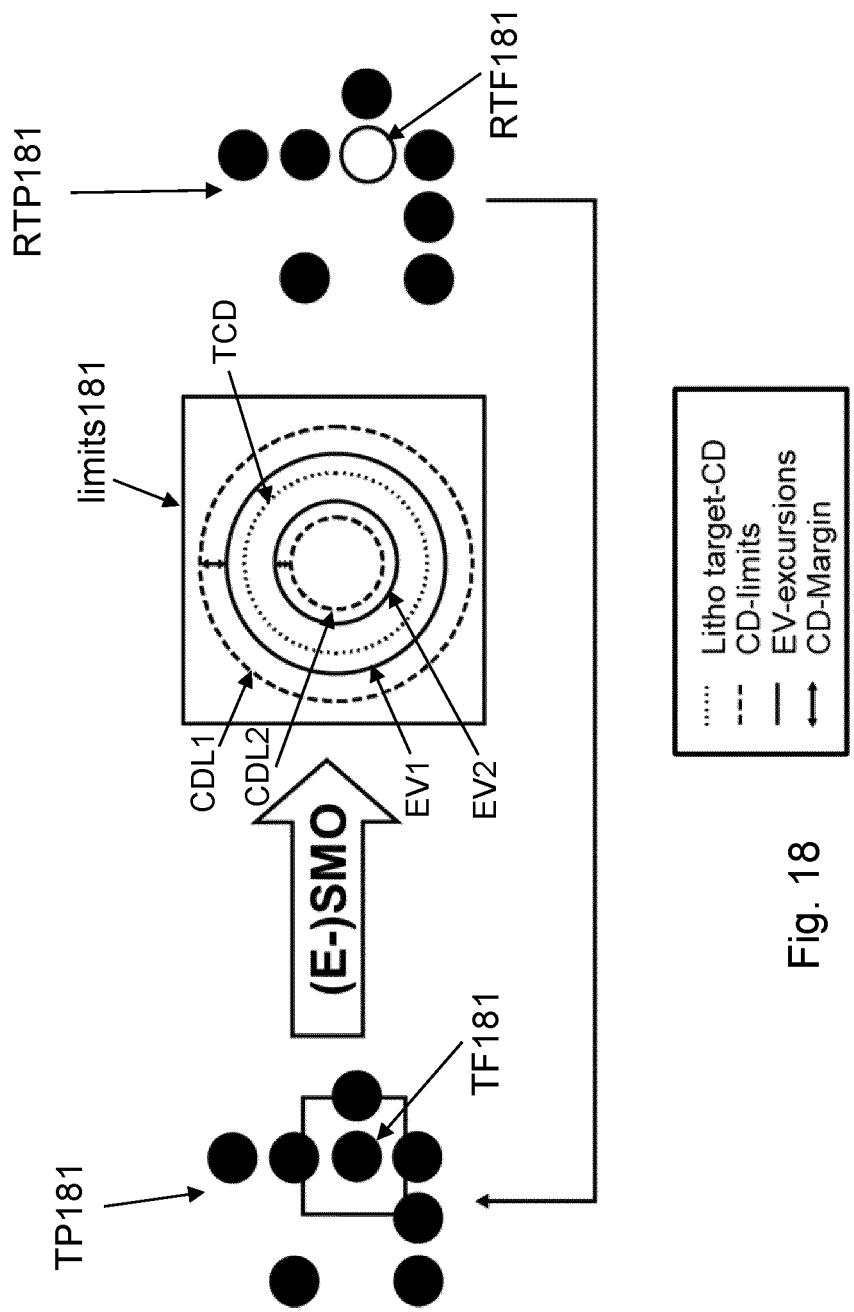
FIG. 18 is a block diagram of an example retargeting process, according to an embodiment.

FIG. 18 illustrates an example of dynamic retargeting according to the present disclosure. In an embodiment, the DB-PW data is employed in conjunction with a Source-Mask Optimization process. For example, within SMO, ±dose, ±mask bias and ΔBF (i.e., change in best focus) to balance CD margins. For example, CD margins determined with respect to CD limits obtained according to the DB-PW experiment (e.g., as in the procedure P1101). Also, within SMO, dynamic retargeting can be applied to features of a target pattern if CD limits are available.

The dynamic retargeting starts with an initial target pattern TP181, also referred as an initial target clip TP181 or clips having a target pattern. The retargeting of the target pattern TP181 is based on the excursions in a characteristic of the target pattern (e.g., CD excursions) that are expected. In an embodiment, for a given failure rate, one can estimate how much dose and mask excursion is on the CD. Example dose and mask based equation to determine excursions are discussed herein.

In the present example, the initial target pattern TP181 includes a plurality of contact holes arranged as shown. Characteristic limit data L181 (as illustrated) is employed to determine a retargeted pattern. In an example, the characteristic limits L181 are CD limits L181 determined based on the DB-PW experiment. In an example, a feature TF181 of the initial target pattern TP181 is retargeted based on the CD-limits L181.

The characteristic limit data L181 includes an upper CD-limit CDL1 and a lower CD-limit CDL2 determined by the DB-PW experiment. Also, shown overlaid on the CD-limit data L181 is nominal or target-CD TCD. Also shown are evaluated CD excursions EV1 and EV2 for the contact hole at a given failure rate. Examples of evaluating CD excursions are discussed with respect to FIGS. 20 and 21. Also shown are example CD margins computed as a difference between the CD excursions and CD-limits. In an embodiment, the CD excursions EV1 and EV2 are CD values computed at e.g., 3 standard deviation from nominal CD or target CD at a given failure rate. These extreme value excursions can simulated using the calibrated simulation process discussed with respect to e.g., FIGS. 11 and 15.

The limits in box L181 also shows that relative more margin is available on an upper side (e.g., CDL1-EV1) than on a lower side (e.g., CDL2-EV2). These margins indicate that a feature size of the target pattern TP181 can be increased, rather than decreasing the feature size. Hence, as shown, a retargeted pattern RTP181 may be generated to include a retargeted feature RTF181 which has a larger CD compared to the target CD shown in TF181.

In an embodiment, the above steps may be repeated to generate a final retargeted pattern or a retargeted clip. Furthermore, in an embodiment, for the retargeted clip, a source may also be optimized.

Thus, the retargeting process in FIG. 18 can predict how many features are at the CD limits, which features are out of the limits. Also, if number of occurrences of a feature in a target layout are given, then statistical analysis can be performed to determine which feature could be kept and which features could be removed. For example, a feature #1 has a failure rate of $10^{-10}$, and a feature #2 has a fail-rate of $10^{-6}$ and if number of feature #2 type are much greater than feature #1, then based on the margins it can be determined whether to allow the target size of the feature #2 or be retargeted. In another example, if there is no margin left to retarget a feature, then a change in a process may be recommended. Example process changes includes changes in resist parameters, etching parameters etc. as discussed with respect to FIGS. 16 and 17.

Figure 19:
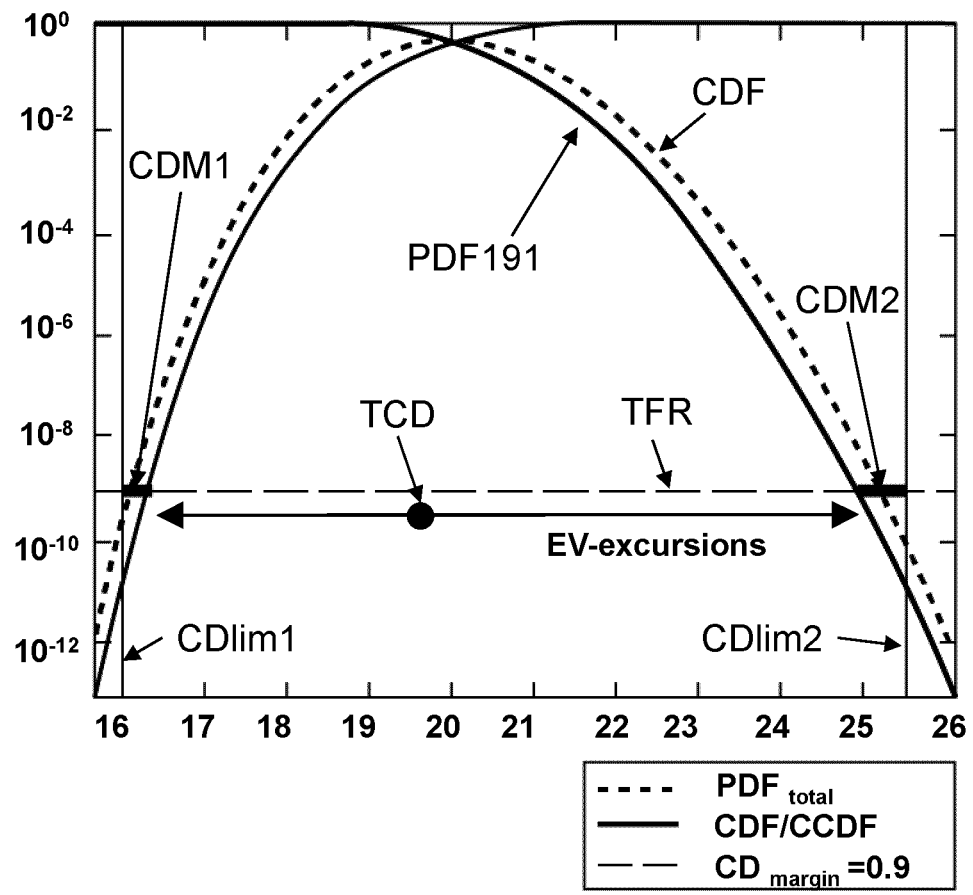
FIG. 19 illustrates example determining a margin to be employed in the retargeting process of FIG. 18.
Figure 20A:
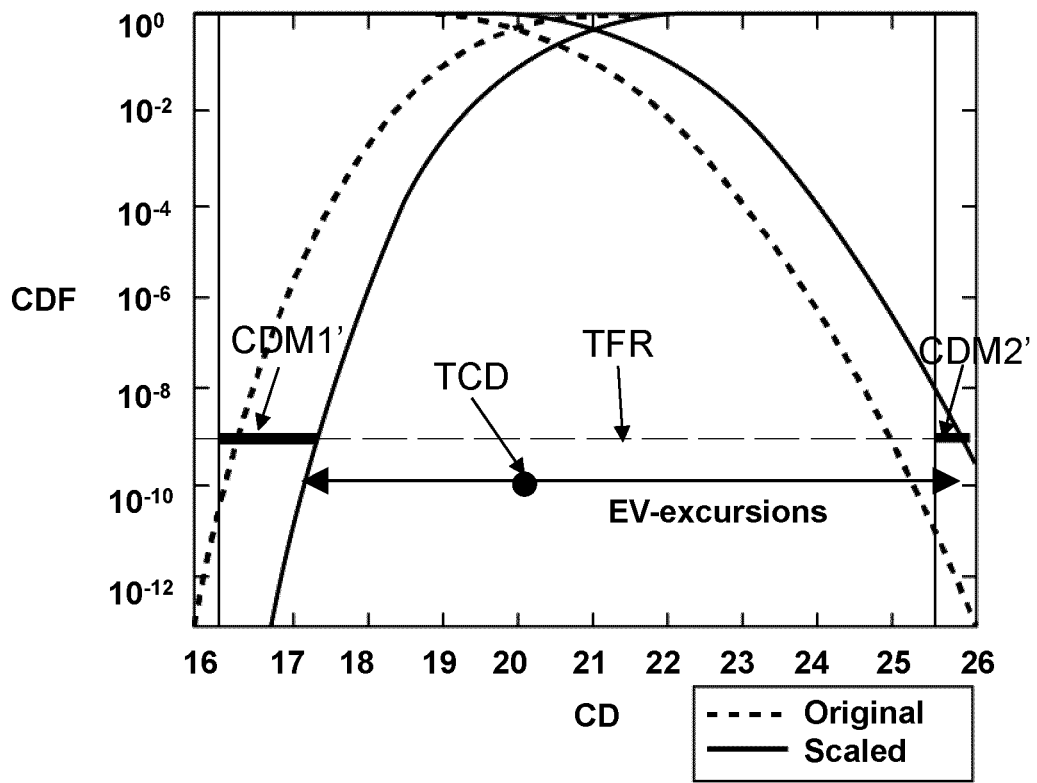
FIG. 20A and FIG. 20B illustrate example behavior of a margin caused due to dose variations, according to an embodiment.
Figure 20B:
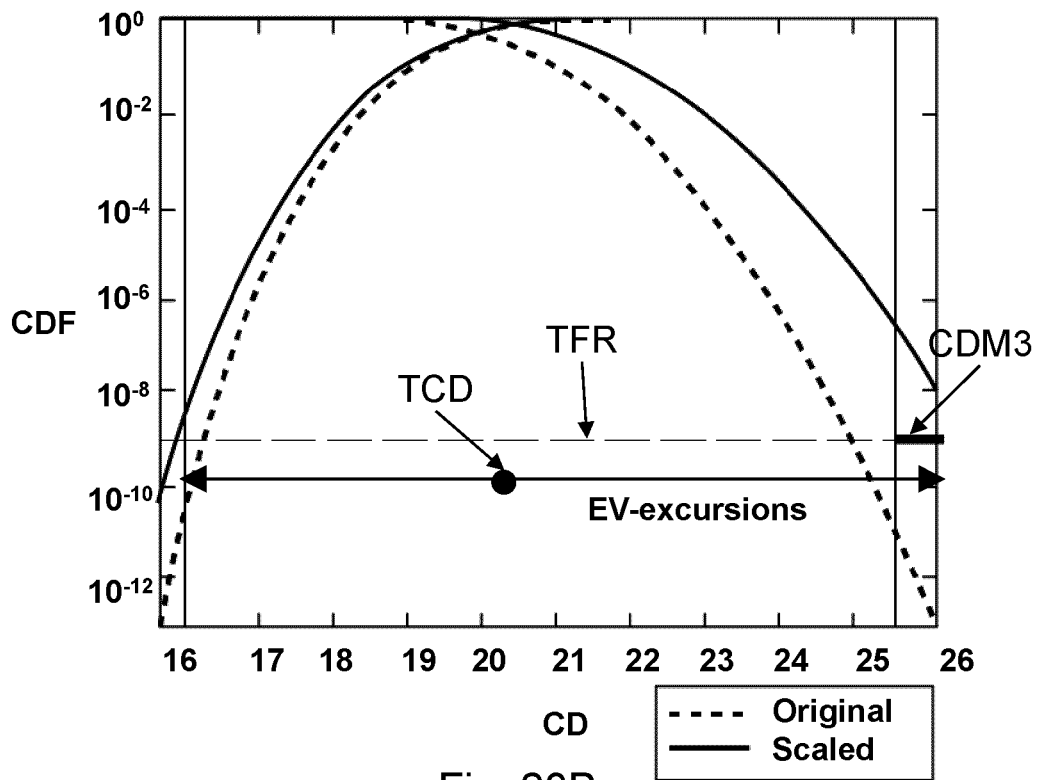

FIG. 19 illustrate example CD excursions and CD margins associated with a characteristic limits (e.g., CD-limits) of a pattern according to an embodiment of the present disclosure. FIGS. 20A and 20B illustrate examples of how the CD-margin and extreme value (EV) excursions of CD behave under different process conditions (e.g., dose, focus, mask bias, etc.) according to an embodiment of the present disclosure.

In FIG. 19, an example probability distribution function PDF191 is a modeled CD distribution based on failure rate data to compute a failure probability of a particular CD. In an embodiment, the CD distribution PDF191 can be determined based on dose and mask variations, and an adjustment model discussed later in the present disclosure.

Integrating over the CD distribution PDF191, a cumulative density function CDF can be computed. In the present example, the left CDF can be computed by integrating PDF191 over the CDs (x-axis) from left to right. Similarly the right CDF can be computed by integrating PDF191 over the CDs (x-axis) from right to left.

In an embodiment, CD-limits can be determined based on the failure rate data of a printed substrate (e.g., see procedure P1101). In an embodiment, patterns having CD values below the CD-limits are considered as failed patterns. In an embodiment, to improve the yield of the patterning process, an acceptable failure rate TFR (also referred as a threshold failure rate) may be specified. The acceptable failure rate or the threshold failure rate may be higher than an actual failure rate of a pattern. Then, retargeting or process adjustments can be performed with respect to this threshold failure rate TFR.

In an embodiment, EV-excursions refer to values of a characteristic or process variables determined at an edge of a defect-based process window. For example, EV-excursion in CD can be a CD deviation with respect to a nominal CD or target CD TCD, where the CD deviation is determined at extreme dose values and/or extreme focus values of the DB-PW. In an embodiment, EV-excursions can be determined based on 3 standard deviation of a modeled CD distribution. In an embodiment, the dynamic retargeting process (e.g., FIG. 18) is iteratively modifies the CD values of a feature to minimize the CD EV-excursions or improve the CD-margin (maximize, in an embodiment). In an embodiment, minimizing EV-excursions causes CD-margins to be maximized on both sides, as illustrated in FIG. 19. In an embodiment, a calibrated SMO including dose excursion and/or mask excursion equation, discussed herein, can be used to minimize the EV-excursions by varying the dose and/or mask biases.

In an embodiment, depending on a shape of the CD distribution or CDF, relatively more CD-margins (nm) may be available on one side than on the other side. For example, CD distribution with a relatively longer tail may have less CD-margin at the tail.

FIG. 20A shows an example of what happens if the CD distribution PDF191 or the corresponding CDF shifts to the right. As shown, the CD-margin CDM1' at the left side increases, but CDM2' becomes negative at the right side. Hence, a shift in CDF may cause the EV-excursions in CD to exceed the CD limits and the larger features may not satisfy the target failure rate criteria. In other words, no margin is available to increase the size of a retargeted CD and that the retargeted CD will likely cause a failure of the pattern. In an embodiment, both CD margins may become negative, which is undesirable. FIG. 20B shows an example in which a CD-margin CDM3 is negative and left CD-margin is zero, which is also undesirable.

From source mask optimization perspective, the EV-excursions may be related to a dose setting that belongs to the target failure rate. In other words, the dose setting at the target failure may be causing the tail in PDF or shift in CDFs. So, according to the present disclosure, the source mask optimizer may be configured to track the CD-margin, by looking at particular dose values that belongs to the target failure rate TFR. Hence, CD-margins or EV-excursions can be tracked by tracking the dose.

In an embodiment, only source may be optimized and the dose at a particular target rate can be tracked using the following dose excursion equation:

$$dose_{EV} = \frac{LCDU_{dose}3\sigma}{NDS} \cdot CDF^{-1}(1 - FR_{target})/3 \quad (5)$$

In equation (5) above, $dose_{EV}$ represents a dose value at the target failure rate or the desired failure rate $FR_{target}$ (i.e., TFR) and at an extreme value excursion associated with the characteristic value at 3 standard deviations from an average characteristic value, NDS is the dose sensitivity of the characteristic of a pattern, $LCDU_{dose}$ 3σ represents a variation associated with the characteristic value at 3 standard deviations from an average characteristic value and at a particular dose, and CDF represents a cumulative distribution function of the PDF of the characteristic. In one embodiment, a dose range can be determined which tracks the CD margin whether it is positive or negative at the target failure rate. In one embodiment, focus control can be minimize by tracking the dose range.

In an embodiment, both source and mask may be optimized and excursions in CD may be caused by both dose and a mask parameter (e.g., mask bias). In this case, a combination of mask CD variations and dose CD variations can be accounted for. For example, the dose at a particular target rate TFR can be tracked using a dose excursion equation (6) given below. Also, a mask parameter (e.g., mask bias) at a particular target rate TFR can tracked using the following mask bias excursion equation (7) described below.

In an Embodiment, the Dose Excursion Equation is Given by:

$$dose_{EV} = \frac{LCDU_{dose}}{LCDU_{total}} \cdot \frac{LCDU_{dose}3\sigma}{NDS} \cdot CDF^{-1}(1 - FR_{target})/3^2 \quad (6)$$

In equation (6) above, $dose_{EV}$ represents a dose value at the target failure rate or the threshold failure rate $FR_{target}$ TFR) and at an extreme value excursion associated with the characteristic value at 3 standard deviations from an average characteristic value, NDS is the dose sensitivity of the characteristic of a pattern, $LCDU_{dose}$ represents a variation in the characteristic at a particular dose, $LCDU_{total}$ represents a total variation in the characteristic of the pattern, $LCDU_{dose}$ 3σ represents a variation associated with the characteristic value at 3 standard deviations from an average characteristic value and at a particular dose, and CDF represents a cumulative distribution function of the PDF of the characteristic.

In an Embodiment, the Mask Bias Excursion Equation is Given by:

$$mask_{EV} = \frac{LCDU_{mask@W}}{LCDU_{total}} \cdot LCDU_{mask@W} \cdot CDF^{-1}(1 - FR_{target})/3^2 \quad (7)$$

In equation (7) above, $mask_{EV}$ represents a mask bias at the threshold failure rate $FR_{target}$ and at an extreme value excursion associated with the characteristic value at 3 standard deviations from an average characteristic value, $LCDU_{mask@W}$ is variation in the characteristic at associated with a resist pattern caused by the mask bias, $LCDU_{total}$ represents a total variation in the characteristic of the pattern, and CDF represents a cumulative distribution function of the PDF of the characteristic.

In an embodiment, the equation 5, 6, and/or 7 are inserted or used in conjunction with SMO process to get the maximum CD margins or minimize the excursions.

Figure 21:
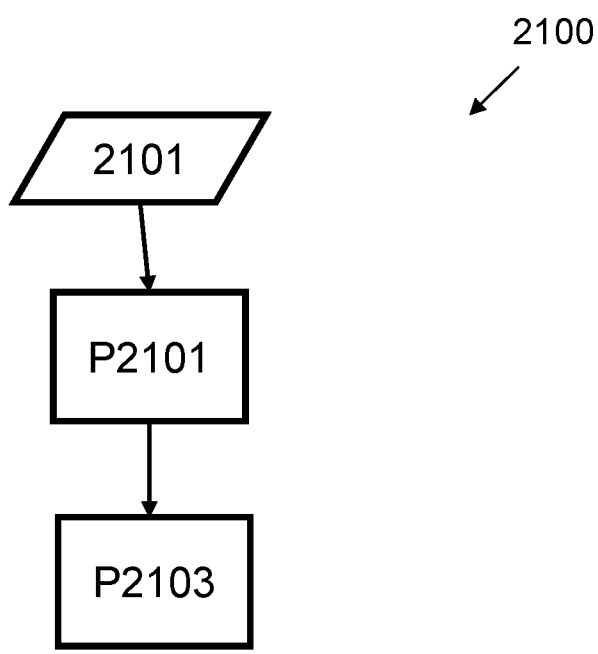
FIG. 21 is a flow chart of a method for generating a retargeted pattern associated with a patterning process, according to an embodiment.

FIG. 21 is a flow chart of a method 2100 for generating a retargeted pattern associated with a patterning process. For example, the method 2100 includes procedures P2101 and P2103 discussed in detail as follows.

Procedure P2101 includes obtaining (i) target values of a characteristic associated with a target pattern to be printed on a substrate, (ii) characteristic limits 2101 associated with the target pattern, the characteristic limits 2101 being values of the characteristic beyond which a printed pattern corresponding to the target pattern is considered as defective, and (iii) a source mask optimization (SMO) process configured to compute dose and/or mask parameters based on a threshold failure rate associated with the characteristic of the target pattern.

In an embodiment, as discussed herein, the characteristic limits 2101 is obtained based on a failure rate model, the failure rate model being calibrated using failure rate data associated with the printed pattern on a substrate and the threshold failure rate, the printing being performed using the initial SMO data.

Procedure P2103 includes generating, by simulating the source mask optimization process using the target pattern, the retargeted pattern such that the characteristic of the retargeted pattern falls further within the characteristic limits associated with the target pattern. In embodiment, the determining whether the characteristic of the retargeting pattern is further within the limits is based on margins associated with the characteristic limits 2101 at the threshold failure rate. In an embodiment, such margins are increased or in an embodiment, maximized. The generating of the retargeted pattern comprises: simulating, using an initial SMO data, the source mask optimization process to determine excursions in a characteristic associated with the target pattern at the threshold failure rate; determining (e.g., via a computer hardware system 100) the margins between the characteristic limits 2101 and the excursions at the threshold failure rate; and adjusting a characteristic value of the target pattern such that the margins are increased without exceeding the characteristic limits 2101 associated with the target pattern, the adjusted characteristic value being used to generate the retargeted pattern.

In an embodiment, the obtaining of the source mask optimization (SMO) process comprises: including a dose excursion equation to compute dose based on a probability density function (PDF) of a characteristic, local critical dimension uniformity, dose sensitivity of the characteristic of a pattern, and the threshold failure rate; and/or including a mask equation to compute a mask characteristic based on a probability density function of a characteristic (PDF), local CD uniformity caused by a mask bias and the threshold failure rate.

In an embodiment, the dose excursion equation is given by equation (5) or (6) discussed herein, and the mask equation is given by equation (7), discussed herein. In an embodiment, the extreme value excursions may be global excursions. These excursions can be implemented in a cost function or merit function used in the SMO process.

In an embodiment, the determining (e.g., via a computer hardware system 100) of the retargeted pattern is an iterative process, an iteration comprising: simulating the source mask optimization process, using the initial SMO data including an optimized source, and optimized mask parameters, and an initial target pattern or a retargeted pattern as input, to determine excursions in a characteristic associated with the target pattern at the threshold failure rate; determining the margins between the characteristic limits 2101 and the excursions of the characteristic at the threshold failure rate; and adjusting a characteristic value of the target pattern such that the margins are increased without exceeding the characteristic limits 2101 associated with the target pattern, the adjusted characteristic value being used to generate the retargeted pattern.

In an embodiment, a margin between the characteristic limit of the characteristics and an extreme value of the characteristic is maximized, the extreme value of the characteristic being a value caused by contributors from one or more process variables the desired failure rate, e.g., statistically globally (e.g., data related to entire target layout as opposed to a clip of the target layout) varying process variables.

In an embodiment, the extreme value of the characteristic is caused by focus, dose or global dose, a moving standard deviation (MSD) of the error between the measured value and a target value, a resist-thickness, and/or resist constituents including acids or quencher.

In an embodiment, the method 2100 further includes simulating the source mask optimization (SMO) process using the retargeted pattern to determine simulated characteristic values associated with a full chip layout; determining, via lithography manufacturing check, whether the simulated characteristic values associated with the full chip layout satisfy a desired yield; and responsive to the desired yield not satisfied, adjusting source parameters, mask parameters, or process parameters such that the desired yield is satisfied, the adjusted source parameters, mask parameters, or process parameters being used to generate an optimized source, an optimized illumination pupil, and/or an optimized mask.

The methods discussed above have several advantages. One of the advantage is process adjustment may be performed based on the CD margins available. An example application of using an SMO or a calibrated SMO simulation process and the dynamic retargeting based on CD-margins or EV-excursions to determine process adjustments is further discussed in detail below. The process adjustments are performed by taking into account characteristics of an etch process, a deposition process, or other after development processes used to manufacture a final pattern (or structure) on the substrate.

A conventional SMO takes into account a lithographic design target (e.g., ADI target) and a particular set of rules accounting for the lithio-etch-bias. The biasing rule may be desired for following reasons. First, an etch process introduces a proximity effect. This can be mitigated in a final OPC step, but taking it into account early on in the SMO leads to different results. Second, a translation from ADI to AEI of CD and pattern placement errors (PPE) or edge placement errors (EPE) is very different. Typically CD errors reduce by a factor of two (e.g., 2 times) after etch, but the PPE or EPE do not. As a result a suboptimal pupil may be obtained by the convention SMO process. Third, the etch process can induce a significant focus shift between features due to differences in resist profiles. This focus shift cannot be repaired by the final OPC step.

According to the present disclosure, a pattern transfer or etch-aware SMO is described that takes into account characteristics of the etch process. In particular: (i) etch proximity effects (e.g., feature-feature, 2D shapes, CD vs pitch). These are typically only CD related; (ii) the translation of CD and pattern placement errors from ADI to AEI, by giving each a different weight. In practice, SMO optimizes the edge position ADI which is a combination of the CD and placement error. So now the edge position AEI are predicted and used for the optimization; (iii) etch induced focus shifts. In order for the SMO to include this in the optimization, the resist profiles are calculated and a simple etch model is used. For example, to obtain the resist profiles, the edge positions are calculated at multiple resist thresholds. The etch model can then calculate how this resist profile translate into CD AEI; and (iv) include an expected LCDU reduction as function of the lithio-etch bias. This relation can be feature dependent. It may lead to a sub-optimal LCDU at ADI, but optimal LCDU at AEI.

Figure 16:
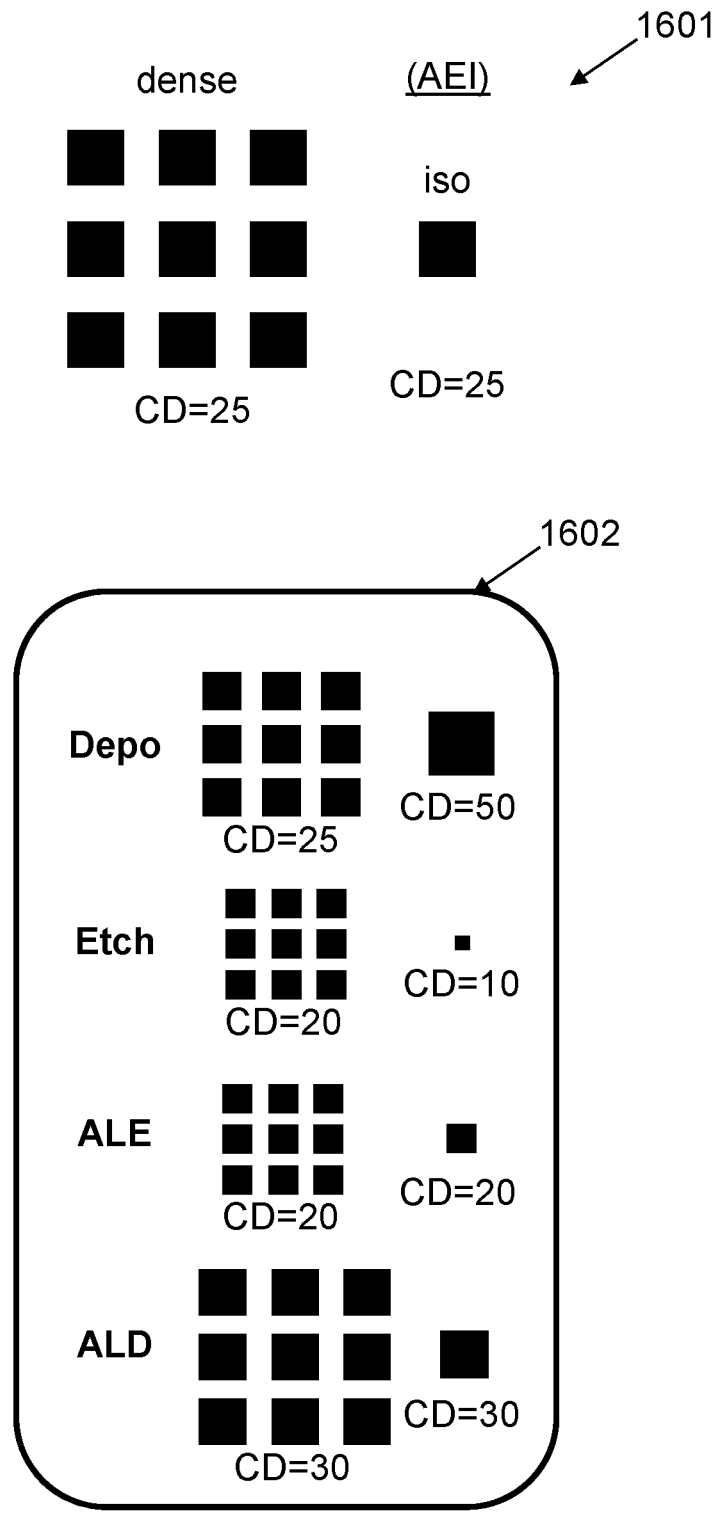
FIG. 16 illustrates example target pattern to be desired after etching, and results of example post-patterning process, according to an embodiment.
Figure 17:
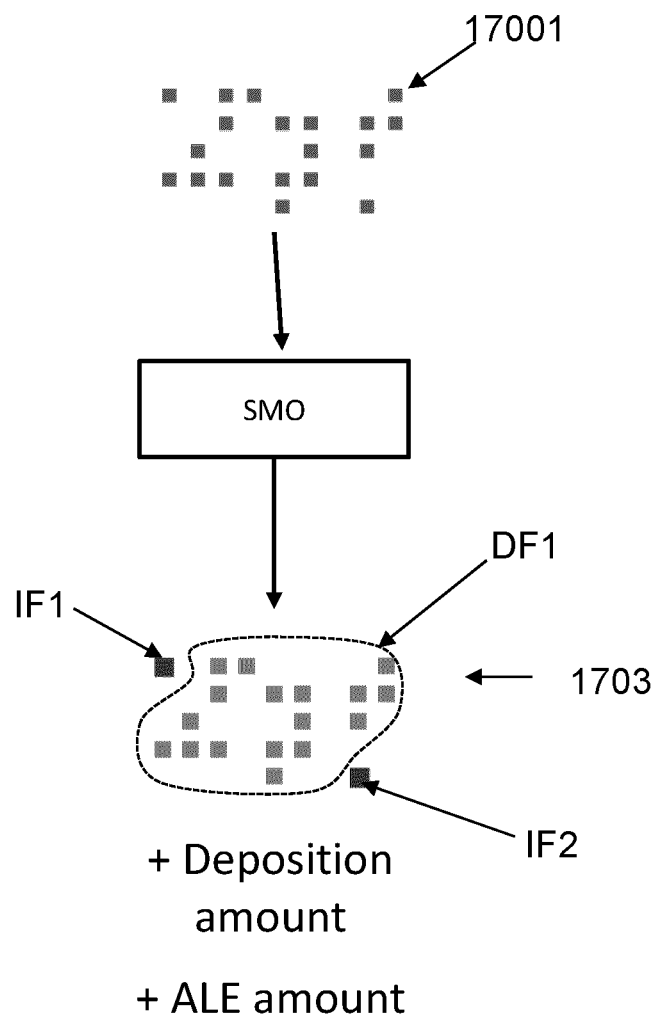
FIG. 17 illustrates an example retargeted pattern and associated process parameter values generated based on a target after etch pattern and calibrated SMO process, according to an embodiment.

FIG. 16 explains typical options available after development, so that the substrate includes an example target pattern 1601 (interchangeably referred as a target AEI herein). The target pattern 1601 includes a dense contact hole array (3×3) and an isolated contact hole, each contact hole desired to be of 25 nm size. In an example process, the target AEI 1601 can be achieved by performing one or more after development processing including deposition, etching, atomic layer etch (ALE), and atomic layer deposition (ALD).

In the present example, referring to processes in 1602, the deposition process causes less deposition on the dense array than on the isolated contact hole. Hence, the dense array CDs increase to 30 nm, while isolated contact hole increases to 50 nm, since a loading effect may be different for the dense array and isolated contact holes. Another option may be to perform an etch process after the deposition process. After etching process, the dense array CDs reduce to 20 nm while the isolated contact hole CDs reduce to 10 nm. Again, difference in CDs may be due to etch loading effects on the dense array and the isolated hole. In another option, ALD or ALE can be performed on to grow linearly or to etch linearly the dense array and the isolated hole. In other words, an amount material deposited (or an amount of etch material) for the isolated hole and the dense array is the same, thereby each CD in the pattern may be 30 nm (or 20 nm for ALE).

Typically, adjustments can be performed to either balance an amount of loading by doing etching and deposition at the same, or perform each processes in cycles. For example, first a regular deposition, a regular etch cycle, and then do ALE and/or ALD.

In the present disclosure, the SMO or the calibrated SMO can be modified to include a post-patterning model such as an etch model, a deposition model or other related models to determine etch pattern, deposition pattern and respective pattern's characteristic values (e.g., CD, PPE, EPE) by tuning etch parameters, or deposition parameters. In an embodiment, etch and/or the deposition process models can be fitted based on geometrical parameters of an etch pattern and deposition pattern. For example, the fitting can be based on experimental data including etched pattern data, deposition pattern data obtained from an etched substrate, and post-deposition.

As discussed earlier, according to an embodiment, the SMO simulation is configured to be defect-aware. For example, a check is performed to determine whether the simulated characteristic satisfies the CD-margins at the target failure rate. In an embodiment, by including the etch model, and/or deposition model in the SMO process, etch CDs, and/or deposition CDs may be checked against the CD margins available.

As discussed in FIG. 16, an existing etch process, deposition process, ALE, ALD, may result in etch CDs or post-deposition CDs of a pattern (e.g., dense pattern or isolated pattern) that are not within an acceptable limits (e.g., CD limits) which may result in exceeding the target failure rate. Hence, employing etch model, and/or deposition model and comparing results with characteristic limits associated with a threshold failure rate at the ADI, the defect-based process window can be improved further. For example, by adjusting etch or disposition parameters or biasing on isolated features differently than features in a dense array based on CD-margins available Referring to FIG. 17, a pattern transfer aware SMO is be further detailed as follows. An example target AEI pattern 1701 comprises a dense contact hole array and isolated holes. In an embodiment, the above discussed retargeting method using SMO supplemented with etch model, and deposition models is applied to generate an optimized retargeted pattern 1703 where the dense contact hole array DF1 have different biasing compared to isolated holes IF1 and IF2. The retargeted pattern 1703 can also be accompanied by a deposition amount and an ALE amount, for example In an embodiment, the CD-margins guide the biasing of the target AEI pattern 1701 and how much etching and deposition can be performed, thereby accounting for the LCDU associated with dense and isolated holes in a manner that the target failure rate specification is satisfied. In an embodiment, in conjunction with the SMO simulation, the etch parameters and the deposition parameters are adjusted to determine an amount etching and deposition that affect the final etch profiles and CDs associated therewith. Thus, the amount of etching and deposition is also performed with reference to the characteristic limits and CD-margins associated with the target failure rate.

In an embodiment, the characteristic limit may be expressed in terms for PPE (or EPE) associated with a pattern on the same layer or on two separate layers. For example, after deposition and etching cycles, the resulting etch profile of a line on a first layer may not be aligned with a contact hole on a second layer causing a PPE or EPE between etched patterns on the substrate. Such defect can impact the function of a chip due to lack of electrical connection between features. The PPE (or EPE) between patterns can be minimized as a function of etch parameters and deposition parameters. In an embodiment, characteristic limits can be PPE-margins (or EPE-margins) associated with a target failure rate. The PPE-margins (or EPE-margins) can also be determined similar to CD-limits discussed herein. For example, a characteristic PDF can be determined based on PPE or EPE measurements of a printed substrate and the failure rates related to PPE or EPE. In an embodiment, the CD-margins and/or EPE-margins, for example, guides the simulation process to determine by how much the local CD (e.g., dense holes CDs and isolated holes CD) can be varied to get a better edge placement based on the defect-based limits.

In an embodiment, if the simulation determines that after etch there is little bit too much or too little margin for CD adjustment but there is sufficient margin for CD adjustment at ADI, then it indicates there is more freedom to make process changes at the development stage or lithographic patterning step such that the after etch CDs are within desired range while satisfying the target failure rate specification. In another example, margins on an upper and lower sides (i.e., top or bottom) of an etch profile are dependent on aspect ratios at which pattern fails. Based on the top CD or bottom CDs of the etch profile, it may be that no margin is available whatsoever for a particular process after etch, but at ADI stage the retargeted pattern met the defect-based limits. So, the defect-based window serves as a guide indicating that a particular features was may be shrunken a little bit too aggressively at the ADI stage, so it may be recommended to make a process update or have to determine different mask pattern that provides a greater margin after etch.

In another example, after etch, a CD distribution (or CD-behavior) of features may be quite different from CD-behavior at ADI. In an embodiment, the after etch CDs can cause focus shifts associated with a lithographic apparatus. The reason being that the CDs (e.g., resist CDs) after development step may be more representative for different CD limits than CD limits associated with pattern transfer occurs. For example, a resist-CD at a bottom of the resist may determine what pattern is transferring to the substrate, but a CD may be more sensitive to the behavior of the feature at the top of the resist.

According to the present disclosure, a defect-based window after etch and after development, can not only guide the simulator to what etch bias is appropriate, but also simulate a resist profile through a stack of layers of the substrate. In an example, features that kiss or contact each other, may be more sensitive to CD-behavior at the top of the resist. In another example, features that merges or that closes could be more sensitive to CD-behavior at the bottom of the resist. Based on the through stack resist-profile, the simulator can determine a top CD and a bottom CD. For example, as discussed earlier, using the simulated resist profile, a model can be fitted to CD limit using a difference between the top CD and the bottom CD. Hence, after etch CD behavior at a top and at the bottom can also be evaluated using the etch model and the CD-limit based model. Accordingly, adjustments to the etch processes can be determined so that top-CD and bottom-CD related margins are within the acceptable failure rate limits.

In an embodiment, the etch process model and/or the deposition process model can be configured to determine etch parameter or deposition parameter such as an etch rate or a deposition rate is sensitive to an angle of incidence of etching or deposition. As these rates are sensitive to the angle of incidence, the simulator can determine, for example, at 45 degree angle of incidence, the rates may be very sensitive, indicating the process deposits or etches very strongly compared to other angle of incidences.

Hence, as discussed above, if the limits associated with an after etch process are available, then such limits can also be included in the SMO simulation process to determine optimized source, optimized mask, and/or process adjustment.

The methods of the present disclosure have several advantages. The methods suggest manufacturing only a single mask and performing DB-PW experiment and subsequently calibrating of a simulation process associated with a patterning process or a semiconductor manufacturing process. The calibrated simulation process allows prediction of whether sufficient yield for a selected semiconductor manufacturing process can be achieved. Also, feedback can be received on what designs are feasible (or not) and the associated target CD's. It allows for very fast process cycles and calibration associated with the simulator. The DB-PW based experiment can ultimately fit in approximately 8 hours, which is usually desired by a user. On the other hand, as shown in FIG. 10, conventional simulation process such determination requires several cycles, each cycle requires manufacturing of a mask and defect inspection before retargeting can be done.

The dynamic retargeting ensures that illumination pupils are optimized with optimal target-CD's while taking product yield into account. As such, an improved SMO solution is expected, for example, improved CD control as well as better exposure latitude. Also, the dynamic retargeting includes appropriate excursions (at the threshold failure rate) so implicitly in source mask optimization one can vary dose and/or focus to find your optimum dose and focus. In an embodiment, the outcome of the DB-PW on actually measured dose/mask variance that are observed can be used to set practical range limits on dose, focus, and/or mask bias by monitoring related extreme-value excursions in CD at a given target failure rate. Tracking the EV-excursions leads to significantly different SMO solution. For example, EUV usually needs to be optimized for ±30% dose excursions to minimize, or at least account for, skewed tails. The methods described herein allows to determine the relevant excursions per feature-type.

In an embodiment, there may be situations where a trade-off between a hard limit (e.g., impacting defect and product yield) and a soft-limit (e.g., impacting efficient functioning of the chip, also referred as parametric yield) must be analyzed. For example, the hard limits can be CD-limits based on the DB-PW, and the soft limits can be user defined CD's that will impact the parametric yield of the device. For example, such soft limits may be CD values that may cause thermal problems, or electrical problems during function of the device (e.g., a printed substrate in a device). In other words, the soft limit need not be related to failure of a device but it could be problematic if exceeded. In this case, the dynamic retargeting allows to choose the maximum or minimum nominal-CD that still provides the desired yield while simultaneously optimizing a performance or parametric yield of a device. So, for example, if certain CD-margin is available or retargeted pattern is within the margin, it might also allow to upsize a feature (e.g., a contact hole) because that will result in a better device performance. In an embodiment, the soft limit can be a feature area (e.g., contact hole area), it could contact area between two layers, or even in one layer of the substrate used in the device. Example simulation process used for parametric optimization based on lithographic variation is discussed in detail in the U.S. application Ser. No. 16/541, 420, which is incorporated herein by reference in its entirety.

In an embodiment, similar DB-PW experiment can be performed using both ADI and AEI data. The methods herein enables a user to analyze whether there is flexibility to adjust a mask CD to cause a desired resist-CD (e.g., when the resist has sufficient CD-window or yield). The methods herein also enables a user to analyze whether to adjust process (e.g. the lithio-etch bias, use another isotropic etching, or a spacer process, etc.) to achieve the final AEI CD. Thus, the present methods can provide recommendation related to the process adjustments or what final target-CD would work for a selected process.

In case of new reticle-design e.g., mask used in a high volume manufacturing (HVM), there may be CD-errors related to a substrate. In an embodiment, the CD-errors resulting from the simulation results obtained after a fixed number of iterations compared to reference simulation results obtained from a reference simulation process that is executed for relatively long period of time such as a week. In an embodiment, there may be residual CD errors all over a substrate caused due to the mask, since the mask pattern may not be determined by doing optimization for substantially long periods of time or until the CD-errors are zero. In an embodiment, the CD-errors are also referred as convergence-residuals from the full-chip OPC. In an embodiment, the convergence-residuals can be used during a final reticle verification, e.g., lithio-manufacturing check (LMC) to determine whether the OPC full-chip leads to a reticle that is expected to provide the desired yield. In an embodiment, the CD-errors may be determined and checked whether the errors are within acceptable limits for particular hot spots on a reticle. In an embodiment, the hotspots may be user-defined location on a reticle, defined as portions of the reticle including critical patterns, or locations having relatively higher probability of defect occurrence.

As mentioned earlier, in PCT application PCT/EP2018/085159, it was proposed to define a defect-based process window based on the expected CD distributions and measured failure rates at the edge of a process window. The earlier proposed approach includes a step to predict a shape of the CD distribution at very low probability levels at best exposure and best focus (BEBF) conditions. To determine the CD distribution, it was anticipated that the dose-response curve is non-linear, which yields a skew in the final CD distribution. However, for the impact of mask, it is assumed that the MEEF was linear. This implies that a Gaussian distribution on mask translates in a Gaussian distribution of mean CD's per mask contact hole on a substrate.

In an embodiment, the present disclosure provides an improved method (in FIG. 24) to determine defect based process window by considering asymmetries in CD distributions due to nonlinear mask error enhancement factor (MEEF) and dependence of resist LCDU on mask feature size.

The method (in FIG. 24) can better predict a shape of the CD distribution on a substrate by accounting for nonlinearities in the MEEF and the dependence of resist LCDU on feature size by using limited extra measurements and/or simulations.

The following description shows measurements that indicate that nonlinearities in the MEEF affect the skewness of the distribution of average CD's per mask feature size (e.g., contact hole size) on a substrate. It also shows that the resist LCDU depends on the mask feature size (e.g., contact hole size). Additionally, it is explained how these two effects can be accounted for in the prediction of the CD distribution on the substrate.

Figure 22:
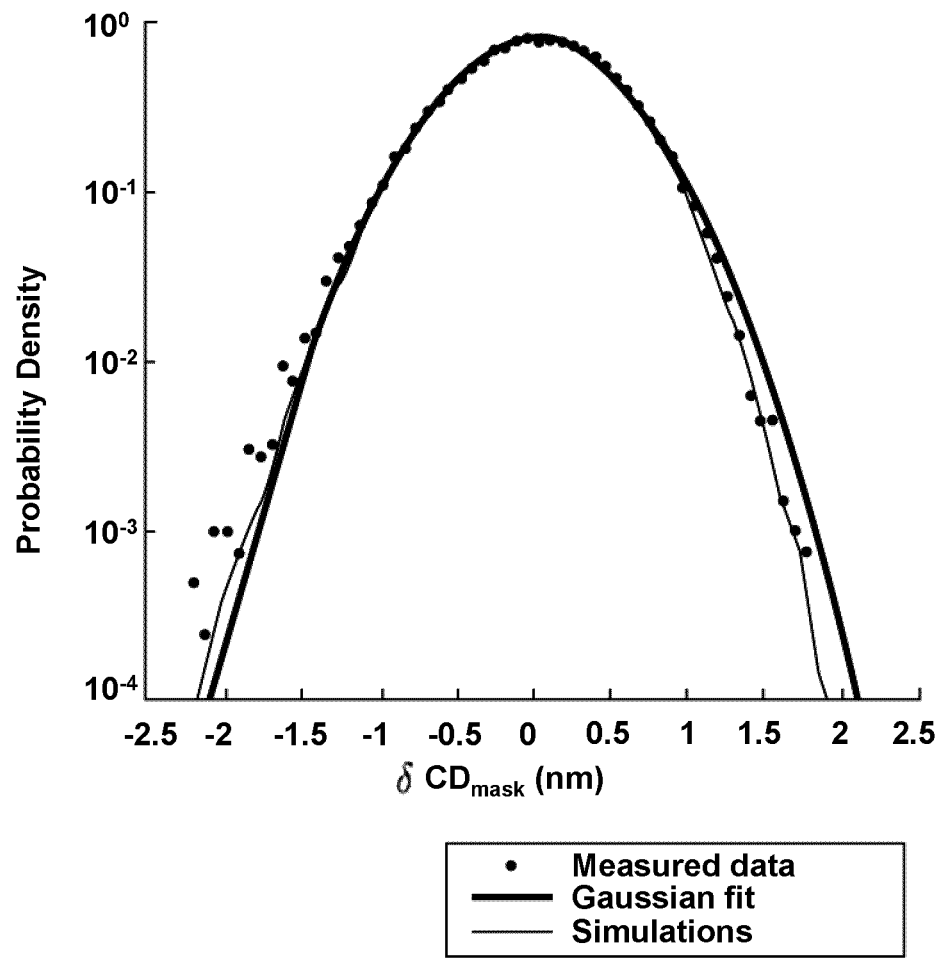
FIG. 22 is a plot of example CD distribution fitting, according to an embodiment.

FIG. 22 a plot of measured data (dots) of mean substrate CD per mask contact hole minus the mean CD. As one can see, the distribution of the measured data (dots) is skewed. In the present example, a Gaussian function is fitted on the measured data. However, the Gaussian fit does not explain the measured data accurate. On the other hand, a non-linear fit determined according to present method has relatively better fit than the Gaussian fit.

Figure 23:
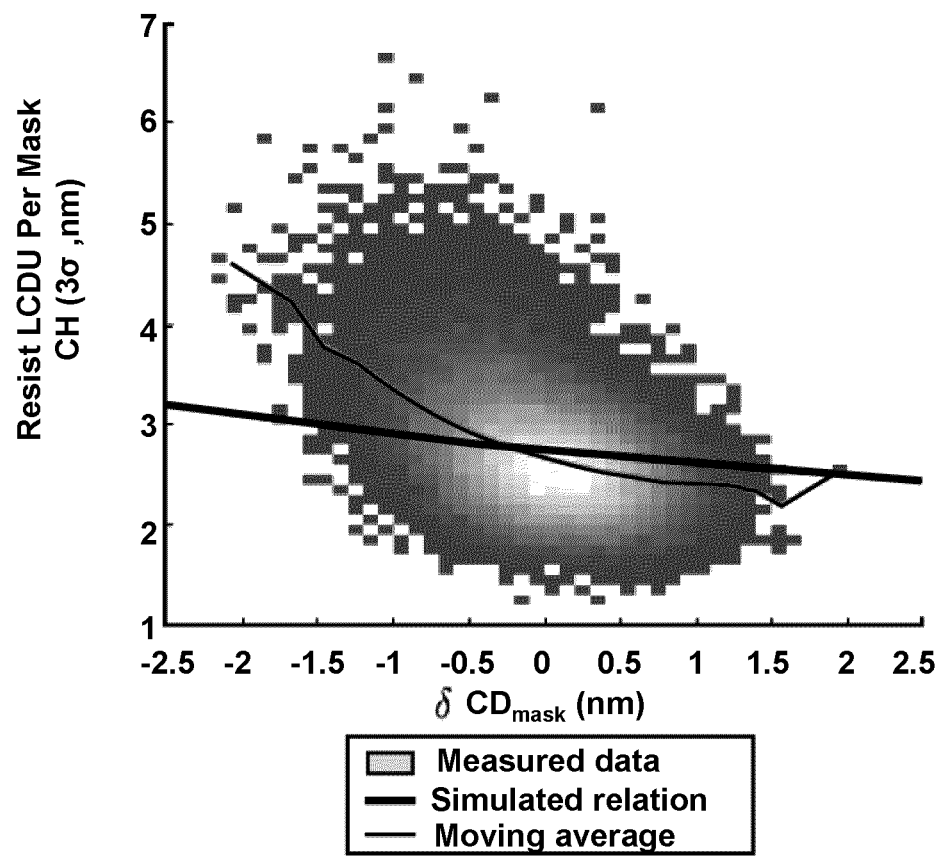
FIG. 23 illustrates a plot of measured resist LCDU associated with each mask contact hole plotted against deviations in mask CD

FIG. 23 illustrates a plot of measured resist LCDU associated with each mask contact hole plotted against deviations in mask CD ($\delta CD_{mask}$). Although there is a lot of intrinsic measurement noise, the moving average of the measured data clearly shows that the resist LCDU strongly increases with decreasing the mask contact hole size. The measured sensitivity is stronger than what is predicted from the simulation (e.g., using Hyperlith software) associated with a patterning process. In an example, the moving average curve represent a relation between the mask contact hole size and the local CDU of the substrate (i.e., a standard deviation of the CD)

Figure 24:
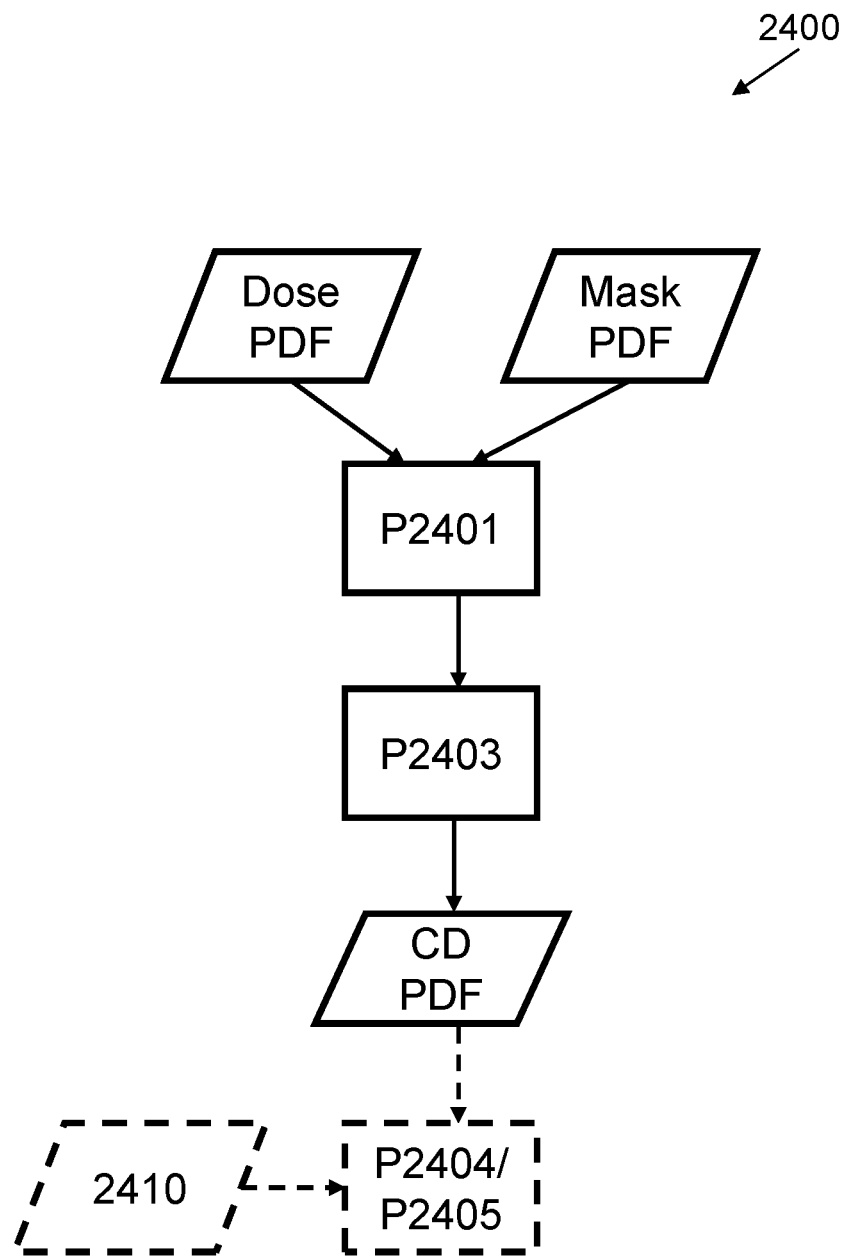
FIG. 24 is a flow chart of a method for determining a probability density function associated with a characteristic of a feature that will be printed on a substrate, according to an embodiment.

FIG. 24 is a flow chart of a method for determining a probability density function associated with a characteristic of a feature that will be printed on a substrate. The example method 2400 includes procedures P2401 and P2403 that uses dose PDF and a mask PDF to determine CD PDF.

Procedure P2401 includes obtaining (e.g., via a computer hardware system 100): (i) a dose probability density function (dose PDF) to determine a probability of dose, and (ii) a mask probability density function (mask PDF) to determine a probability in a deviation of a mask characteristic. In an embodiment, the dose PDF is a function of (a) the characteristic (e.g., CD) of the feature and (b) the deviation of the mask characteristic ($\delta CD_{mask}$). In an embodiment, the mask characteristic (e.g., mask CD) being associated with a mask used to print the feature on the substrate.

Procedure P2403 includes determining (e.g., via a computer hardware system 100) the probability density function associated with the characteristic by convoluting (i) the dose PDF and (ii) the mask PDF over a given range of mask characteristic values. In an example, the probability density function associated with the characteristic is represented as CD PDF or $PDF_{CD}(CD, d)$.

In an embodiment, procedure P2404 includes adjusting, based on the determined PDF of the characteristic, a process window associated with a patterning process. In an embodiment, such process window can be used to determine CD-limits used in e.g., methods 1100, 1500, and 2100 discussed herein. In an embodiment, the process window can be used during the patterning process, via the lithographic apparatus. It can be understood by a person of ordinary skill in the art that the application of the determine PDF is not limited to adjusting process window. The PDF can be used to improve other patterning related processes, simulation, or manufacturing operations.

In an embodiment, the dose pdf and the mask PDF are then combined to determine the CD PDF using example equation (8):

$$PDF_{CD}(CD,d) = \int \delta CD_{mask} PDF_{dose}(CD,d,\delta CD_{mask}) \times PDF_{mask}(\delta CD_{mask}) \quad (8)$$

The terms in equation (8) are further discussed below.

In an embodiment, the mask PDF incorporates dependency of a non-linear mask error enhancement factor (MEEF) that causes a skewness in the mask PDF. The non-linear MEEF is computed using an inverse function of a relation between the mask characteristic and the characteristic of the printed on the substrate.

In an embodiment, the mask PDF can be computed using equation (9) below. In an embodiment, $PDF_{mask}(\delta CD_{mask})$ represents a probability density function of finding $\delta CD_{mask}$ on the substrate, which is the mean CD deviation on the substrate of all contact holes associated with the same mask contact hole.

$$PDF_{mask}(\delta CD_{mask}) = \\ G_{mask}(g_{mask}(\delta CD_{mask}); \mu_{mask}, \sigma_{mask}) \cdot \left| \frac{\partial}{\partial mask} g_{mask}(\delta CD_{mask}) \right| \quad (9)$$

In the equation 10 above, $G_{mask}$ is a Gaussian distribution of the mask characteristic used to determine probability of finding a contact hole of a given $size_{mask}$ on the mask, a mean of $G_{mask}$, $\mu_{mask}$, is computed based on an inverse function of a relation between the mask characteristic and the characteristic of the printed on the substrate represented by $g_{mask}(\delta CD_{mask})$, a standard deviation of $G_{mask}$ is $\sigma_{mask}$, which is the standard deviation determined based on the inverse function and the measured standard deviation of $\delta CD_{mask}$, and $$\left| \frac{\partial}{\partial mask} g_{mask}(\delta CD_{mask}) \right|$$

determines the non-linear MEEF. In an embodiment, $G_{mask}$ can be Gaussian distribution of $size_{mask}$ or Gaussian distribution of $size_{mask}^2$.

Figure 25:
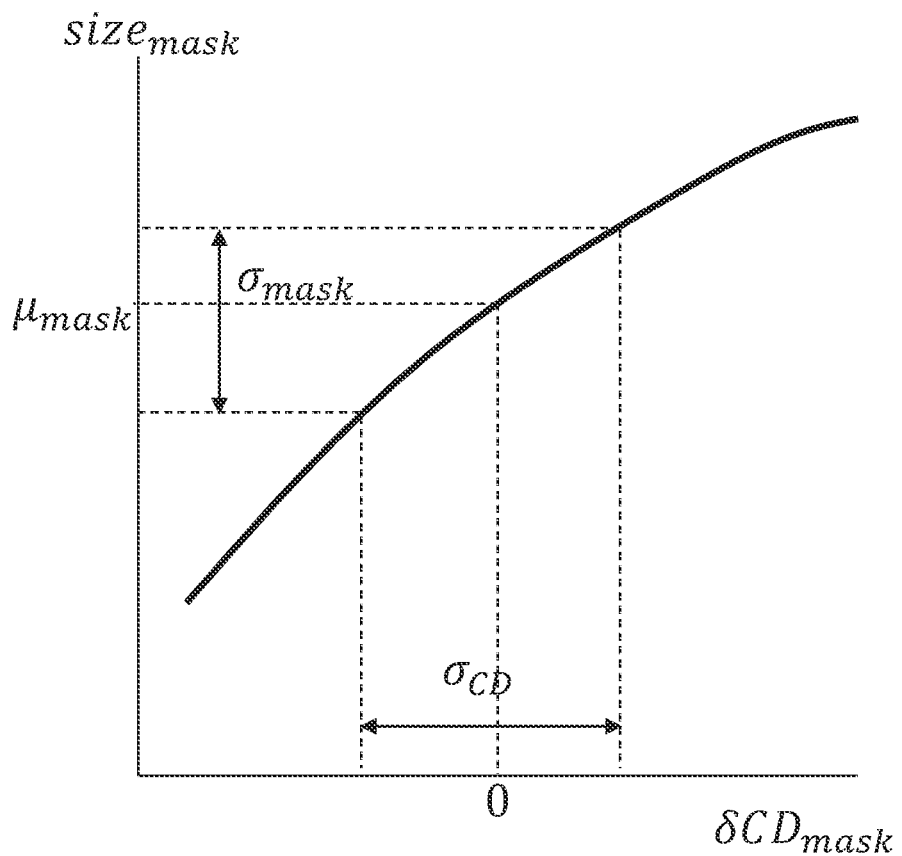
FIG. 25 illustrates an example relation between mask size and change in CD on a wafer caused due to change in mask size, according to an embodiment.

In an embodiment, referring to FIG. 25, $size_{mask} = g_{mask}(\delta CD_{mask})$, which provides a (inverse) relation between $size_{mask}$ and $\delta CD_{mask}$. If the size of the hole on the mask is $size_{mask}$, the mean deviation of the contact hole size is $g_{mask}^{-1}$. This also determines $\mu_{mask}$, $\sigma_{mask}$. In an example, the relationship can be a second order polynomial, third order polynomial, spline fit, or other fit function determined using simulated or measured data.

In an embodiment, the dose PDF incorporates dependency of local critical dimension uniformity (LCDU) related to a resist pattern on the substrate. The LCDU being caused by the mask characteristic. FIG. 23 illustrates an example relationship between the resist-LCDU and the deviation in the mask CD.

In an embodiment, the dose PDF is determined using a normal distribution, Poisson, or compound Poissonian distribution having a mean dose and a dose standard deviation, the mean dose being determined by an inverse function of the relation between the dose and CD for a given deviation in the mask characteristic, and the dose standard deviation being determined by based on LCDU related to the resist pattern on the substrate that is caused by the mask characteristic. It can be understood that the dose PDF is not limited to a normal distribution or a Poisson distribution. A person of ordinary skilled in the art may select other known distribution functions to determine dose PDF as discussed herein.

In an embodiment, the dose PDF can be computed by equation (10) below:

$$PDF_{dose}(g_d(CD,\delta CD_{mask}); \mu_d(\delta CD_{mask}), \sigma_d(\delta CD_{mask})) \quad (10)$$

In the equation 10 above, the dose $g_d(CD, \delta CD_{mask})$ is determined using an inverse function of the relation between the dose and the characteristic CD of the feature for a given deviation in the mask characteristic $\delta CD_{mask}$, and the dose standard deviation $\sigma_d$ is based on the inverse function $g_d(CD, \delta CD_{mask})$ and the measured standard deviation $\sigma_{CD}^{resist}(\delta CD_{mask})$, wherein $\sigma_{CD}^{resist}(\delta CD_{mask})$ represents the LCDU ($1\sigma$) caused due to dose and resist variations for a given mask deviation.

Figure 26:
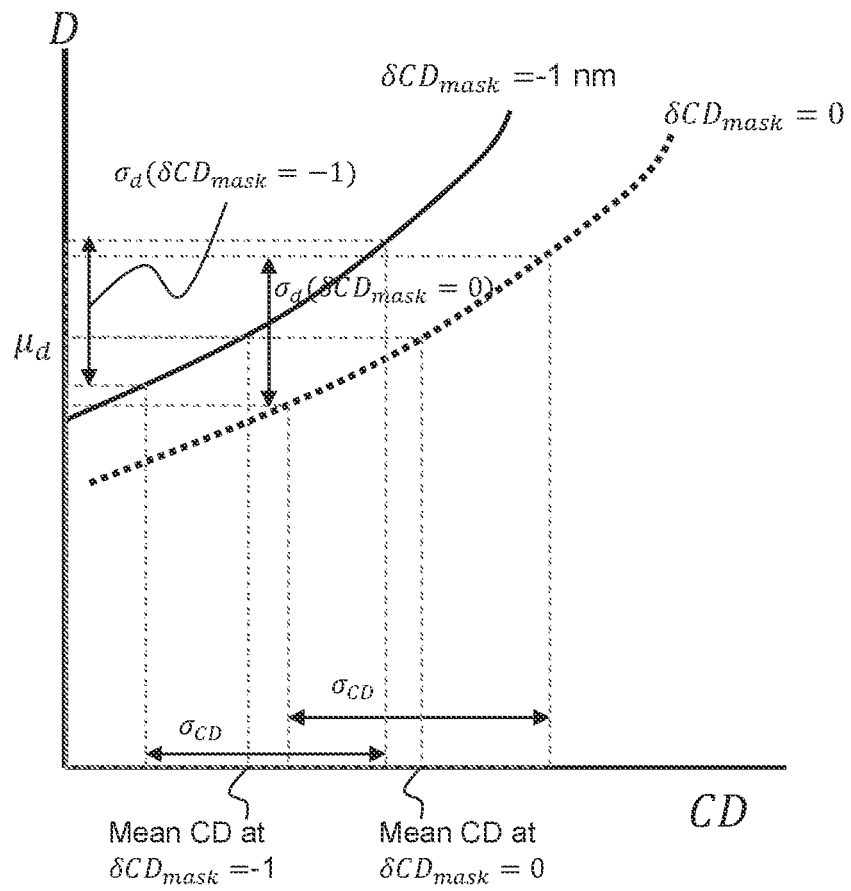
FIG. 26 two example relationship between dose (D) and CD on a substrate for different $\delta CD_{mask}$, according to an embodiment.

In an embodiment, referring to FIG. 26 illustrates two example relationship between dose (D) and CD on a substrate for different $\delta CD_{mask}$. In an embodiment, $g_d(CD, \delta CD_{mask})$ represents an (inverse) relation between dose D, and CD and $\delta CD_{mask}$. In an example, Gaussian distribution of D or Poisson distribution of $\in D$, where $\in$ is a fit parameter. In an embodiment, $g_d(CD, \delta CD_{mask})$ can be a second order bivariate polynomial, higher order bivariate polynomial, spline fit, or other fit function fitted based on simulated or measured data.

In an embodiment, the method 2400 further includes procedure P2405 that includes executing (e.g., on a processor of a computer hardware system 100), using failure rate data 2410 associated with a target layout, the determined probability density function to determine characteristic limits associated with a threshold failure rate. In an embodiment, the failure rate data can be obtained in a similar manner as discussed above with respect to the defect-based process window and further discussed in detail in PCT/EP2018/085159, which is incorporated herein in its entirety by reference.

In an embodiment, there is provided another method to determine a CD distribution based on a weighting of dose contribution towards CD distribution.

Typically, stochastic noise is an area of concern for EUV lithography. The stochastic noise not only impacts local CD uniformity (LCDU), local pattern placement error and line-edge-roughness (LER), it also causes defects through rare events, which are called stochastic defects. CD variability and fail rate of stochastic defects have become important for EUV lithography process control. The conventional process window analysis based on mean CD measured over hundreds of data points is no longer sufficient to determine the robust process without considering an entire distribution of CD for a target layout.

As mentioned earlier and detailed in PCT/EP2018/085159, a software product (e.g., PFScan) can be configured to determine stochastic-aware process window characterization. The software product can takes CD and failure rate data (or defect data) as input. Using the input data, statistical analysis on CD distributions and fail rate modelling can be performed to generate stochastics aware process windows. Determining a failure rate model includes CD/LCDU Bossung fitting, CD distribution modeling and failure rate process window generation. At CD distribution modeling step, a CD probability density functions (PDF) is modelled by convoluting the linear (normal) CD distribution with non-linear distribution which is reportedly induced by effective dose variation for an after-development process.

Figure 27:
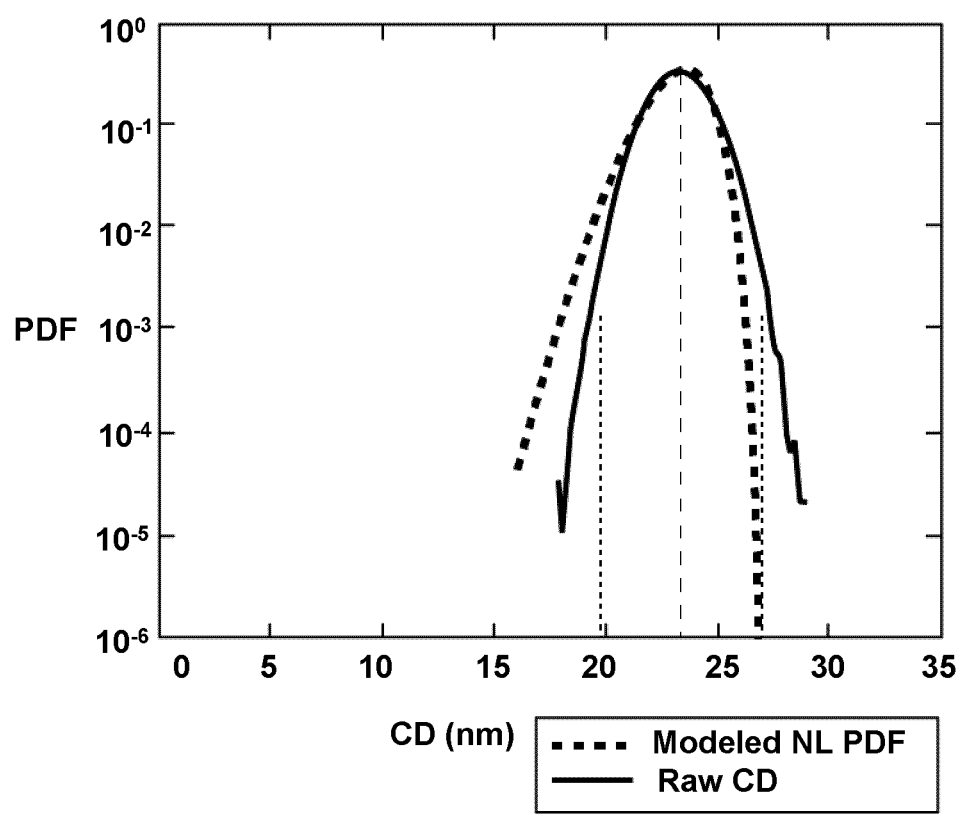
FIG. 27 illustrates example distribution of raw CD data and Gaussian fit on the raw data, according to an embodiment.

However, in practical sense, several factors contribute to total LCDU, such as dose variation, mask error and metrology noise, etching noise from an after etching process, background noise etc. As a result, modelling dose contribution for determining CD PDF may not be not sufficient. Referring to FIG. 27, possible overestimation of dose contribution cause fatter tails in a modeled CD distribution. In the present example, CD PDF is modeled or fitted as a function of a non-linear dose contribution on measured CD data (raw CD).

In the present disclosure, an additional LCDU contributors are applied to the CD PDF model. An adjustment factor is applied to measured LCDU to adjust effects of dose variation and fitting the other part of the measured LCDU to model contributions from mask error, SEM noise, etching error etc. Following equation (11) expresses the different contributions towards total LCDU ($\sigma_{all}^2$).

$$\sigma_{all}^2 = \sigma_{dose_e}^2 + \sigma_{mask}^2 + \sigma_{sem}^2 + \sigma_{other}^2 = adj\_factor * \sigma_{dose}^2 + \sigma_{additional}^2 \quad (11)$$

In the above equation, adj_factor is a value or a set of values applied to dose variation across a given dose-focus matrix or settings. In an embodiment, adj_factor is optimized across different dose and focus settings, as discussed later in the disclosure.

In an embodiment, applying a constant but optimized adj_factor value across the focus/dose matrix can effectively model CD distribution across different dose-focus settings for simple patterns like SRAM and regular via arrays in many cases. However, in other use cases, tuning of the adj_factor value across focus-exposure settings becomes important to make the modeled PDF representative of the measured PDF. The measured PDF refers to PDF represented by plotting actual measured CD data of a printed substrate.

Figure 28:
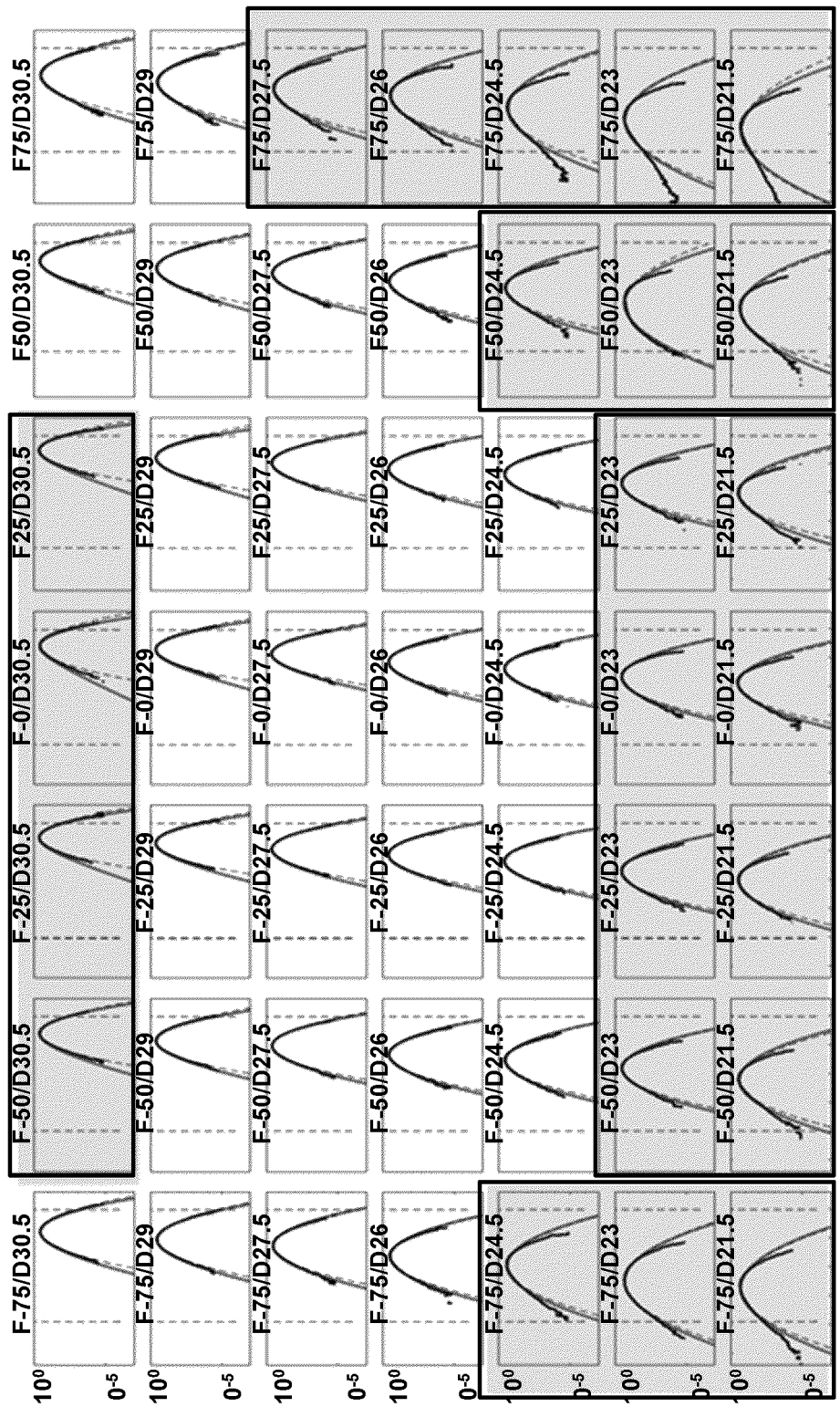
FIG. 28 are sample results generated by existing CD model for different dose-focus settings, according to an embodiment.

FIG. 28 shows an example of PDF fitted across different focus-exposure conditions using a constant adj_factor value to model non-linear dose contribution. The fitted PDF for the highlighted dose-focus setting are quite off from the measured PDF. The further away from nominal condition (center condition), more difference is seen between the model PDF and measured PDF. This indicates PDFs for highlighted conditions should to be further optimized.

In an embodiment, the nonlinear dose-contributed PDF (e.g., $PDF_{NL,d}$) is modeled based on the adj_factor*$\sigma_{dose}^2$. In an embodiment, other-factor contributed PDF (e.g., $PDF_{linear}$) is separately modeled based on $\sigma_{additional}^2$. A convolution between two PDFs is performed to determine a final CD distribution (also referred as a modeled PDF or a modeled CD PDF) as shown below, where ⊗ represents a convolution operation:

$$PDF_{CD}(CD,d) = PDF_{NL,d} \otimes PDF_{linear}$$

In the present disclosure, modeling parameters of each PDF are determined based on a difference or error between the modeled PDF to a measured PDF such that the error is minimized. According to the present disclosure, introducing the adjustment model and additional Gaussian distribution from other contributing factors can help effectively model the measured CD distribution.

In an embodiment, the adj_factor is a model whose parameters are optimized to make the adj_factor dynamic across different dose-focus settings, effectively changing a proportion of non-linear dose sensitivity contribution to modeled PDF (e.g., $PDF_{CD}(CD, d)$) across FEM matrix.

Both non-linear and linear distributions are optimized simultaneously at each dose-focus setting, then optimized adj_factor is modelled as the function of focus and dose for failure rate modeling.

Various optimization algorithms can be applied to optimize the adj_factor model based on a metric such as root mean square error (RMS) between the modeled PDF and the measured PDF. One example is to apply adaptive moment estimation (Adam) algorithm across FEM (i.e., dose-focus settings).

Figure 29:
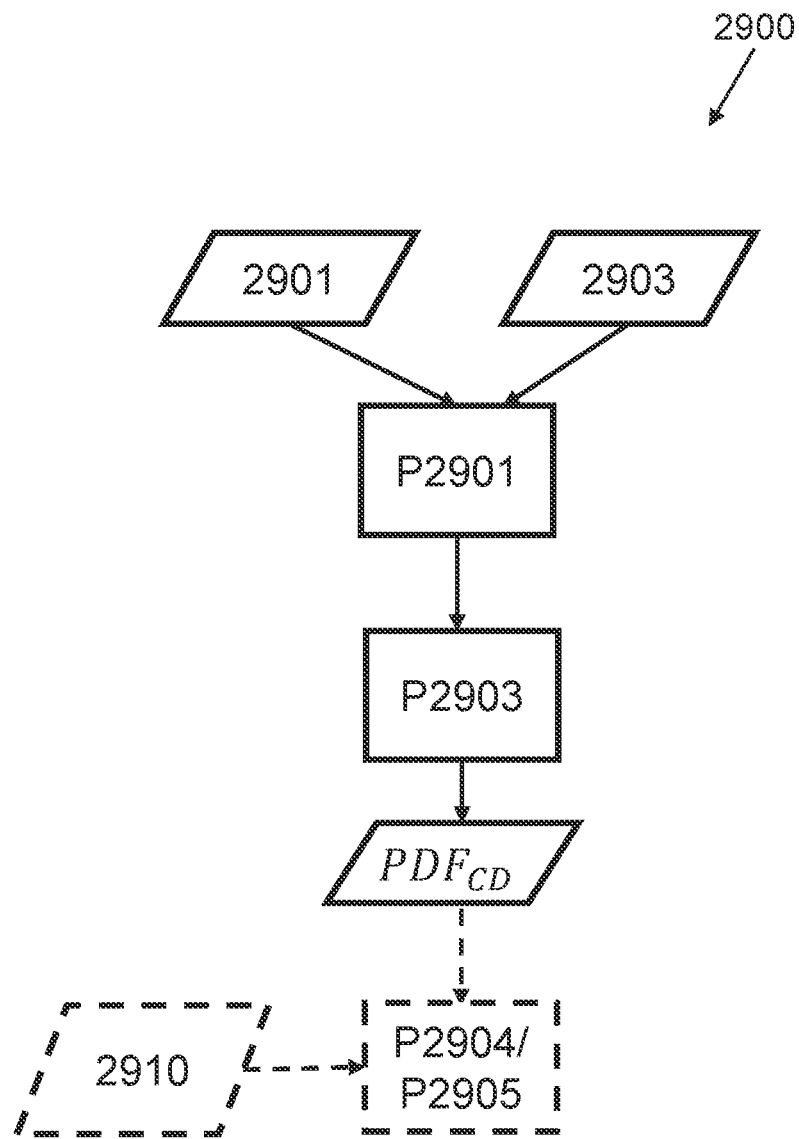
FIG. 29 is a flow chart of a method for determining a probability density function associated with a characteristic of a pattern to be printed on a substrate, according to an embodiment.

FIG. 29 is a flow chart of an exemplary method for determining a probability density function (e.g., $PDF_{CD}(CD, d)$) associated with a characteristic of a pattern to be printed on a substrate in accordance with an embodiment of the present disclosure.

In an embodiment, the method 2900 can start with a constant adj_factor across FEM for dose contribution. In one embodiment, a user can manually tune the adj_factor by adjusting its value but keeping it same across FEM, or varying it with dose and focus. Manually tuning helps a user to find roughly acceptable spots for focus/dose conditions near nominal. The manual tuning may not be satisfactory when fitting error RMS is larger than user-specified threshold (e.g. 0.1). In an embodiment, the best result (having minimum error) from manual tuning can be used as initial input for auto-optimization to save run time.

Once an initial set up is done, auto optimization can be run through a set of focus and dose setting. In an embodiment, user can specify the sampling of focus and dose settings to be optimized in order to save run time, instead of full FEM settings. The method 2900 is further discussed in following procedures P2901 and P2903.

Procedure P2901 includes obtaining: (i) a plurality of dose-focus settings 2901, and (ii) a reference distribution 2903 based on measured values of the characteristic of a printed pattern associated with each setting of the plurality of dose-focus settings. In an embodiment, the reference distribution 2903 is also referred as a measured PDF.

Procedure P2903 includes determining (e.g., via a computer hardware system 100), based on an adjustment model and the plurality of dose-focus settings, the probability density function (PDF) of the characteristic (e.g., $PDF_{CD}$) such that an error between the PDF and the reference distribution is reduced, the PDF being a function of the adjustment model and variance associated with dose. The adjustment model being configured to change a proportion of non-linear dose sensitivity contribution to the PDF. In an embodiment, the adjustment model is a polynomial function of dose and focus.

In an embodiment, procedure P2904 includes adjusting, based on the determined PDF of the characteristic, a process window associated with a patterning process. In an embodiment, such process window can be used to determine CD-limits used in e.g., methods 1100, 1500, and 2100 discussed herein. In an embodiment, the process window can be used during the patterning process, via the lithographic apparatus. It can be understood by a person of ordinary skill in the art that the application of the determine PDF is not limited to adjusting process window. The PDF can be used to improve other patterning related processes, simulation, or manufacturing operations.

In an embodiment, the determining of the PDF (e.g., $PDF_{CD}$) is an iterative process, an iteration including determining, based on the adjustment model, an adjustment value for a given dose focus setting of the plurality of dose-focus settings; determining, based on the adjustment value, the PDF of the characteristic (e.g., $PDF_{CD}$) of a pattern; determining the error between the PDF and the reference distribution; and adjusting, parameters of the adjustment model, for the given dose and focus setting of the plurality of dose-focus settings such that the error is minimized.

In an embodiment, the PDF (e.g., $PDF_{CD}$) is a convolution of a first PDF and a second PDF, wherein the first PDF is a function of a first variation, the first variation being a product of the adjustment model and variation of dose, and the second PDF is a function of a second variation associated with factors other than dose contributing to variation in the characteristic of a pattern.

In an embodiment, the determining of the PDF is an iterative process, an iteration including convoluting the first PDF and the second PDF to determine the PDF of the characteristic of a pattern; determining the error between the PDF and the reference distribution; and adjusting parameters of the first variation and the second variation for a given dose and focus setting of the plurality of dose-focus settings such that the error is minimized.

In an embodiment, the adjusting of the parameters of the adjustment model for the plurality of dose-focus settings is performed by an optimization algorithm selected from: adaptive moment estimation or a gradient decent method.

In an embodiment, the method 2900 further includes determining a plurality of adjustment values associated with the PDF having minimum error with respect to the reference distribution for each dose and each focus setting of the plurality of dose-focus settings; and fitting, based on the plurality of adjustment values, a polynomial function of dose and focus to determine the adjustment model such that a difference between the fitted polynomial function and the plurality of adjustment model values is minimized.

Figure 30A:
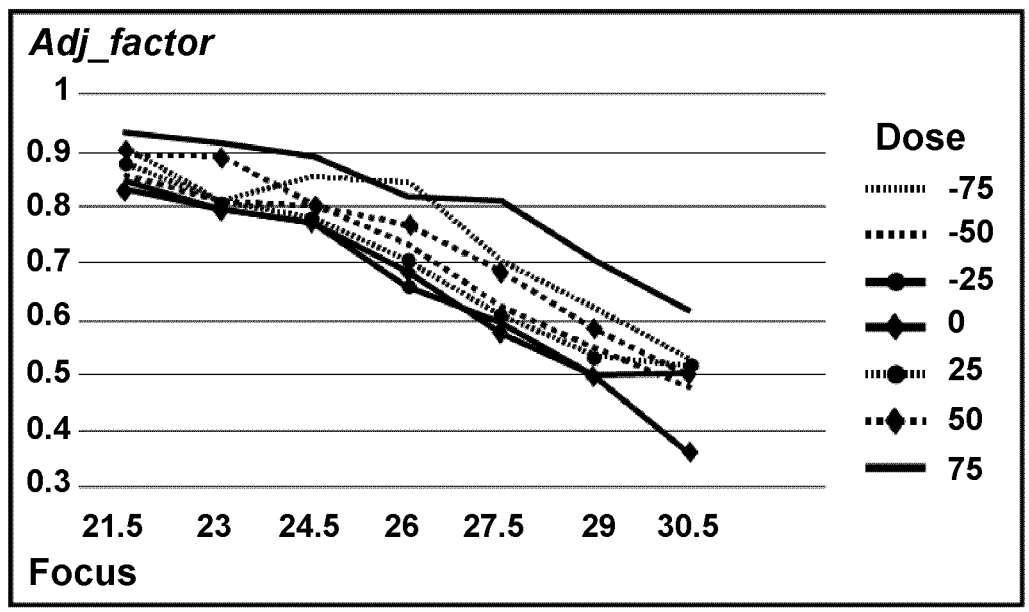
FIG. 30A and FIG. 30B are plots of adjustment values related to an adjustment model used to adjust dose contribution towards characteristic (e.g., CD) variation, according to an embodiment.
Figure 30B:
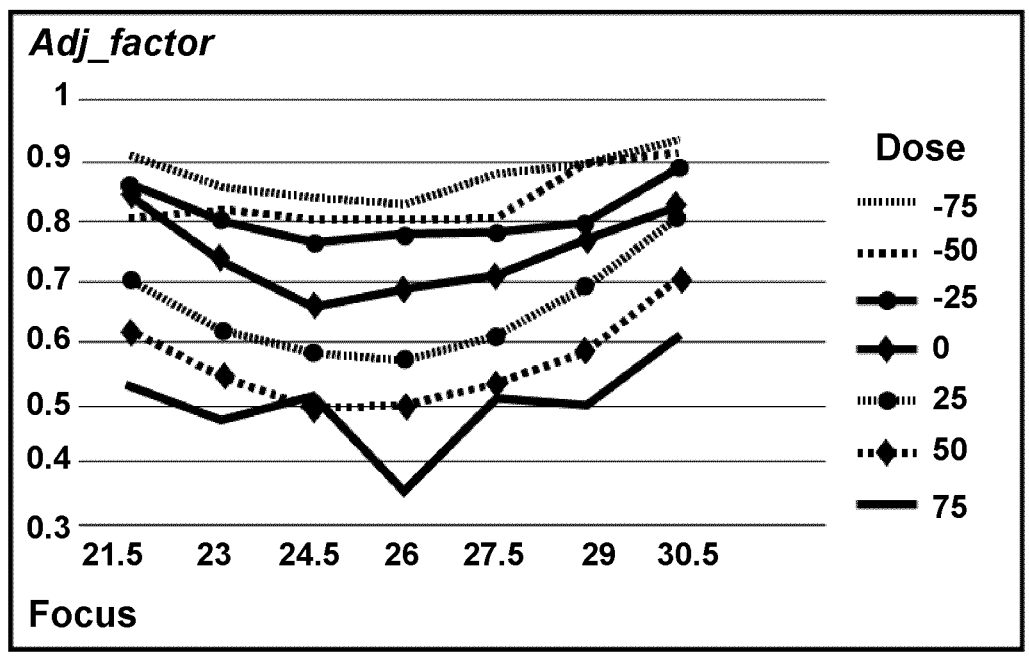

FIG. 30A and FIG. 30B illustrate dependency of the adjustment value (adj_factor) on dose and focus, respectively according to an embodiment of the present disclosure. FIGS. 30A and 30B show optimized adjustment values used to build the adjustment model. FIG. 30A shows that the adjustment value adj_factor values defining the non-linear CD distribution is mostly linear to dose, and impacted significantly by dose. The adj_factor value reduces as dose reduces. It shows effect of stochastic effect on non-linearity CD distribution: more stochastic effect at the smaller dose, therefore a larger adjustment value which means more proportion of CD variations coming from the dose variation.

The adjustment value also changes with focus (FIG. 30B), it is high order relationship. FIG. 30 also shows more variation through focus at higher dose. The adjustment value increases as defocus increases.

Figure 31:
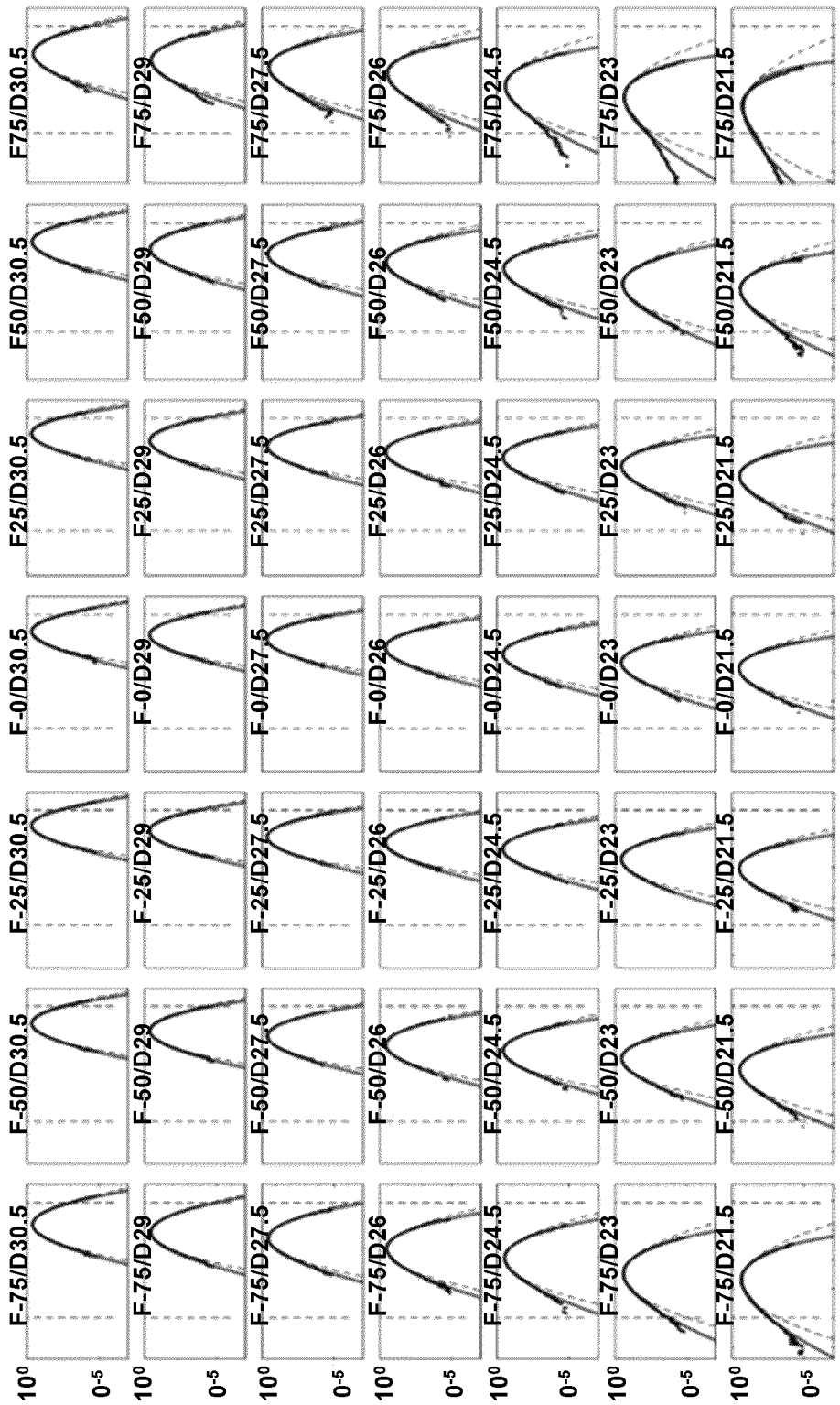
FIG. 31 are sample results generated by a characteristic model (e.g., CD-model) for different dose-focus settings, where the characteristic model is determine by method FIG. 29, according to an embodiment.

The dynamically optimized adjustment value has better performance to model CD distributions at all dose/focus conditions. In an embodiment, dynamically optimized refers to different optimized adjustment value for each dose-focus setting. For example, as shown in FIG. 31, the modeled PDF fits more accurately across different dose-focus settings using the optimized adj_factor model to model non-linear dose contribution. In comparison FIG. 28, which employs a constant adjustment value does not fit CD distributions across dose-focus setting away from the nominal conditions, as explained before.

In an embodiment, the method 2900 further includes procedure P2905 including executing (e.g., on a processor of a computer hardware system 100), using failure rate data 2910 associated with the pattern, the determined probability density function (e.g., $PDF_{CD}$) to determine characteristic limits associated with a threshold failure rate.

In an embodiment, the adjustment model can be saved and reused for other failure rate model runs. The optimized adjustment values may work for other features from same layer, even though they include different patterns or pattern groups. Before executing the failure rate model on a different pattern from the same layer, check is performed whether there is existing adjustment model available to use.

According to present disclosure, the combination and sub-combinations of disclosed elements constitute separate embodiments. For example, a first combination includes determining, based on a defect-based process window, a retargeted pattern using a target pattern or a separately generated post-OPC pattern. A second combination determining a calibrated simulation process. In another combination, a process adjustments may be determined to simulate or manufacture patterns satisfying a threshold failure rate. In another combination, a lithographic apparatus comprises a mask manufactured using the mask pattern determined as discussed herein.

In an embodiment, the methods (e.g., 1100, 1500, 2100, 2400, and 2900) discussed herein may be provided as a computer program product or a non-transitory computer readable medium having instructions recorded thereon, the instructions when executed by a computer implementing the operation of the methods discussed above. For example, an example computer system 100 in FIG. 36 includes a non-transitory computer-readable media (e.g., memory) comprising instructions that, when executed by one or more processors (e.g., 104), cause operations (e.g., procedures) of the methods discussed herein above.

The following description provides an Optical proximity correction (OPC) process. The OPC addresses the fact that, in addition to any demagnification by the lithographic projection apparatus, the final size and placement of an image of the patterning device pattern projected on the substrate will not be identical to, or simply depend only on the size and placement of, the corresponding patterning device pattern features on the patterning device. It is noted that the terms "mask", "reticle", "patterning device" are utilized interchangeably herein. Also, person skilled in the art will recognize that, especially in the context of lithography simulation/optimization, the terms "mask pattern," "reticle pattern" and "patterning device pattern" can be used interchangeably, as in lithography simulation/optimization, a physical patterning device is not necessarily used but a patterning device pattern can be used to represent a physical patterning device. For the small feature sizes and high feature densities present on some patterning device patterns, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to ensure that the projected image of the patterning device pattern is in accordance with requirements of a given target design, proximity effects should be predicted and compensated for, using sophisticated numerical models, corrections or pre-distortions of the patterning device pattern. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the patterning device pattern has some modification in order to achieve high fidelity of the projected image to the target design. These OPC modifications may include shifting or biasing of edge positions or line widths and/or application of "assist" features that are intended to assist projection of other features.

Application of model-based OPC to a target design involves good process models and considerable computational resources, given the many millions of features typically present in a device design. However, applying OPC is generally not an exact science, but an empirical, iterative process that does not always compensate for all possible proximity effects. Therefore, the effect of OPC, e.g., patterning device patterns after application of OPC and any other RET, should be verified by design inspection, e.g., intensive full-chip simulation using calibrated numerical process models, in order to reduce or minimize the possibility of design flaws being built into the patterning device pattern. This is driven by the enormous cost of making high-end patterning devices, which run in the multi-million dollar range, as well as by the impact on turn-around time by reworking or repairing actual patterning devices once they have been manufactured. Both OPC and full-chip RET verification may be based on numerical modelling systems and methods as described, for example in, U.S. Pat. No. 7,003,758 and an article titled "Optimized Hardware and Software For Fast, Full Chip Simulation", by Y. Cao et al., Proc. SPIE, Vol. 5754, 405 (2005), which are incorporated herein in their entireties by reference.

One of the simplest forms of OPC is selective bias. Given CD vs. pitch data, all of the different pitches could be forced to produce the same CD, at least at best focus and exposure, by changing the CD at the patterning device level. Thus, if a feature prints too small at the substrate level, the patterning device level feature would be biased to be slightly larger than nominal, and vice versa. Since the pattern transfer process from patterning device level to substrate level is non-linear, the amount of bias is not simply the measured CD error at best focus and exposure times the reduction ratio, but with modelling and experimentation an appropriate bias can be determined. Selective bias is an incomplete solution to the problem of proximity effects, particularly if it is only applied at the nominal process condition. Even though such bias could, in principle, be applied to give uniform CD vs. pitch curves at best focus and exposure, once the exposure process varies from the nominal condition, each biased pitch curve will respond differently, resulting in different process windows for the different features. A process window being a range of values of two or more process parameters (e.g., focus and radiation dose in the lithographic apparatus) under which a feature is sufficiently properly created (e.g., the CD of the feature is within a certain range such as ±10% or ±5%). Therefore, the "best" bias to give identical CD vs. pitch may even have a negative impact on the overall process window, reducing rather than enlarging the focus and exposure range within which all of the target features print on the substrate within the desired process tolerance.

Other more complex OPC techniques have been developed for application beyond the one-dimensional bias example above. A two-dimensional proximity effect is line end shortening. Line ends have a tendency to "pull back" from their desired end point location as a function of exposure and focus. In many cases, the degree of end shortening of a long line end can be several times larger than the corresponding line narrowing. This type of line end pull back can result in catastrophic failure of the devices being manufactured if the line end fails to completely cross over the underlying layer it was intended to cover, such as a polysilicon gate layer over a source-drain region. Since this type of pattern is highly sensitive to focus and exposure, simply biasing the line end to be longer than the design length is inadequate because the line at best focus and exposure, or in an underexposed condition, would be excessively long, resulting either in short circuits as the extended line end touches neighboring structures, or unnecessarily large circuit sizes if more space is added between individual features in the circuit. Since one of the goals of device design and manufacturing is often to maximize the number of functional elements while minimizing the area required per chip, adding excess spacing is an undesirable solution.

Two-dimensional OPC approaches may help solve the line end pull back problem. Extra structures (also known as "assist features") such as "hammerheads" or "serifs" may be added to line ends to effectively anchor them in place and provide reduced pull back over the entire process window. Even at best focus and exposure these extra structures are not resolved but they alter the appearance of the main feature without being fully resolved on their own. A "main feature" as used herein means a feature intended to print on a substrate under some or all conditions in the process window. Assist features can take on much more aggressive forms than simple hammerheads added to line ends, to the extent the pattern on the patterning device is no longer simply the desired substrate pattern upsized by the reduction ratio. Assist features such as serifs can be applied for many more situations than simply reducing line end pull back. Inner or outer serifs can be applied to any edge, especially two dimensional edges, to reduce corner rounding or edge extrusions. With enough selective biasing and assist features of all sizes and polarities, the features on the patterning device bear less and less of a resemblance to the final pattern desired at the substrate level. In general, the patterning device pattern becomes a pre-distorted version of the substrate-level pattern, where the distortion is intended to counteract or reverse the pattern deformation that will occur during the manufacturing process to produce a pattern on the substrate that is as close to the one intended by the designer as possible.

Another OPC technique involves using completely independent and non-resolvable assist features, instead of or in addition to those assist features (e.g., serifs) connected to the main features. The term "independent" here means that edges of these assist features are not connected to edges of the main features. These independent assist features are not intended or desired to print as features on the substrate, but rather are intended to modify the aerial image of a nearby main feature to enhance the printability and process tolerance of that main feature. These assist features (often referred to as "scattering bars" or "SBAR") can include sub-resolution assist features (SRAF) which are features outside edges of the main features and sub-resolution inverse features (SRIF) which are features scooped out from inside the edges of the main features. The presence of a SBAR adds yet another layer of complexity to a patterning device pattern. A simple example of a use of scattering bars is where a regular array of non-resolvable scattering bars is drawn on both sides of an isolated line feature, which has the effect of making the isolated line appear, from an aerial image standpoint, to be more representative of a single line within an array of dense lines, resulting in a process window much closer in focus and exposure tolerance to that of a dense pattern. The common process window between such a decorated isolated feature and a dense pattern will have a larger common tolerance to focus and exposure variations than that of a feature drawn as isolated at the patterning device level.

An assist feature may be viewed as a difference between features on a patterning device and features in the patterning device pattern. The terms "main feature" and "assist feature" do not imply that a particular feature on a patterning device must be labelled as one or the other.

In addition to, or alternatively to, optimization to patterning device patterns (e.g., OPC), an illumination mode can be optimized, either jointly with patterning device optimization or separately, in an effort to improve the overall lithography fidelity. Many off-axis illumination modes, such as annular, quadrupole, and dipole, have been used, and provide more freedom for OPC design, thereby improving the imaging results, As is known, off-axis illumination is a proven way to resolve fine structures (i.e., target features) contained in the patterning device. However, when compared to a traditional illumination mode, an off-axis illumination mode usually provides less radiation intensity for the aerial image (AI). Thus, it becomes desirable to attempt to optimize the illumination mode to achieve the optimal balance between finer resolution and reduced radiation intensity. Several illumination optimization approaches can be found, for example, in an article by Rosenbluth et al., titled "Optimum Mask and Source Patterns to Print a Given Shape", Journal of Microlithography, Microfabrication, Microsystems 1(1), pp. 13-20, (2002), which is incorporated herein in its entirety by reference.

The pressure of ever decreasing design rules drives semiconductor chipmakers to move deeper into low $k_1$ lithography. Lithography towards lower $k_1$ puts heavy demands on RET, exposure tools, and the need for lithio-friendly design. So, to help ensure that the device design can be produced on to the substrate with workable process window, illumination mode—patterning device pattern optimization (referred to in some cases as source-mask optimization or SMO) is becoming a significant RET to achieve, e.g., smaller features.

So, for low $k_1$ photolithography, optimization of both the illumination mode and the patterning device pattern is useful to ensure a viable process window for projection of critical device patterns. Some algorithms (e.g. as described in Socha et al., "Simultaneous Source Mask Optimization (SMO)," Proc. SPIE Vol. 5853, 180-193 (2005), which is incorporated herein in its entirety by reference) discretize illumination into independent illumination distribution points and the patterning device pattern into diffraction orders in the spatial frequency domain, and separately formulate an objective function (which is defined as a function of selected design variables) based on process window metrics such as exposure latitude which could be predicted by optical imaging models from illumination distribution point intensities and patterning device pattern diffraction orders.

A further illumination mode and patterning device pattern optimization method and system that allows for simultaneous optimization of the illumination mode and the patterning device pattern using an objective function without constraints and within a practicable amount of time is described in PCT Patent Application Publication No. WO 2010/059954, titled "Fast Freeform Source and Mask Co-Optimization Method", which is hereby incorporated by reference in its entirety. Another illumination and patterning device optimization method and system that involves optimizing the illumination by adjusting pixels of the illumination distribution is described in U.S. Patent Application Publication No. 2010/0315614, titled "Source-Mask Optimization in Lithographic Apparatus", which is hereby incorporated by reference in its entirety.

Now, the patterning device referred to above can comprise one or more patterning device patterns. The patterning device pattern can be generated utilizing a CAD (computer-aided design) program, this process often being referred to as EDA (electronic design automation). Most CAD programs follow a set of predetermined design rules in order to create functional patterning device patterns for a patterning device. These rules are set by processing and design limitations. For example, design rules define the space tolerance between device features (such as gates, capacitors, etc.) or interconnect lines, so as to ensure that the devices or lines do not interact with one another in an undesirable way. The design rule limitation can be referred to as "critical dimensions" (CD). A critical dimension of a device can be defined as the smallest width of a line or hole or the smallest space between two lines or two holes. Thus, the CD determines the overall size and density of the designed device. One of the goals in device fabrication is to faithfully reproduce the original device design on the substrate (via the patterning device).

Further, in an optimization process of a system, a figure of merit of the system can be represented as an objective function (e.g., a cost function or a merit function). The optimization process typically boils down to a process of finding a set of parameters (design variables) of the system that minimizes or maximizes the objective function. The objective function can have any suitable form depending on the goal of the optimization. For example, the objective function can be weighted root mean square (RMS) of deviations of certain characteristics (evaluation points) of the system with respect to the intended values (e.g., ideal values) of these characteristics; the objective function can also be the maximum of these deviations. The term "design variables" as used herein comprises a set of parameters of a patterning process (e.g., of a lithographic process, a lithographic projection apparatus, etc.), for example, parameters that a user of a lithographic projection apparatus can adjust. It should be appreciated that any characteristics of a patterning process, including those of the illumination mode, the patterning device pattern (or the patterning device construction), the projection optics, and/or resist characteristics can be among the design variables in the optimization. The objective function is often a non-linear function of the design variables. Then standard optimization techniques are used to, e.g., minimize or maximize the objective function. The term "evaluation points" herein should be interpreted broadly to include any characteristics of the system or process. The design variables of the system can be confined to finite ranges and/or be interdependent due to practicalities of implementations of the system or process. In case of a lithographic projection apparatus, the constraints are often associated with physical properties and characteristics of the hardware such as tunable ranges, and/or patterning device manufacturability design rules (MRCs), and the evaluation points can include physical points on a resist image on a substrate, as well as non-physical characteristics such as dose and focus.

So, in a lithographic projection apparatus, an illumination system provides illumination (i.e. radiation) to patterning device and projection optics directs the illumination from the patterning device onto a substrate. In an embodiment, the projection optics enables the formation of an aerial image (AI), which is the radiation intensity distribution on the substrate. A resist layer on the substrate is exposed and the aerial image is transferred to the resist layer as a latent "resist image" (RI) therein. The resist image (RI) can be defined as a spatial distribution of solubility of the resist in the resist layer. In an embodiment, simulation of a lithography process can simulate the production of the aerial image and/or resist image.

Figure 32:
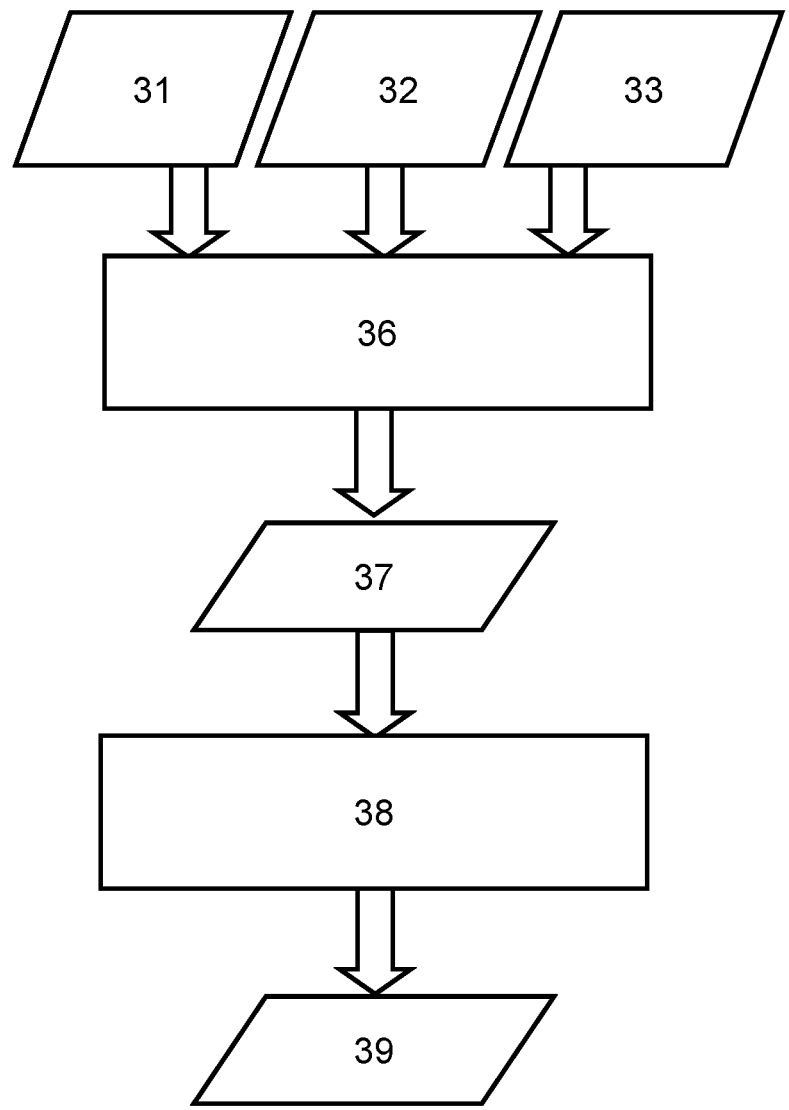
FIG. 32 is a block diagram of simulation models corresponding to the subsystems in FIG. 1, according to an embodiment.

An exemplary flow chart for modelling and/or simulating parts of a patterning process is illustrated in FIG. 32. As will be appreciated, the models may represent a different patterning process and need not comprise all the models described below.

An illumination model 31 represents optical characteristics (including radiation intensity distribution and/or phase distribution) of an illumination mode used to generate a patterned radiation beam. The illumination model 31 can represent the optical characteristics of the illumination that include, but not limited to, numerical aperture settings, illumination sigma (σ) settings as well as any particular illumination mode shape (e.g. off-axis radiation shape such as annular, quadrupole, dipole, etc.), where σ (or sigma) is outer radial extent of the illuminator.

A projection optics model 32 represents optical characteristics (including changes to the radiation intensity distribution and/or the phase distribution caused by the projection optics) of the projection optics. The projection optics model 32 may include optical aberrations caused by various factors, for example, heating of the components of the projection optics, stress caused by mechanical connections of the components of the projection optics, etc. The projection optics model 32 can represent the optical characteristics of the projection optics, including one or more selected from: an aberration, a distortion, a refractive index, a physical size, a physical dimension, an absorption, etc. Optical properties of the lithographic projection apparatus (e.g., properties of the illumination, the patterning device pattern and the projection optics) dictate the aerial image. Since the patterning device pattern used in the lithographic projection apparatus can be changed, it is desirable to separate the optical properties of the patterning device pattern from the optical properties of the rest of the lithographic projection apparatus including at least the illumination and the projection optics. The illumination model 31 and the projection optics model 32 can be combined into a transmission cross coefficient (TCC) model.

A patterning device pattern model 33 represents optical characteristics (including changes to the radiation intensity distribution and/or the phase distribution caused by a given patterning device pattern) of a patterning device pattern (e.g., a device design layout corresponding to a feature of an integrated circuit, a memory, an electronic device, etc.), which is the representation of an arrangement of features on or formed by a patterning device. The patterning device model 33 captures how the design features are laid out in the pattern of the patterning device and may include a representation of detailed physical properties of the patterning device and a patterning device pattern, as described, for example, in U.S. Pat. No. 7,587,704, which is incorporated by reference in its entirety.

A resist model 37 can be used to calculate the resist image from the aerial image. An example of such a resist model can be found in U.S. Pat. No. 8,200,468, which is hereby incorporated by reference in its entirety. The resist model typically describes the effects of chemical processes which occur during resist exposure, post exposure bake (PEB) and development, in order to predict, for example, contours of resist features formed on the substrate and so it typically related only to such properties of the resist layer (e.g., effects of chemical processes which occur during exposure, post-exposure bake and development). In an embodiment, the optical properties of the resist layer, e.g., refractive index, film thickness, propagation and polarization effects—may be captured as part of the projection optics model 32.

Having these models, an aerial image 36 can be simulated from the illumination model 31, the projection optics model 32 and the patterning device pattern model 33. An aerial image (AI) is the radiation intensity distribution at substrate level. Optical properties of the lithographic projection apparatus (e.g., properties of the illumination, the patterning device and the projection optics) dictate the aerial image.

A resist layer on a substrate is exposed by the aerial image and the aerial image is transferred to the resist layer as a latent "resist image" (RI) therein. The resist image (RI) can be defined as a spatial distribution of solubility of the resist in the resist layer. A resist image 38 can be simulated from the aerial image 36 using a resist model 37. So, in general, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of incident energy, which is further modified by diffusion processes and various loading effects. Efficient simulation methods that are fast enough for full-chip applications approximate the realistic 3-dimensional intensity distribution in the resist stack by a 2-dimensional aerial (and resist) image.

In an embodiment, the resist image can be used an input to a post-pattern transfer process model 39. The post-pattern transfer process model 39 defines performance of one or more post-resist development processes (e.g., etch, CMP, etc.) and can produce a post-etch image.

Thus, the model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process.

Simulation of the patterning process can, for example, predict contours, CDs, edge placement (e.g., edge placement error), pattern shift, etc. in the aerial, resist and/or etched image. Thus, the objective of the simulation is to accurately predict, for example, edge placement, and/or contours, and/or pattern shift, and/or aerial image intensity slope, and/or CD, etc. of the printed pattern. These values can be compared against an intended design to, e.g., correct the patterning process, identify where a defect is predicted to occur, etc. The intended design is generally defined as a pre-OPC design layout which can be provided in a standardized digital file format such as GDSII or OASIS or other file format.

Details of techniques and models used to transform a patterning device pattern into various lithographic images (e.g., an aerial image, a resist image, etc.), apply OPC using those techniques and models and evaluate performance (e.g., in terms of process window) are described in U.S. Patent Application Publication Nos. US 2008-0301620, 2007-0050749, 2007-0031745, 2008-0309897, 2010-0162197, 2010-0180251 and 2011-0099526, the disclosure of each which is hereby incorporated by reference in its entirety.

To facilitate the speed of evaluating the models, from the patterning device pattern, one or more portions may be identified, which are referred to as "clips." In a specific embodiment, a set of clips is extracted, which represents the complicated patterns in the patterning device pattern (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. In other words, clips may be the portions of the patterning device pattern or may be similar or have a similar behavior of portions of the patterning device pattern where critical features are identified either by experience (including clips provided by a customer), by trial and error, or by running a full-chip simulation. Clips usually contain one or more test patterns or gauge patterns. An initial larger set of clips may be provided a priori by a customer based on known critical feature areas in a patterning device pattern which require particular image optimization. Alternatively, in another embodiment, the initial larger set of clips may be extracted from the entire patterning device pattern by using some kind of automated (such as, machine vision) or manual algorithm that identifies the critical feature areas.

Furthermore, various patterns on or provided by a patterning device may have different process windows. i.e., a space of processing variables under which a pattern will be produced within specification. Examples of pattern specifications that relate to potential systematic defects include checks for necking, line pull back, line thinning, CD, edge placement, overlapping, resist top loss, resist undercut and/or bridging. The process window of all the patterns on a patterning device or an area thereof may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein. When designing, modifying, etc. a part of a patterning process using, for example, the modeling described herein, it is possible and economical to focus on the hot spots. When the hot spots are not defective, it is most likely that all the patterns are not defective.

Returning back the modeling of the patterning process, an optimization can be performed using, for example, an objective function, such as $$CF(z_1, z_2, \ldots, z_N) = \sum_{p=1}^{P} w_p f_p^2(z_1, z_2, \ldots, z_N) \quad (15)$$

wherein $(z_1, z_2, \ldots, z_N)$ are N design variables or values thereof; $f_p(z_1, z_2, \ldots, z_N)$ may be a function of a defect metric at the p-th evaluation point for a set of values of the design variables of $(z_1, z_2, \ldots, z_N)$. $w_p$ is a weight constant assigned to the p-th evaluation point. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the substrate, or any point on a patterning device pattern, or resist image, or aerial image.

The objective function may represent any suitable characteristics of the patterning process, such as of the lithographic projection apparatus or the substrate, for instance, focus, CD, image shift, image distortion, image rotation, etc. For example, the objective function may be a function of one or more of the following lithographic metrics: edge placement error, critical dimension, resist contour distance, worst defect size, pattern shift, stochastic effect, three-dimensional effect of the patterning device, three-dimensional effect of the resist, best focus shift, pupil fill factor, exposure time, and/or throughput. Since it is the resist image that often dictates the pattern on a substrate, the objective function often includes functions that represent some characteristics of the resist image. For example, $f_p(z_1, z_2, \ldots, z_N)$ of such an evaluation point can be simply a total number of defects in the resist image. The design variables can be any adjustable parameters such as adjustable parameters of the illumination mode, the patterning device pattern, the projection optics, dose, focus, etc.

The lithographic apparatus may include one or more components collectively called a "wavefront manipulator" that can be used to adjust shapes of a wavefront and intensity distribution and/or phase shift of the radiation beam. The wavefront and intensity distribution can be adjusted at any location along an optical path of the lithographic projection apparatus, such as before the patterning device, near a pupil plane, near an image plane, or near a focal plane. The projection optics can be used to correct or compensate for certain distortions of the wavefront and intensity distribution caused by, for example, the illumination, the patterning device, temperature variation in the lithographic projection apparatus, and/or thermal expansion of components of the lithographic projection apparatus. Adjusting the wavefront and intensity distribution can change values of the evaluation points and the objective function. Such changes can be simulated from a model or actually measured.

It should be noted that the normal weighted root mean square (RMS) of $f_p(z_1, z_2, \ldots, z_N)$ is defined as $$\sqrt{\frac{1}{P}\sum_{p=1}^{P} w_p f_p^2(z_1, z_2, \ldots, z_N)},$$

therefore, for example, minimizing the weighted RMS of $f_p(z_1, z_2, \ldots, z_N)$ is equivalent to minimizing the objective function $CF(z_1, z_2, \ldots, z_N) = \sum_{p=1}^{P} w_p f_p^2(z_1, z_2, \ldots, z_N)$, defined in Eq. 15. Thus the weighted RMS of $f_p(z_1, z_2, \ldots, z_N)$ and Eq. 15 may be utilized interchangeably for notational simplicity herein.

Further, if the process window (PW) is maximized, it is possible to consider the same physical location from different PW conditions as different evaluation points in the objective function in Eq. 15. For example, if N PW conditions are considered, then the evaluation points can be categorized according to their PW conditions and the objective functions can be written as:

$$CF(z_1, z_2, \ldots, z_N) = \sum_{p=1}^{P} w_p f_p^2(z_1, z_2, \ldots, z_N) = \sum_{u=1}^{U} \sum_{p_u=1}^{P_u} w_{p_u} f_{p_u}^2(z_1, z_2, \ldots, z_N) \quad (16)$$

where $f_{p_u}(z_1, z_2, \ldots, z_N)$ is a function of the defect metric of the $p_i$-th evaluation point for a set of values of the design variables of $(z_1, z_2, \ldots, z_N)$ under the u-th PW condition $u=1, \ldots, U$. When this defect metric is a failure rate, then minimizing the above objective function is equivalent to minimizing the defects under various PW conditions, which may lead to maximizing the PW. In particular, if the PW also includes different patterning device bias, then minimizing the above objective function also includes the minimization of mask error enhancement factor (MEEF), which is defined as the ratio between the substrate EPE and the induced patterning device pattern feature edge bias.

The design variables may have constraints, which can be expressed as $(z_1, z_2, \ldots, z_N) \in Z$, where $Z$ is a set of possible values of the design variables. The constraints may represent, e.g., physical restrictions in a hardware implementation of the lithographic projection apparatus. The constraints may include one or more selected from: a tuning range, a rules governing patterning device manufacturability (MRC), and/or interdependence between two or more design variables.

The optimization process therefore is to find a set of values of the design variables, under the constraints $(z_1, z_2, \ldots, z_N) \in Z$, that, e.g., minimize the objective function, i.e., to find $$(\tilde{z}_1, \tilde{z}_2, \ldots, \tilde{z}_N) = \arg\min_{(z_1, z_2, \ldots, z_N) \in Z} CF(z_1, z_2, \ldots, z_N) = \arg\min_{(z_1, z_2, \ldots, z_N) \in Z} \sum_{p=1}^{P} w_p f_p^2(z_1, z_2, \ldots, z_N) \quad (17)$$

Figure 33:
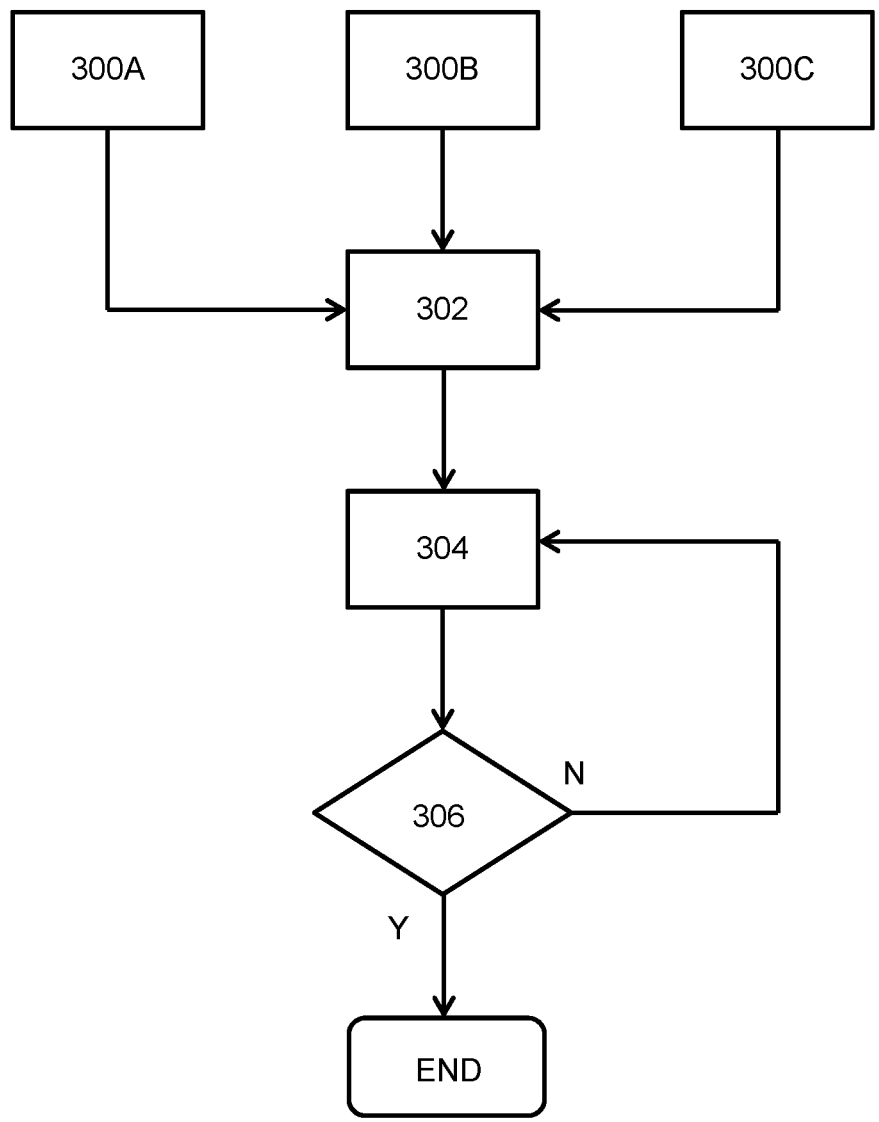
FIG. 33 shows a flow chart of a general method of optimizing the lithography projection apparatus, according to an embodiment.

A general method of optimizing the lithography projection apparatus, according to an embodiment, is illustrated in FIG. 33. This method comprises a step 302 of defining a multi-variable objective function of a plurality of design variables. The design variables may comprise any suitable combination selected from: one or more characteristics of the illumination mode (300A) (e.g., pupil fill ratio, namely percentage of radiation of the illumination that passes through a pupil or aperture), one or more characteristics of the projection optics (300B) and/or one or more characteristics of the patterning device pattern (300C). For example, the design variables may include characteristics of the illumination mode (300A) and characteristics of the patterning device pattern (300C) (e.g., global bias) but not characteristics of the projection optics (300B), which leads to a SMO. Alternatively, the design variables may include characteristics of the illumination mode (300A), characteristics of the projection optics (300B) and characteristics of the patterning device pattern (300C), which leads to an optimization of the illumination, the patterning device pattern and the projection optics (sometimes referred to as a source-mask-lens optimization (SMLO)). In step 304, the design variables are simultaneously adjusted so that the objective function is moved towards convergence. In step 306, it is determined whether a predefined termination condition is satisfied. The predetermined termination condition may include various possibilities, e.g., the objective function may be minimized or maximized, as required by the numerical technique used, the value of the objective function is equal to a threshold value or has crossed the threshold value, the value of the objective function has reached within a preset error limit, and/or a preset number of iterations of the objective function evaluation is reached. If a termination condition in step 306 is satisfied, the method ends. If the termination condition in step 306 is not satisfied, the steps 304 and 306 are iteratively repeated until a desired result is obtained. The optimization does not necessarily lead to a single set of values for the design variables because there may be physical restraints caused by factors such as the pupil fill factor, the resist chemistry, the throughput, etc. The optimization may provide multiple sets of values for the design variables and associated performance characteristics (e.g., the throughput) and allows a user of the lithographic apparatus to pick one or more sets.

In an embodiment, instead of, or in addition to, calculating and/or determining the effect on the optical characteristics of the illumination system and/or projection optics, it is envisioned that adjustable optical characteristics of the illumination system and/or projection optics can be included in the design variables. Exemplary adjustable optical characteristics may include one or more lens manipulators, temperature data or a signal associated with temperature data of one or more devices, e.g. a heater, utilized to control the temperature of an optical element of the illumination system and/or projection system, one or more Zernike coefficients, etc. The SMO or SMLO procedure can then be carried out and the design variables, including the adjustable optical characteristics, can be simultaneously adjusted so that the objective function is moved towards convergence.

In FIG. 33, the optimization of all the design variables is executed simultaneously. Such flow may be called the simultaneous optimization, joint optimization, or co-optimization. The terms "simultaneous", "simultaneously", "joint" and "jointly" as used herein mean that the design variables of the characteristics of the illumination mode, patterning device, projection optics and/or any other design variables, are allowed to change at the same time.

Figure 34:
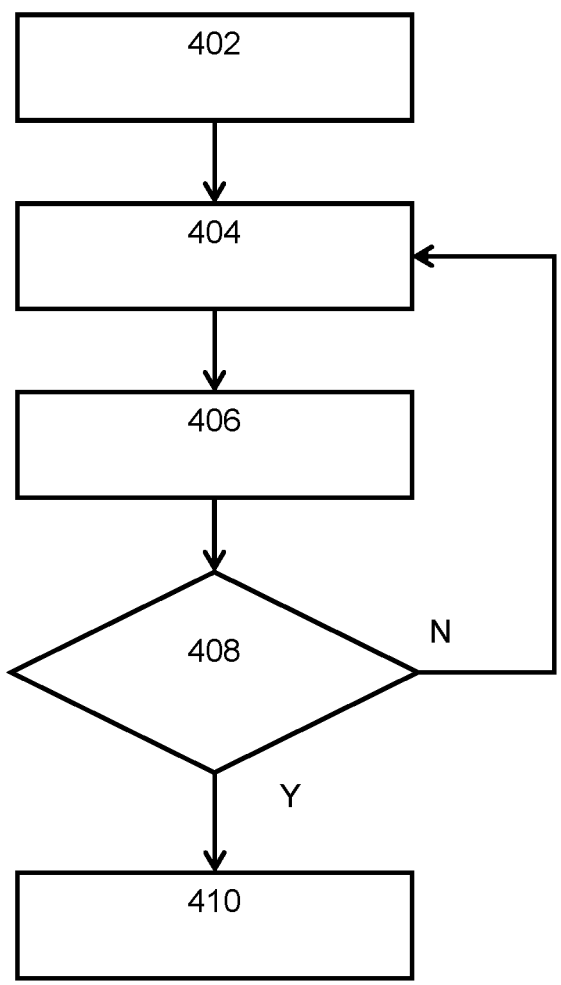
FIG. 34 shows a flow chart of a method of optimizing the lithography projection apparatus where the optimization of all the design variables is executed alternately, according to an embodiment.

Alternatively, the optimization of all the design variables is executed alternately, as illustrated in FIG. 34. In this flow, in each step, some design variables are fixed while the other design variables are optimized as part of evaluation of the objective function; then in the next step, a different set of variables are fixed while the others are optimized as part of evaluation of the objective function. These steps are executed alternately until convergence or certain terminating conditions are met. As shown in the non-limiting example flowchart of FIG. 34, first, a patterning device pattern (step 402) is obtained, then a step of illumination mode optimization is executed in step 404, where all the design variables of the illumination mode are optimized (SO) as part of evaluation of a suitable objective function while all the other design variables are fixed. Then in the next step 406, a mask optimization (MO) is performed, where all the design variables of the patterning device are optimized as part of evaluation of a suitable objective function while all the other design variables are fixed. These two steps are executed alternately, until certain terminating conditions are met in step 408. Various termination conditions can be used, such as, the value of the objective function becomes equal to a threshold value, the value of the objective function crosses the threshold value, the value of the objective function reaches within a preset error limit, or a preset number of iterations of evaluation of the objective function is reached, etc. Note that SO-MO-Alternate-Optimization is used as an example for the alternative flow. The alternate flow can take many different forms, such as SO-LO-MO-Alternate-Optimization, where SO, LO (Lens Optimization) is executed, and MO alternately and iteratively; or first SMO can be executed once, then execute LO and MO alternately and iteratively; and so on. Finally the output of the optimization result is obtained in step 410, and the process stops.

The pattern selection algorithm, as discussed before, may be integrated with the simultaneous or alternate optimization. For example, when an alternate optimization is adopted, first a full-chip SO can be performed, the 'hot spots' and/or 'warm spots' are identified, then a MO is performed. In view of the present disclosure numerous permutations and combinations of sub-optimizations are possible in order to achieve the desired optimization results.

Figure 35:
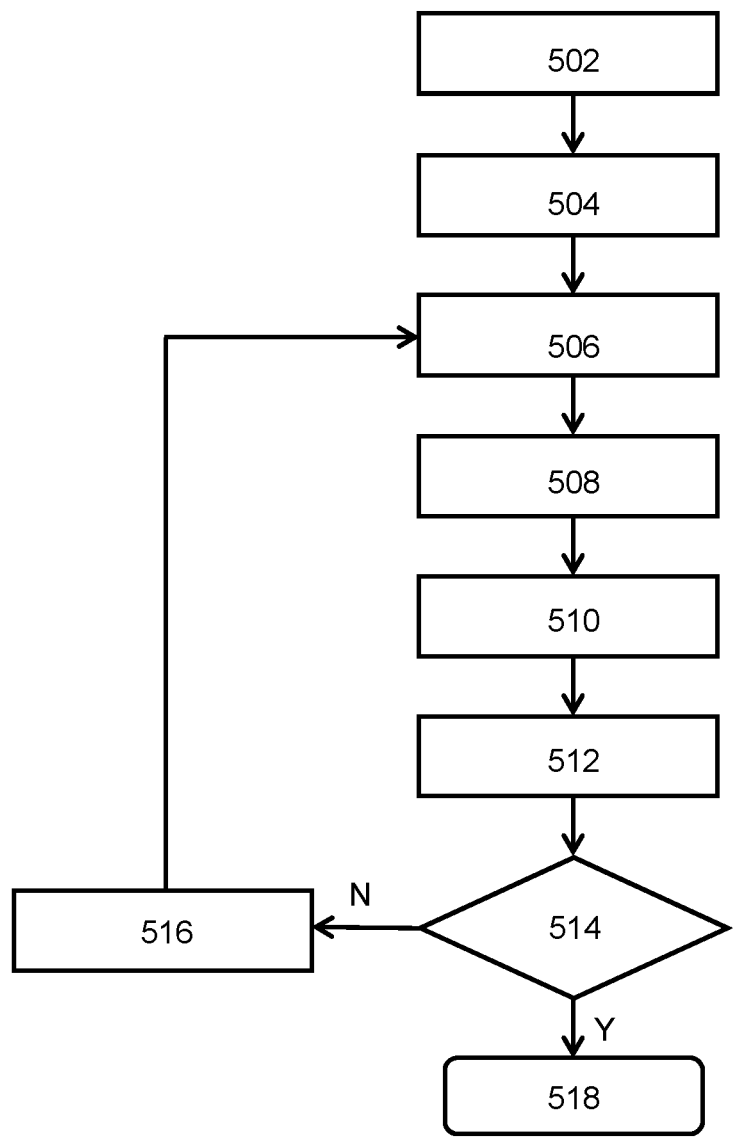
FIG. 35 shows one exemplary method of optimization, according to an embodiment.

FIG. 35 shows one exemplary method of optimization, where an objective function is defined and evaluated. In step 502, initial values of design variables are obtained, including their tuning ranges, if any. In step 504, the multi-variable objective function is set up. In step 506, the objective function is expanded within a small enough neighborhood around the starting point value of the design variables for the first iterative step (i=0). In step 508, standard multi-variable optimization techniques are applied to minimize or maximize the objective function. Note that the optimization can have constraints, such as tuning ranges, during the optimization process in 508 or at a later stage in the optimization process. Each iteration is evaluated using given test patterns (also known as "gauges") for the identified evaluation points that have been selected to optimize the lithographic process. In step 510, a lithographic response (e.g., one or more certain characteristics of an aerial image, one or more certain characteristics of a resist image, or one or more certain characteristics of the lithographic process such as the process window) is predicted. In step 512, the result of step 510 is compared with a desired or ideal lithographic response value. If the termination condition is satisfied in step 514, i.e. the optimization generates a lithographic response value sufficiently close to the desired value, and then the final value of the design variables is outputted in step 518. The output step may also include outputting other functions using the final values of the design variables, such as outputting a wavefront aberration-adjusted map at the pupil plane (or other planes), an optimized illumination mode map, an optimized patterning device pattern (e.g., including optical proximity corrections), etc. If the termination condition is not satisfied, then in step 516, the values of the design variables is updated with the result of the i-th iteration, and the process goes back to step 506. An algorithm, such as the Gauss-Newton algorithm, the Levenberg-Marquardt algorithm, the gradient descent algorithm, simulated annealing, the genetic algorithm, etc. can be applied to evaluate and solve the objective function.

Optimizing a patterning process can expand the process window. A larger process window provides more flexibility in process design and device design. The process window can be defined as a set of focus and dose values for which the resist image are within a certain limit of the design target of the resist image. Note that all the methods discussed here may also be extended to a generalized process window definition that can be established by different or additional base parameters in addition to or other than exposure dose and defocus. These may include, but are not limited to, optical settings such as NA, optical sigma, optical aberrations, polarization, or optical constants of the resist layer. For example, as described earlier, if the PW also involves different mask bias, then the optimization can include the minimization of MEEF. The process window defined on focus and dose values only serve as an example in this disclosure.

A method of maximizing the process window, according to an embodiment, is described below. In a first step, starting from a known condition $(f_0, \varepsilon_0)$ in the process window, wherein $f_0$ is a nominal focus and $\varepsilon_0$ is a nominal dose, there is performed minimization of one of the example objective functions below in the vicinity $(f_0 \pm \Delta f, \varepsilon_0 \pm \varepsilon)$:

$$CF(z_1, z_2, \ldots, z_N, f_0, \varepsilon_0) = \min_{(f,\varepsilon)=(f_0\pm\Delta f,\varepsilon_0\pm\varepsilon)} (\max \max_p |f_p(z_1, z_2, \ldots, z_N, f, \varepsilon)|) \quad (18)$$

or $$CF(z_1, z_2, \ldots, z_N, f_0, \varepsilon_0) = \min\left(\max\left(\sum_{(f,\varepsilon)=(f_0\pm\Delta f,\varepsilon_0\pm\varepsilon)} \sum_p w_p f_p^2(z_1, z_2, \ldots, z_N, f, \varepsilon)\right)\right) \quad (19)$$

If the nominal focus $f_0$ and nominal dose $\varepsilon_0$ are allowed to shift, they can be optimized jointly with the design variables $(z_1, z_2, \ldots, z_N)$. In the next step, $(f_0 \pm \Delta f, \varepsilon_0 \pm \varepsilon)$ is accepted as part of the process window, if a set of values of $(z_1, z_2, \ldots, z_N, f, \varepsilon)$ can be found such that the objective function is within a preset limit.

Alternatively, if the focus and dose are not allowed to shift, the design variables $(z_1, z_2, \ldots, z_N)$ are optimized with the focus and dose fixed at the nominal focus $f_0$ and nominal dose $\varepsilon_0$. In an alternative embodiment, $(f_0 \pm \Delta f, \varepsilon_0 \pm \varepsilon)$ is accepted as part of the process window, if a set of values of $(z_1, z_2, \ldots, z_N)$ can be found such that the objective function is within a preset limit.

The methods described earlier in this disclosure can be used to minimize the respective objective functions of equation (18) or (19). If the design variables are characteristics of the projection optics, such as the Zernike coefficients, then minimizing the objective functions of equation (18) or (19) leads to process window maximization based on projection optics optimization, i.e., LO. If the design variables are characteristics of the illumination mode and patterning device pattern in addition to those of the projection optics, then minimizing the objective function of equation (18) or (19) leads to process window maximizing based on SMLO. If the design variables are characteristics of the illumination mode and the patterning device pattern, then minimizing the objective functions of equation (18) or (19) leads to process window maximization based on SMO.

The optimization described above may be used to find a set of values of $(z_1, z_2, \ldots, z_N)$ to reduce many physical effects that may be adverse to the lithographic process. Multiple optimizations may be conducted in series for different physical effects, on different components of the lithographic apparatus, and under different conditions.

The methods related to the source/mask/source-mask optimization, discussed above, include the use of linearized functions selected to optimize the printed wafer contour throughout the process window. The merit function is typically based on a pure optical model because optics in photolithography systems tend to determine a majority of the process constraints. In one example, the merit function may be selected to reduce the worst edge placement error of a design layout throughout the process window.

Figure 36:
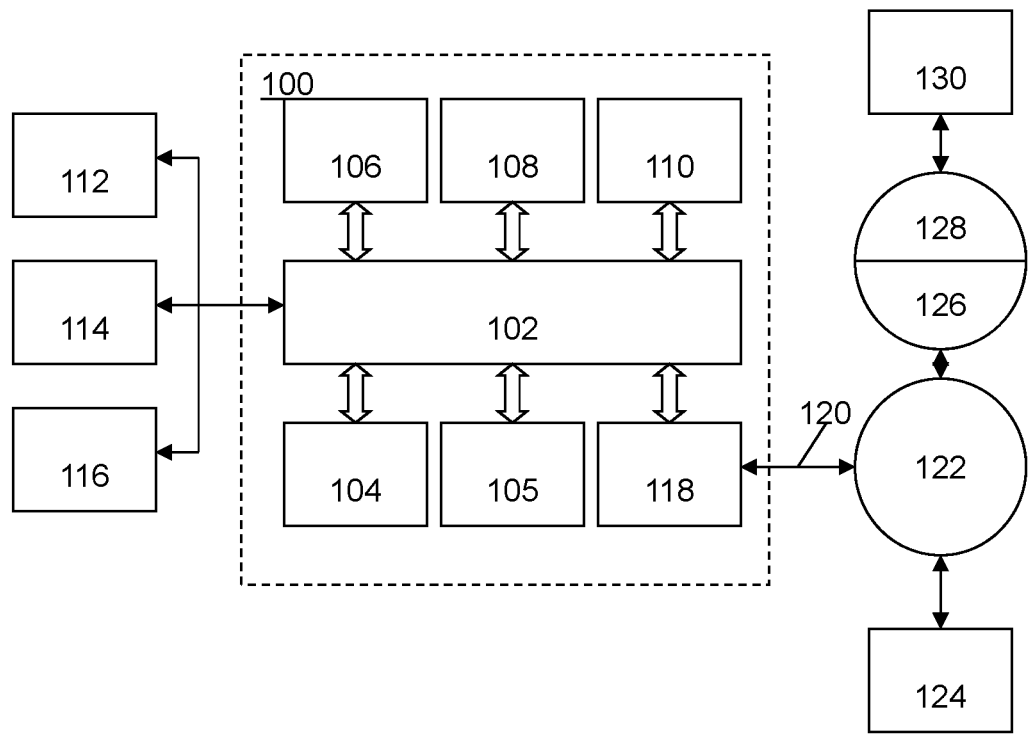
FIG. 36 is a block diagram of an example computer system, according to an embodiment.

FIG. 36 is a block diagram that illustrates a computer system 100 which can assist in implementing methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions.

The instructions received by main memory 106 may optionally be stored on storage device 110 either before or after execution by processor 104.

Computer system 100 also desirably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are example forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 37:
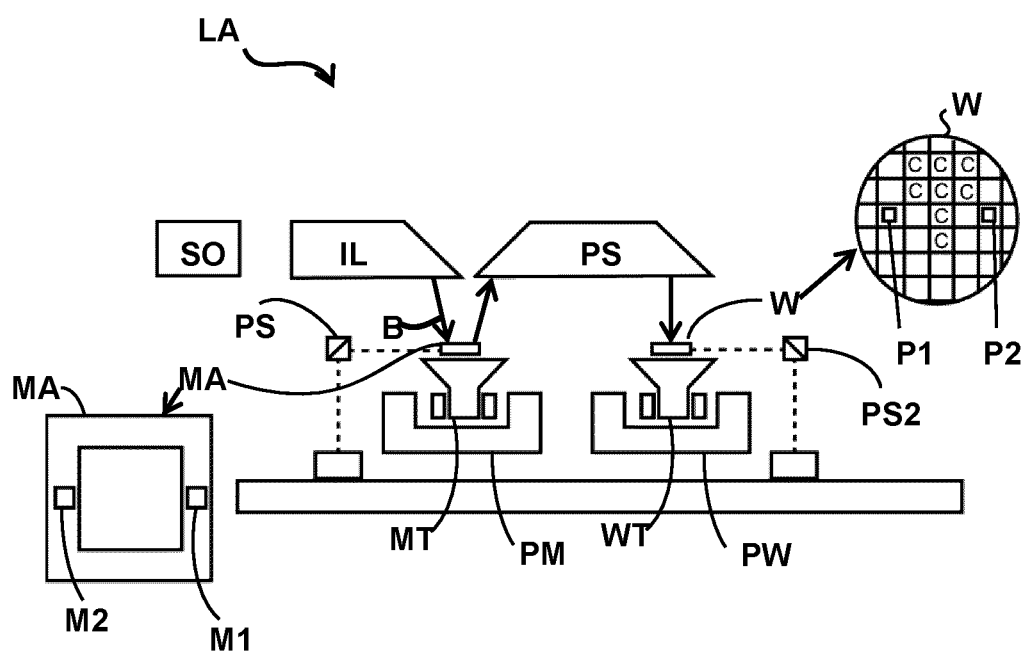
FIG. 37 is a schematic diagram of another lithographic projection apparatus, according to an embodiment.

FIG. 37 schematically depicts another exemplary lithographic projection apparatus LA that includes:
- a source collector module SO to provide radiation.
- an illumination system (illuminator) IL configured to condition a radiation beam B (e.g. EUV radiation) from the source collector module SO.
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

As here depicted, the apparatus LA is of a reflective type (e.g. employing a reflective mask). It is to be noted that because most materials are absorptive within the EUV wavelength range, the patterning device may have multi-layer reflectors comprising, for example, a multi-layer stack of molybdenum and silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 26, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 26, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the radiation source may be an integral part of the source collector module, for example when the radiation source is a discharge produced plasma EUV generator, often termed as a DPP radiation source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LA could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 38:
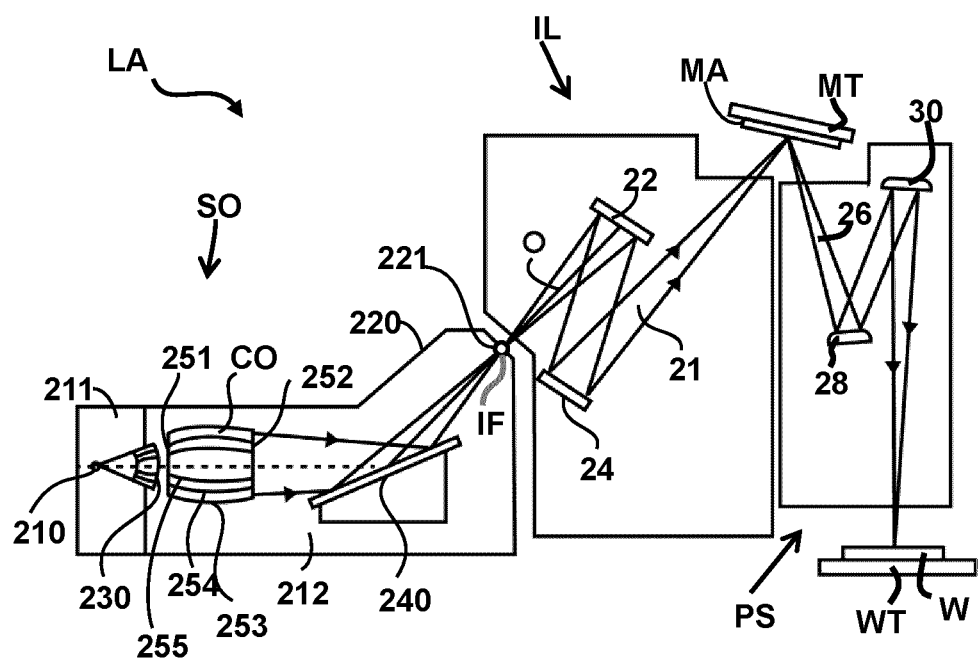
FIG. 38 is a more detailed view of the apparatus in FIG. 37, according to an embodiment.

FIG. 38 shows the apparatus LA in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma radiation source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 38.

Collector optic CO, as illustrated in FIG. 38, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is desirably used in combination with a discharge produced plasma radiation source.

Figure 39:
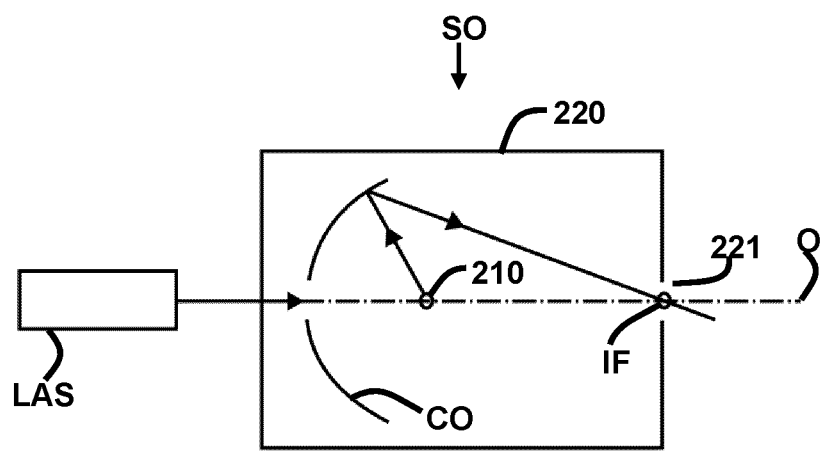
FIG. 39 is a more detailed view of the source collector module of the apparatus of FIG. 37 and FIG. 38, according to an embodiment.

Alternatively, the source collector module SO may be part of an LPP radiation system as shown in FIG. 39. A laser LAS is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although specific reference may be made in this text to the use of embodiments in the manufacture of ICs, it should be understood that the embodiments herein may have many other possible applications. For example, it may be employed in the manufacture of integrated optical systems, guidance and detection patterns for magnetic domain memories, liquid-crystal displays (LCDs), thin film magnetic heads, micromechanical systems (MEMs), etc. The skilled artisan will appreciate that, in the context of such alternative applications, any use of the terms "reticle", "wafer" or "die" herein may be considered as synonymous or interchangeable with the more general terms "patterning device", "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create, for example, a multi-layer IC, so that the term substrate used herein may also refer to a substrate that already contains multiple processed layers.

In the present document, the terms "radiation" and "beam" as used herein encompass all types of electromagnetic radiation, including ultraviolet radiation (e.g. with a wavelength of about 365, about 248, about 193, about 157 or about 126 nm) and extreme ultra-violet (EUV) radiation (e.g. having a wavelength in the range of 5-20 nm), as well as particle beams, such as ion beams or electron beams.

The terms "optimizing" and "optimization" as used herein refers to or means adjusting a patterning apparatus (e.g., a lithography apparatus), a patterning process, etc. such that results and/or processes have more desirable characteristics, such as higher accuracy of projection of a design pattern on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein. Thus, embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Embodiments of the present disclosure may be further described by the following clauses.

1. A method of calibrating a simulation process, the method comprising:
    obtaining: (i) characteristic limits of a characteristic of a printed pattern based on a threshold failure rate of the printed pattern, and (ii) a reference process window based on the characteristic limits; and
    calibrating the simulation process such that a simulated process window is within an acceptable threshold of the reference process window, the calibrating of the simulation process comprising:
        executing, one or more process models, to determine the simulated pattern; and
        adjusting parameter values associated with the one or more process models based on a characteristic of the simulated pattern and the characteristic limits.
2. The method of clause 1, wherein the simulation process comprises: a source mask optimization process and an optical proximity correction process that are configured to adjust mask parameters, source parameters, or process parameters to cause the printed pattern to be within an acceptable threshold of a target characteristic value.
3. The method of clause 1, wherein the one or more process model includes a characteristic model, the characteristic model being fitted based on the simulated pattern and the characteristic limits associated with the printed pattern.
4. The method of clause 3, wherein the characteristic model is determined by fitting parameters of the characteristic model based on the characteristic of the simulated pattern and the characteristic of the printed pattern.
5. The method of clause 4, wherein the characteristic of the simulated pattern and the printed pattern is a critical dimension, an edge placement error between two patterns on different layers of a substrate, or a pattern placement error between two patterns on same or different layers of the substrate.
6. The method of clause 5, wherein the simulated pattern comprises a profile of the pattern within a layer of the substrate.
7. The method of clause 6, wherein the characteristic of the simulated pattern comprises a difference between a first characteristic at a top of the layer and a second characteristic at a bottom of the layer.
8. The method of clause 1, wherein the parameter of the one or more process models comprises one or more of:
    a parameter of the characteristic model;
    an aerial image parameter associated with an aerial model associated with the patterning process;
    a resist parameter associated with a resist model associated with the patterning process; and
    an etch parameter associated with an etch model associated with the patterning process.
9. The method of clause 8, wherein the parameter of the one or more process models comprises one or more parameters selected from a blur of an aerial image, a resist thickness, or an absorption amount related to resist.
10. The method of clause 1, wherein the obtaining of the characteristic limits of the characteristic of the printed pattern comprises:
    printing, via a lithographic apparatus, selected patterns of a target layout on a substrate;
    determining, based on inspection data of the printed patterns, failure rates of each selected pattern;
    fitting, based on the failure rates and the characteristic of each selected pattern, a failure rate model configured to determine a failure rate associated with a characteristic of a pattern; and
    executing the failure rate model to determine the characteristic limits of the characteristic of the selected patterns such that the threshold failure rate is satisfied.
11. The method of clause 1, wherein the obtaining of the reference process window comprises:
    determining, based on inspection data associated with a printed substrate, values of dose and focus corresponding to the characteristic of each selected pattern that satisfy the characteristic limits.
12. The method of clause 1, wherein the calibrating of the simulation process is an iterative process, an iteration comprising:
    (a) executing, the one or more process models using a selected pattern to be printed on a substrate, to determine the simulated pattern on the substrate;
    (b) adjusting values of the parameters associated with the one or more process models such that the characteristic of the simulated pattern satisfy the characteristic limits associated with the selected pattern;
    (c) determining, based on the characteristic of the simulated pattern, the simulated process window and whether the simulated process window is within an acceptable threshold of the reference process window; and
    (d) responsive to the acceptable threshold not being satisfied, performing steps (a)-(c).
13. The method of clause 1, wherein the adjusting of the parameters of the one or more process models comprises:
    adjusting values of parameters associated with the characteristic model such that a margin between the characteristic of the simulated pattern at a top and at a bottom is maximized with respect to the characteristic limits.
14. The method of clause 1, further comprising:
    obtaining a set of hot spot patterns, each hot spot pattern being a user-selected pattern from a target layout and/or a pattern associated with relatively higher probability of failure compared to other patterns of the target layout;
    determining, by simulating the calibrated simulation process using the set of hot spot patterns and the failure rate model, a defect-based process window for each hot spot pattern; and
    determining, based on overlapping of each defect-based process window, optimal values of one or more process variables associated with the threshold failure rate.
15. The method of clause 14, wherein the one or more process variable is selected from: a best focus, a best dose, a dose-focus window characterized by the threshold failure rate, aberrations of a lens system, level settings, overlay setting.
16. The method of clause 1, further comprising:
    determining, based on the failure rate model, yield associated with each hot spot pattern;
    determining a total yield of a full chip layout by computing a product of each yield associated with each hot spot pattern across the full chip layout.
17. The method of clause 1, further comprising:
    determining, by simulating the calibrated simulation process, whether a margin is available to adjust the characteristic of a retargeted pattern to cause a target characteristic value to be printed on a substrate; and
    responsive to the margin not being available, determining, via simulating the calibrated simulation process using the retargeted pattern, adjustments to a process associated with the patterning process such that the target characteristic value will be printed on the substrate.

18. The method of clause 17, wherein adjustments to the process comprises at least one of: adjusting an etch bias at an after development image, including an isotropic etchback or a spacer process, an amount of process loading, an etch rate, a deposition rate, and an angle of incidence of etching or deposition.

19. The method of clause 1, further comprising:
simulating the calibrated simulation process using a full chip layout to determine a residual error between simulated characteristic values and target characteristic values associated with the full chip layout;
determining, via lithography manufacturing check, whether the simulated characteristic values associated with the full chip layout satisfy a desired yield; and
responsive to the desired yield not satisfied, adjusting, via the calibrated simulation process, source parameters, mask parameters, or process parameters to reduce the residual error such that the desired yield is satisfied.

20. A method for generating a retargeted pattern associated with a patterning process, the method comprising:
obtaining (i) characteristic limits associated with a target pattern, the characteristic limits being values of the characteristic beyond which a printed pattern corresponding to the target pattern is considered as defective, and (ii) a source mask optimization (SMO) process configured to compute dose and/or mask parameters based on a threshold failure rate associated with the characteristic of the target pattern; and
generating, by simulating the source mask optimization process using the target pattern, the retargeted pattern the characteristic associated with the retargeted pattern fall further within the characteristic limits associated with the target pattern.

21. The method of clause 20, wherein the characteristic limits is obtained based on a failure rate model, the failure rate model being calibrated using failure rate data associated with the printed pattern on a substrate and the threshold failure rate, the printing being performed using an initial SMO data.

22. The method of clause 20, wherein the obtaining of the source mask optimization (SMO) process comprises:
including an dose excursion equation to compute dose based on a probability density function (PDF) of a characteristic, local critical dimension uniformity, dose sensitivity of the characteristic of a pattern, and the threshold failure rate.

23. The method of clause 22, wherein the dose excursion equation is given by:

$$dose_{EV} = \frac{LCDU_{dose}3\sigma}{NDS} \cdot CDF^{-1}(1 - FR_{target})/3$$

wherein $dose_{EV}$ represents a dose value at the threshold failure rate $FR_{target}$ and at an extreme value excursion associated with the characteristic value at 3 standard deviations from an average characteristic value, NDS is the dose sensitivity of the characteristic of a pattern, $LCDU_{dose}$ 3σ represents a variation associated with the characteristic value at 3 standard deviations from an average characteristic value and at a particular dose, and CDF represents a cumulative distribution function of the PDF of the characteristic.

24. The method of clause 22, wherein the dose excursion equation is given by:

$$dose_{EV} = \frac{LCDU_{dose}}{LCDU_{total}} \cdot \frac{LCDU_{dose}3\sigma}{NDS} \cdot CDF^{-1}(1 - FR_{target})/3^2$$

wherein $dose_{EV}$ represents a dose value at the threshold failure rate $FR_{target}$ and at an extreme value excursion associated with the characteristic value at 3 standard deviations from an average characteristic value, NDS is the dose sensitivity of the characteristic of a pattern, $LCDU_{dose}$ represents a variation in the characteristic at a particular dose, $LCDU_{total}$ represents a total variation in the characteristic of the pattern, $LCDU_{dose}$ 3σ represents a variation associated with the characteristic value at 3 standard deviations from an average characteristic value and at a particular dose, and CDF represents a cumulative distribution function of the PDF of the characteristic.

25. The method of clause 20, wherein the obtaining of the source mask optimization (SMO) process comprises:
including a mask bias excursion equation to compute a mask characteristic based on a probability density function of a characteristic (PDF), local CD uniformity caused by a mask bias and the threshold failure rate.

26. The method of clause 25, wherein the mask bias excursion equation is given by:

$$mask_{EV} = \frac{LCDU_{mask@W}}{LCDU_{total}} \cdot LCDU_{mask@W} \cdot CDF^{-1}(1 - FR_{target})/3^2$$

wherein $mask_{EV}$ represents a mask bias at the threshold failure rate $FR_{target}$ and at an extreme value excursion associated with the characteristic value at 3 standard deviations from an average characteristic value, $LCDU_{mask@W}$ is variation in the characteristic at associated with a resist pattern caused due to the mask bias, $LCDU_{total}$ represents a total variation in the characteristic of the pattern, and CDF represents a cumulative distribution function of the PDF of the characteristic.

27. The method of clause 20, wherein the retargeted pattern is generated such that margins associated with the characteristic limits at the threshold failure rate are increased, the generating of the retargeted pattern comprises:
simulating, using an initial SMO data, the source mask optimization process to determine excursions in a characteristic associated with the target pattern at the threshold failure rate;
determining the margins between the characteristic limits and the excursions at the threshold failure rate; and
adjusting a characteristic value of the target pattern such that the margins are increased without exceeding the characteristic limits associated with the target pattern, the adjusted characteristic value being used to generate the retargeted pattern.

28. The method of clause 20, wherein the generating of the retargeted pattern is an iterative process, an iteration comprising:
(a) simulating the source mask optimization process, using the initial SMO data including an optimized source, and optimized mask parameters, and an initial target pattern or a retargeted pattern as input, to determine excursions in a characteristic associated with the target pattern at the threshold failure rate;
(b) determining the margins between the characteristic limits and the excursions of the characteristic at the threshold failure rate;

(c) adjusting a characteristic value of the target pattern such that the margins are increased without exceeding the characteristic limits associated with the target pattern, the adjusted characteristic value being used to generate the retargeted pattern; and
(d) responsive to the margins exceeding the characteristic limits or not being maximized, performing steps (a)-(c).

29. The method of clause 28, wherein a margin between the characteristic limit of the characteristics and an extreme value of the characteristic is maximized, the extreme value of the characteristic being a value caused by contributors from one or more process variables the threshold failure rate.

30. The method of clause 20, wherein the extreme value of the characteristic is caused by focus, dose, a moving standard deviation (MSD) of the error between the measured value and a target value, a resist-thickness, and/or resist constituents including acids or quencher.

31. The method of clause 20, further comprising:
   simulating the source mask optimization (SMO) process using the retargeted pattern to determine simulated characteristic values associated with a full chip layout;
   determining, via lithography manufacturing check, whether the simulated characteristic values associated with the full chip layout satisfy a desired yield; and
   responsive to the desired yield not satisfied, adjusting source parameters, mask parameters, or process parameters such that the desired yield is satisfied, the adjusted source parameters, mask parameters, or process parameters being used to generate an optimized source, an optimized illumination pupil, and/or an optimized mask.

32. A method for adjusting a process window, comprising:
   obtaining: (i) a dose probability density function (dose PDF) to determine a probability of dose, the dose PDF being a function of (a) a characteristic of a feature and (b) a deviation of a mask characteristic, the mask characteristic being associated with a mask used to print the feature on a substrate, (ii) a mask probability density function (mask PDF) to determine a probability in the deviation of the mask characteristic;
   determining the probability density function associated with the characteristic by convoluting (i) the dose PDF and (ii) the mask PDF over a given range of mask characteristic values; and
   adjusting, based on the determined probability density function associated with the characteristic, a process window associated with a patterning process.

33. The method of clause 32, wherein the mask PDF incorporates dependency of a non-linear mask error enhancement factor (MEEF) that causes a skewness in the mask PDF, wherein the non-linear MEEF is computed using an inverse function of a relation between the mask characteristic and the characteristic of the printed on the substrate.

34. The method of clause 33, wherein the mask PDF can be computed by:

$$PDF_{mask}(\delta CD_{mask}) =$$

$$G_{mask}(g_{mask}(\delta CD_{mask}); \mu_{mask}, \sigma_{mask}) * \left| \frac{\partial}{\partial mask} g_{mask}(\delta CD_{mask}) \right|$$

wherein $G_{mask}$ is a Gaussian distribution of the mask characteristic, a mean of $G_{mask}$, $\mu_{mask}$, is computed based on an inverse function of a relation between the mask characteristic and the characteristic of the printed on the substrate represented by $g_{mask}(\delta CD_{mask})$, a standard deviation of $G_{mask}$ is $\sigma_{mask}$, which is the standard deviation determined based on the inverse function and the measured standard deviation of $\delta CD_{mask}$, and $$\left| \frac{\partial}{\partial mask} g_{mask}(\delta CD_{mask}) \right|$$

determines the non-linear MEEF.

35. The method of clause 32, wherein the dose PDF incorporates dependency of local critical dimension uniformity (LCDU) related to a resist pattern on the substrate, the LCDU being caused by the mask characteristic.

36. The method of clause 35, wherein the dose PDF is determined using a normal distribution or Poisson distribution having a mean dose and a dose standard deviation, the mean dose being determined by an inverse function of the relation between the dose and CD for a given deviation in the mask characteristic, and the dose standard deviation being determined by based on LCDU related to the resist pattern on the substrate that is caused by the mask characteristic.

37. The method of clause 36, wherein the dose PDF can be computed by $$PDF_{dose}(g_d(CD, \delta CD_{mask}); \mu_d(\delta CD_{mask}), \sigma_d(\delta CD_{mask}))$$

Wherein the dose $g_d(CD, \delta CD_{mask})$ is determined using an inverse function of the relation between the dose and the characteristic CD of the feature for a given deviation in the mask characteristic $\delta CD_{mask}$, and the dose standard deviation $\sigma_d$ is based on the inverse function $g_d(CD, \delta CD_{mask})$ and the measured standard deviation $\sigma_{CD}^{resist}(\delta CD_{mask})$, wherein $\sigma_{CD}^{resist}(\delta CD_{mask})$ represents the LCDU ($1\sigma$) caused due to dose and resist variations for a given mask deviation.

38. The method of clause 32, further comprising:
   executing, using failure rate data associated with a target layout, the determined probability density function to determine characteristic limits associated with a threshold failure rate.

39. A method for adjusting a process window, comprising:
   obtaining: (i) a plurality of dose-focus settings, and (ii) a reference distribution based on measured values of the characteristic of a printed pattern associated with each setting of the plurality of dose-focus settings;
   determining, based on an adjustment model and the plurality of dose-focus settings, the probability density function (PDF) of the characteristic such that an error between the PDF and the reference distribution is reduced, the PDF being a function of the adjustment model and variance associated with dose, the adjustment model being configured to change a proportion of non-linear dose sensitivity contribution to the PDF; and
   adjusting, based on the determined PDF of the characteristic, a process window associated with a patterning process.

40. The method of clause 39, wherein the determining of the PDF is an iterative process, an iteration comprises:
   determining, based on the adjustment model, an adjustment value for a given dose focus setting of the plurality of dose-focus settings;
   determining, based on the adjustment value, the PDF of the characteristic of a pattern;
   determining the error between the PDF and the reference distribution; and adjusting, parameters of the adjustment model, for the given dose and focus setting of the plurality of dose-focus settings such that the error is minimized.
41. The method of clause 39, wherein the PDF is a convolution of a first PDF and a second PDF, wherein the first PDF is a function of a first variation, the first variation being a product of the adjustment model and variation of dose, and the second PDF is a function of a second variation associated with factors other than dose contributing to variation in the characteristic of a pattern.
42. The method of clause 41, wherein the determining of the PDF is an iterative process, an iteration comprises:
  convoluting the first PDF and the second PDF to determine the PDF of the characteristic of a pattern;
  determining the error between the PDF and the reference distribution; and
  adjusting parameters of the first variation and the second variation for a given dose and focus setting of the plurality of dose-focus settings such that the error is minimized.
43. The method of any of clauses 40-42, wherein the adjusting of the parameters of the adjustment model for the plurality of dose-focus settings is performed by an optimization algorithm selected from: adaptive moment estimation or a gradient decent method.
44. The method of clause 39, wherein the adjustment model is a polynomial function of dose and focus.
45. The method of clause 42, further comprising:
  determining a plurality of adjustment values associated with the PDF having minimum error with respect to the reference distribution for each dose and each focus setting of the plurality of dose-focus settings; and
  fitting, based on the plurality of adjustment values, a polynomial function of dose and focus to determine the adjustment model such that a difference between the fitted polynomial function and the plurality of adjustment model values is minimized.
46. The method of clause 39, further comprising:
  executing, using failure rate data associated with the pattern, the determined probability density function to determine characteristic limits associated with a threshold failure rate.
47. A non-transitory computer-readable medium comprising instructions that, when executed by one or more processors, cause operations comprising:
  obtaining: (i) characteristic limits of a characteristic of a printed pattern based on a threshold failure rate of the printed pattern, and (ii) a reference process window based on the characteristic limits; and
  calibrating the simulation process such that a simulated process window is within an acceptable threshold of the reference process window, the calibrating of the simulation process comprising:
    executing, one or more process models, to determine the simulated pattern; and
    adjusting parameter values associated with the one or more process models until a characteristic of the simulated pattern satisfies the characteristic limits.
48. The non-transitory computer-readable medium of clause 47, wherein the simulation process comprises: a source mask optimization process and an optical proximity correction process that are configured to adjust mask parameters, source parameters, or process parameters to cause the printed pattern to be within an acceptable threshold of a target characteristic value.
49. The non-transitory computer-readable medium of clause 47, wherein the one or more process model includes a characteristic model, the characteristic model being fitted based on the simulated pattern and the characteristic limits associated with the printed pattern.
50. The non-transitory computer-readable medium of clause 49, wherein the characteristic model is determined by fitting parameters of the characteristic model based on the characteristic of the simulated pattern and the characteristic of the printed pattern.
51. The non-transitory computer-readable medium of clause 50, wherein the characteristic of the simulated pattern and the printed pattern is a critical dimension, an edge placement error between two patterns on different layers of a substrate, or a pattern placement error between two patterns on same or different layers of the substrate.
52. The non-transitory computer-readable medium of clause 51, wherein the simulated pattern comprises a profile of the pattern within a layer of a substrate.
53. The non-transitory computer-readable medium of clause 52, wherein the characteristic of the simulated pattern comprises a difference between a first characteristic at a top of the layer and a second characteristic at a bottom of the layer.
54. The non-transitory computer-readable medium of clause 47, wherein the parameter of the one or more process models comprises one or more of:
  a parameter of the characteristic model;
  an aerial image parameter associated with an aerial model associated with the patterning process;
  a resist parameter associated with a resist model associated with the patterning process; and
  an etch parameter associated with an etch model associated with the patterning process.
55. The non-transitory computer-readable medium of clause 54, wherein the parameter of the one or more process models comprises one or more parameters selected from a blur of an aerial image, a resist thickness, or an absorption amount related to resist.
56. The non-transitory computer-readable medium of clause 47, wherein the obtaining of the characteristic limits of the characteristic of the printed pattern comprises:
  printing, via a lithographic apparatus, selected patterns of a target layout on a substrate;
  determining, based on inspection data of the printed patterns, failure rates of each selected pattern;
  fitting, based on the failure rates and the characteristic of each selected pattern, a failure rate model configured to determine a failure rate associated with a characteristic of a pattern; and
  executing the failure rate model to determine the characteristic limits of the characteristic of the selected patterns such that the threshold failure rate is satisfied.
57. The non-transitory computer-readable medium of clause 47, wherein the obtaining of the reference process window comprises:
  determining, based on inspection data associated with a printed substrate, values of dose and focus corresponding to the characteristic of each selected pattern that satisfy the characteristic limits.
58. The non-transitory computer-readable medium of clause 47, wherein the calibrating of the simulation process is an iterative process, an iteration comprising:
  (a) executing, the one or more process models using a selected pattern to be printed on a substrate, to determine the simulated pattern on the substrate;
  (b) adjusting values of the parameters associated with the one or more process models such that the characteristic of the simulated pattern satisfy the characteristic limits associated with the selected pattern;

(c) determining, based on the characteristic of the simulated pattern, the simulated process window and whether the simulated process window is within an acceptable threshold of the reference process window; and (d) responsive to the acceptable threshold not being satisfied, performing steps (a)-(c).

59. The non-transitory computer-readable medium of clause 47, wherein the adjusting of the parameters of the one or more process models comprises:
   adjusting values of parameters associated with the characteristic model such that a margin between the characteristic of the simulated pattern at a top and at a bottom is maximized with respect to the characteristic limits.

60. The non-transitory computer-readable medium of clause 47, further comprising:
   obtaining a set of hot spot patterns, each hot spot pattern being a user-selected pattern from a target layout and/or a pattern associated with relatively higher probability of failure compared to other patterns of the target layout;
   determining, by simulating the calibrated simulation process using the set of hot spot patterns and the failure rate model, a defect-based process window for each hot spot pattern; and
   determining, based on overlapping of each defect-based process window, optimal values of one or more process variables associated with the threshold failure rate.

61. The non-transitory computer-readable medium of clause 60, wherein the one or more process variable is selected from: a best focus, a best dose, a dose-focus window characterized by the threshold failure rate, aberrations of a lens system, level settings, overlay setting.

62. The non-transitory computer-readable medium of clause 47, further comprising:
   determining, based on the failure rate model, yield associated with each hot spot pattern;
   determining a total yield of a full chip layout by computing a product of each yield associated with each hot spot pattern across the full chip layout.

63. The non-transitory computer-readable medium of clause 47, further comprising:
   determining, by simulating the calibrated simulation process, whether a margin is available to adjust the characteristic of a retargeted pattern to cause a target characteristic value to be printed on a substrate; and
   responsive to the margin not being available, determining, via simulating the calibrated simulation process using the retargeted pattern, adjustments to a process associated with the patterning process such that the target characteristic value will be printed on the substrate.

64. The non-transitory computer-readable medium of clause 63, wherein adjustments to the process comprises at least one of: adjusting an etch bias at an after development image, including an isotropic etch-back or a spacer process, an amount of process loading, an etch rate, a deposition rate, and an angle of incidence of etching or deposition.

65. The non-transitory computer-readable medium of clause 47, further comprising:
   simulating the calibrated simulation process using a full chip layout to determine a residual error between simulated characteristic values and target characteristic values associated with the full chip layout;
   determining, via lithography manufacturing check, whether the simulated characteristic values associated with the full chip layout satisfy a desired yield; and
   responsive to the desired yield not satisfied, adjusting, via the calibrated simulation process, source parameters, mask parameters, or process parameters to reduce the residual error such that the desired yield is satisfied.

66. A non-transitory computer-readable medium comprising instructions that, when executed by one or more processors, cause operations comprising:
   obtaining (i) characteristic limits associated with the target pattern, the characteristic limits being values of the characteristic beyond which a printed pattern corresponding to the target pattern is considered as defective, and (ii) a source mask optimization (SMO) process configured to compute dose and/or mask parameters based on a threshold failure rate associated with the characteristic of the target pattern; and
   generating, by simulating the source mask optimization process using the target pattern, a retargeted pattern the characteristic associated with the retargeted pattern fall further within the characteristic limits associated with the target pattern.

67. The non-transitory computer-readable medium of clause 66, wherein the characteristic limits is obtained based on a failure rate model, the failure rate model being calibrated using failure rate data associated with the printed pattern on a substrate and the threshold failure rate, the printing being performed using an initial SMO data.

68. The non-transitory computer-readable medium of clause 66, wherein the obtaining of the source mask optimization (SMO) process comprises:
   including an dose excursion equation to compute dose based on a probability density function (PDF) of a characteristic, local critical dimension uniformity, dose sensitivity of the characteristic of a pattern, and the threshold failure rate.

69. The non-transitory computer-readable medium of clause 68, wherein the dose excursion equation is given by:

$$dose_{EV} = \frac{LCDU_{dose}3\sigma}{NDS} \cdot CDF^{-1}(1 - FR_{target})/3$$

wherein $dose_{EV}$ represents a dose value at the threshold failure rate $FR_{target}$ and at an extreme value excursion associated with the characteristic value at 3 standard deviations from an average characteristic value, NDS is the dose sensitivity of the characteristic of a pattern, $LCDU_{dose}$ 3σ represents a variation associated with the characteristic value at 3 standard deviations from an average characteristic value and at a particular dose, and CDF represents a cumulative distribution function of the PDF of the characteristic.

70. The non-transitory computer-readable medium of clause 68, wherein the dose excursion equation is given by:

$$dose_{EV} = \frac{LCDU_{dose}}{LCDU_{total}} \cdot \frac{LCDU_{dose}3\sigma}{NDS} \cdot CDF^{-1}(1 - FR_{target})/3^2$$

wherein $dose_{EV}$ represents a dose value at the threshold failure rate $FR_{target}$ and at an extreme value excursion associated with the characteristic value at 3 standard deviations from an average characteristic value, NDS is the dose sensitivity of the characteristic of a pattern, $LCDU_{dose}$ represents a variation in the characteristic at a particular dose, $LCDU_{total}$ represents a total variation in the characteristic of the pattern, $LCDU_{dose}$ 3σ represents a variation associated with the characteristic value at 3 standard deviations from an average characteristic value and at a particular dose, and CDF represents a cumulative distribution function of the PDF of the characteristic.

71. The non-transitory computer-readable medium of clause 66, wherein the obtaining of the source mask optimization (SMO) process comprises:
including a mask bias excursion equation to compute a mask characteristic based on a probability density function of a characteristic (PDF), local CD uniformity caused by a mask bias and the threshold failure rate.

72. The non-transitory computer-readable medium of clause 71, wherein the mask bias excursion equation is given by:

$$mask_{EV} = \frac{LCDU_{mask@W}}{LCDU_{total}} \cdot LCDU_{mask@W} \cdot CDF^{-1}(1 - FR_{target})/3^2$$

wherein $mask_{EV}$ represents a mask bias at the threshold failure rate $FR_{target}$ and at an extreme value excursion associated with the characteristic value at 3 standard deviations from an average characteristic value, $LCDU_{mask@W}$ is variation in the characteristic at associated with a resist pattern caused due to the mask bias, $LCDU_{total}$ represents a total variation in the characteristic of the pattern, and CDF represents a cumulative distribution function of the PDF of the characteristic.

73. The non-transitory computer-readable medium of clause 66, wherein the retargeted pattern is generated such that margins associated with the characteristic limits at the threshold failure rate are increased, the generating of the retargeted pattern comprises:
simulating, using an initial SMO data, the source mask optimization process to determine excursions in a characteristic associated with the target pattern at the threshold failure rate;
determining the margins between the characteristic limits and the excursions at the threshold failure rate; and
adjusting a characteristic value of the target pattern such that the margins are increased without exceeding the characteristic limits associated with the target pattern, the adjusted characteristic value being used to generate the retargeted pattern.

74. The non-transitory computer-readable medium of clause 66, wherein the generating of the retargeted pattern is an iterative process, an iteration comprising:
(a) simulating the source mask optimization process, using the initial SMO data including an optimized source, and optimized mask parameters, and an initial target pattern or a retargeted pattern as input, to determine excursions in a characteristic associated with the target pattern at the threshold failure rate;
(b) determining the margins between the characteristic limits and the excursions of the characteristic at the threshold failure rate;
(c) adjusting a characteristic value of the target pattern such that the margins are increased without exceeding the characteristic limits associated with the target pattern, the adjusted characteristic value being used to generate the retargeted pattern; and
(d) responsive to the margins exceeding the characteristic limits or not being maximized, performing steps (a)-(c).

75. The non-transitory computer-readable medium of clause 74, wherein a margin between the characteristic limit of the characteristics and an extreme value of the characteristic is maximized, the extreme value of the characteristic being a value caused by contributors from one or more process variables the threshold failure rate.

76. The non-transitory computer-readable medium of clause 66, wherein the extreme value of the characteristic is caused by focus, dose, a moving standard deviation (MSD) of the error between the measured value and a target value, a resist-thickness, and/or resist constituents including acids or quencher.

77. The non-transitory computer-readable medium of clause 66, further comprising:
simulating the source mask optimization (SMO) process using the retargeted pattern to determine simulated characteristic values associated with a full chip layout;
determining, via lithography manufacturing check, whether the simulated characteristic values associated with the full chip layout satisfy a desired yield; and
responsive to the desired yield not satisfied, adjusting source parameters, mask parameters, or process parameters such that the desired yield is satisfied, the adjusted source parameters, mask parameters, or process parameters being used to generate an optimized source, an optimized illumination pupil, and/or an optimized mask.

78. A non-transitory computer-readable medium comprising instructions that, when executed by one or more processors, cause operations comprising:
obtaining: (i) a dose probability density function (dose PDF) to determine a probability of dose, the dose PDF being a function of (a) a characteristic of a feature and (b) a deviation of a mask characteristic, the mask characteristic being associated with a mask used to print the feature on a substrate, (ii) a mask probability density function (mask PDF) to determine a probability in the deviation of the mask characteristic;
determining the probability density function associated with the characteristic by convoluting (i) the dose PDF and (ii) the mask PDF over a given range of mask characteristic values; and
adjusting, based on the determined probability density function associated with the characteristic, a process window associated with a patterning process.

79. The non-transitory computer-readable medium of clause 78, wherein the mask PDF incorporates dependency of a non-linear mask error enhancement factor (MEEF) that causes a skewness in the mask PDF, wherein the non-linear MEEF is computed using an inverse function of a relation between the mask characteristic and the characteristic of the printed on the substrate.

80. The non-transitory computer-readable medium of clause 79, wherein the mask PDF can be computed by:

$$PDF_{mask}(\delta CD_{mask}) = G_{mask}(g_{mask}(\delta CD_{mask}); \mu_{mask}, \sigma_{mask}) * \left| \frac{\partial}{\partial mask} g_{mask}(\delta CD_{mask}) \right|$$

wherein $G_{mask}$ is a Gaussian distribution of the mask characteristic, a mean of $G_{mask}$, $\mu_{mask}$, is computed based on an inverse function of a relation between the mask characteristic and the characteristic of the printed on the substrate represented by a $g_{mask}(\delta CD_{mask})$, a standard deviation of $G_{mask}$ is $\sigma_{mask}$, which is the standard deviation determined based on the inverse function and the measured standard deviation of $\delta CD_{mask}$, and $$\left| \frac{\partial}{\partial mask} g_{mask}(\delta CD_{mask}) \right|$$

determines the non-linear MEEF.

81. The non-transitory computer-readable medium of clause 78, wherein the dose PDF incorporates dependency of local critical dimension uniformity (LCDU) related to a resist pattern on the substrate, the LCDU being caused by the mask characteristic.

82. The non-transitory computer-readable medium of clause 81, wherein the dose PDF is determined using a normal distribution or Poisson distribution having a mean dose and a dose standard deviation, the mean dose being determined by an inverse function of the relation between the dose and CD for a given deviation in the mask characteristic, and the dose standard deviation being determined by based on LCDU related to the resist pattern on the substrate that is caused by the mask characteristic.

83. The non-transitory computer-readable medium of clause 82, wherein the dose PDF can be computed by $$PDF_{dose}(g_d(CD, \delta CD_{mask}); \mu_d(\delta CD_{mask}), \sigma_d(\delta CD_{mask}))$$

Wherein the dose $g_d(CD, \delta CD_{mask})$ is determined using an inverse function of the relation between the dose and the characteristic CD of the feature for a given deviation in the mask characteristic $\delta CD_{mask}$, and the dose standard deviation $\sigma_d$ is based on the inverse function $g_d(CD, \delta CD_{mask})$ and the measured standard deviation $\sigma_{CD}^{resist}(\delta CD_{mask})$, wherein $\sigma_{CD}^{resists}(\delta CD_{mask})$ represents the LCDU ($1\sigma$) caused due to dose and resist variations for a given mask deviation.

84. The non-transitory computer-readable medium of clause 78, further comprising:
 executing, using failure rate data associated with a target layout, the determined probability density function to determine characteristic limits associated with a threshold failure rate.

85. A non-transitory computer-readable medium comprising instructions that, when executed by one or more processors, cause operations comprising:
 obtaining: (i) a plurality of dose-focus settings, and (ii) a reference distribution based on measured values of a characteristic of a printed pattern associated with each setting of the plurality of dose-focus settings;
 determining, based on an adjustment model and the plurality of dose-focus settings, the probability density function (PDF) of the characteristic such that an error between the PDF and the reference distribution is reduced, the PDF being a function of the adjustment model and variance associated with dose, the adjustment model being configured to change a proportion of non-linear dose sensitivity contribution to the PDF; and
 adjusting, based on the determined PDF of the characteristic, a process window associated with a patterning process.

86. The non-transitory computer-readable medium of clause 85, wherein the determining of the PDF is an iterative process, an iteration comprises:
 determining, based on the adjustment model, an adjustment value for a given dose focus setting of the plurality of dose-focus settings;
 determining, based on the adjustment value, the PDF of the characteristic of a pattern;
 determining the error between the PDF and the reference distribution; and
 adjusting, parameters of the adjustment model, for the given dose and focus setting of the plurality of dose-focus settings such that the error is minimized.

87. The non-transitory computer-readable medium of clause 85, wherein the PDF is a convolution of a first PDF and a second PDF, wherein the first PDF is a function of a first variation, the first variation being a product of the adjustment model and variation of dose, and the second PDF is a function of a second variation associated with factors other than dose contributing to variation in the characteristic of a pattern.

88. The non-transitory computer-readable medium of clause 87, wherein the determining of the PDF is an iterative process, an iteration comprises:
 convoluting the first PDF and the second PDF to determine the PDF of the characteristic of a pattern;
 determining the error between the PDF and the reference distribution; and
 adjusting parameters of the first variation and the second variation for a given dose and focus setting of the plurality of dose-focus settings such that the error is minimized.

89. The non-transitory computer-readable medium of any of clauses 86-88, wherein the adjusting of the parameters of the adjustment model for the plurality of dose-focus settings is performed by an optimization algorithm selected from: adaptive moment estimation or a gradient decent method.

90. The non-transitory computer-readable medium of clause 85, wherein the adjustment model is a polynomial function of dose and focus.

91. The non-transitory computer-readable medium of clause 88, further comprising:
 determining a plurality of adjustment values associated with the PDF having minimum error with respect to the reference distribution for each dose and each focus setting of the plurality of dose-focus settings; and
 fitting, based on the plurality of adjustment values, a polynomial function of dose and focus to determine the adjustment model such that a difference between the fitted polynomial function and the plurality of adjustment model values is minimized.

92. The non-transitory computer-readable medium of clause 85, further comprising:
 executing, using failure rate data associated with the pattern, the determined probability density function to determine characteristic limits associated with a threshold failure rate.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, these inventions have been grouped into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the present disclosure to the particular form disclosed, but to the contrary, the intention is to cover all modifications, equivalents, and alternatives falling within the spirit and scope of the inventions as defined by the appended claims.

Modifications and alternative embodiments of various aspects of the inventions will be apparent to those skilled in the art in view of this description. Accordingly, this description and the drawings are to be construed as illustrative only and are for the purpose of teaching those skilled in the art the general manner of carrying out the inventions. It is to be understood that the forms of the inventions shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. References to selection from a range includes the end points of the range.

In the above description, any processes, descriptions or blocks in flowcharts should be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

While certain embodiments have been described, these embodiments have been presented by way of example only, and are not intended to limit the scope of the present disclosures. Indeed, the novel methods, apparatuses and systems described herein can be embodied in a variety of other forms; furthermore, various omissions, substitutions and changes in the form of the methods, apparatuses and systems described herein can be made without departing from the spirit of the present disclosures. The accompanying claims and their equivalents are intended to cover such forms or modifications as would fall within the scope and spirit of the present disclosures.

The invention claimed is:

1. A method for adjusting a process window, the method comprising:
obtaining: (i) a plurality of dose-focus settings, and (ii) a reference distribution based on measured values of a characteristic of a printed pattern associated with each setting of the plurality of dose-focus settings;
determining, by a hardware computer system and based on an adjustment model and the plurality of dose-focus settings, a probability density function (PDF) of the characteristic such that an error between the PDF and the reference distribution is reduced, the PDF being a function of the adjustment model and variance associated with dose, the adjustment model being configured to change a proportion of non-linear dose sensitivity contribution to the PDF; and
adjusting, based on the determined PDF of the characteristic, a process window associated with a patterning process.

2. The method of claim 1, wherein the determining of the PDF is an iterative process, an iteration comprising:
determining, based on the adjustment model, an adjustment value for a given dose-focus setting of the plurality of dose-focus settings;
determining, based on the adjustment value, the PDF of the characteristic of a pattern;
determining an error between the PDF and the reference distribution; and
adjusting one or more parameters of the adjustment model for the given dose and focus setting of the plurality of dose-focus settings such that the error is minimized.

3. The method of claim 1 wherein the PDF is determined by a convolution of a first PDF and a second PDF, wherein the first PDF is a function of a first variation, the first variation being a product of the adjustment model and variation of dose, and the second PDF is a function of a second variation associated with factors other than dose contributing to variation in the characteristic of a pattern.

4. The method of claim 3, wherein the determining of the PDF is an iterative process, an iteration comprising:
convoluting the first PDF and the second PDF to determine the PDF of the characteristic of a pattern;
determining an error between the PDF and the reference distribution; and
adjusting one or more parameters of the first variation and the second variation for a given dose and focus setting of the plurality of dose-focus settings such that the error is minimized.

5. The method of claim 2, wherein the adjusting of the one or more parameters of the adjustment model is performed by an optimization algorithm selected from: adaptive moment estimation or a gradient decent method.

6. The method of claim 1, wherein the adjustment model is a polynomial function of dose and focus.

7. The method of claim 4, further comprising:
determining a plurality of adjustment values associated with the PDF having minimum error with respect to the reference distribution for each dose and each focus setting of the plurality of dose-focus settings; and
fitting, based on the plurality of adjustment values, a polynomial function of dose and focus to determine the adjustment model such that a difference between the fitted polynomial function and the plurality of adjustment model values is minimized.

8. The method of claim 1, further comprising executing, using failure rate data associated with the pattern, the determined probability density function to determine a characteristic limit associated with a threshold failure rate.

9. A non-transitory computer-readable medium comprising instructions therein, the instructions, when executed by one or more processors, configured to cause the one or more processors to at least:
obtain: (i) a plurality of dose-focus settings, and (ii) a reference distribution based on measured values of a characteristic of a printed pattern associated with each setting of the plurality of dose-focus settings;
determine, based on an adjustment model and the plurality of dose-focus settings, a probability density function (PDF) of the characteristic such that an error between the PDF and the reference distribution is reduced, the PDF being a function of the adjustment model and variance associated with dose, the adjustment model being configured to change a proportion of non-linear dose sensitivity contribution to the PDF; and
adjust, based on the determined PDF of the characteristic, a process window associated with a patterning process.

10. The non-transitory computer-readable medium of claim 9, wherein the determination of the PDF is an iterative process, an iteration comprising:
determination, based on the adjustment model, of an adjustment value for a given dose focus setting of the plurality of dose-focus settings;
determination, based on the adjustment value, of the PDF of the characteristic of a pattern;
determination of the error between the PDF and the reference distribution; and
adjustment of one or more parameters of the adjustment model for the given dose and focus setting of the plurality of dose-focus settings such that the error is minimized.

11. The non-transitory computer-readable medium of claim 9, wherein the adjustment model is a polynomial function of dose and focus.

12. The non-transitory computer-readable medium of claim 9, wherein the instructions are further configured to cause the one or more processors to execute comprising:
executing, using failure rate data associated with the pattern, the determined probability density function to determine a characteristic limit associated with a threshold failure rate.

13. A method comprising:
obtaining: (i) a dose probability density function (dose PDF) to determine a probability of dose, the dose PDF being a function of (a) a characteristic of a feature and (b) a deviation of a mask characteristic, the mask characteristic being associated with a mask used to print the feature on a substrate, and (ii) a mask probability density function (mask PDF) to determine a probability in the deviation of the mask characteristic;
determining, by a hardware computer system, a probability density function associated with the characteristic by convoluting (i) the dose PDF and (ii) the mask PDF over a given range of mask characteristic values; and
adjusting, based on the determined probability density function associated with the characteristic, a process window associated with a patterning process.

14. The method of claim 13, wherein the mask PDF incorporates dependency of a non-linear mask error enhancement factor (MEEF) that causes a skewness in the mask PDF, wherein the non-linear MEEF is computed using an inverse function of a relation between the mask characteristic and the characteristic of the printed on the substrate.

15. The method of claim 14, wherein the mask PDF is computed by:

$$PDF_{mask}(\delta CD_{mask}) = G_{mask}(g_{mask}(\delta CD_{mask}); \mu_{mask}, \sigma_{mask}) * \left| \frac{\partial}{\partial mask} g_{mask}(\delta CD_{mask}) \right|$$

wherein $G_{mask}$ is a Gaussian distribution of the mask characteristic, a mean of $G_{mask}$, $\mu_{mask}$, is computed based on an inverse function of a relation between the mask characteristic and the characteristic of the printed on the substrate represented by $g_{mask}(\delta CD_{mask})$, a standard deviation of $G_{mask}$ is $\sigma_{mask}$, which is the standard determined based on the inverse function and the measured standard deviation of $\delta CD_{mask}$, and $$\left| \frac{\partial}{\partial mask} g_{mask}(\delta CD_{mask}) \right|$$

determines the non-linear MEEF.

16. The method of claim 14, wherein the dose PDF incorporates dependency of local critical dimension uniformity (LCDU) related to a resist pattern on the substrate, the LCDU being caused by the mask characteristic.

17. The method of claim 16, wherein the dose PDF is determined using a normal distribution or Poisson distribution having a mean dose and a dose standard deviation, the mean dose being determined by an inverse function of the relation between the dose and CD for a given deviation in the mask characteristic, and the dose standard deviation being determined by based on LCDU related to the resist pattern on the substrate that is caused by the mask characteristic.

18. The method of claim 13, wherein the dose PDF is computed by:

$$PDF_{dose}(g_d(CD, \delta CD_{mask}); \mu_d(\delta_d(\delta CD_{mask}), \sigma_d(\delta CD_{mask}))$$

wherein the dose $g_d(CD, \delta CD_{mask})$ is determined using an inverse function of the relation between dose and a characteristic CD of the feature for a given deviation in the mask characteristic $\delta CD_{mask}$ and the dose standard deviation $\sigma_d$ is based on the inverse function $g_d(CD, \delta CD_{mask})$ and the measured standard deviation $\sigma_{CD}^{resist}(\delta CD_{mask})$, wherein $\sigma_{CD}^{resist}(\delta CD_{mask})$ represents the of local critical dimension uniformity (LCDU) (1σ) caused due to dose and resist variations for a given mask deviation.

19. The method of claim 13, further comprising executing, using failure rate data associated with a target layout, the determined probability density function to determine a characteristic limit associated with a threshold failure rate.

20. A non-transitory computer-readable medium comprising instructions therein, the instructions, when executed by one or more processors, configured to cause the one or more processors to at least perform the method of claim 13.

* * * * *

UNITED STATES PATENT AND TRADEMARK OFFICE
CERTIFICATE OF CORRECTION

| | | |
|---|---|---|
| PATENT NO. | : 12,386,268 B2 | Page 1 of 1 |
| APPLICATION NO. | : 17/799019 | |
| DATED | : August 12, 2025 | |
| INVENTOR(S) | : Koenraad Van Ingen Schenau et al. | |

It is certified that error appears in the above-identified patent and that said Letters Patent is hereby corrected as shown below:

On the Title Page

Item (72) Inventors:
Please correct "Marleen KOOIMAN, Veldhoven (NL)" to "Marleen KOOIMAN, Eindhoven (NL)"
and "Aiqin JIANG, New York, NY (US)" to "Aiqin JIANG, Duanesburg, NY (US)"

Signed and Sealed this
Sixteenth Day of September, 2025

Coke Morgan Stewart
*Acting Director of the United States Patent and Trademark Office*